(12) United States Patent
Yamada et al.

(10) Patent No.: US 6,770,535 B2
(45) Date of Patent: Aug. 3, 2004

(54) SEMICONDUCTOR INTEGRATED CIRCUIT DEVICE AND PROCESS FOR MANUFACTURING THE SAME

(75) Inventors: Satoru Yamada, Ome (JP); Kiyonori Oyu, Ome (JP); Shinichiro Kimura, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 368 days.

(21) Appl. No.: 09/767,830

(22) Filed: Jan. 24, 2001

(65) Prior Publication Data

US 2001/0025973 A1 Oct. 4, 2001

(30) Foreign Application Priority Data

Jan. 25, 2000 (JP) .................................. 2000-015604

(51) Int. Cl.[7] .......................................... H01L 21/336
(52) U.S. Cl. ...................... 438/270; 438/259; 257/329; 257/330
(58) Field of Search ................. 438/270, 259; 257/329, 330

(56) References Cited

U.S. PATENT DOCUMENTS

| | | | | |
|---|---|---|---|---|
| 5,177,576 A | * | 1/1993 | Kimura et al. ............ 257/71 |
| 5,408,116 A | * | 4/1995 | Tanaka et al. ............ 257/327 |
| 5,541,425 A | * | 7/1996 | Nishihara ................. 257/139 |
| 5,733,810 A | * | 3/1998 | Baba et al. ............... 438/268 |
| 5,770,514 A | * | 6/1998 | Matsuda et al. .......... 438/589 |
| 6,200,855 B1 | * | 3/2001 | Lee ........................... 438/255 |
| 6,399,985 B2 | * | 6/2002 | Horita et al. ............. 257/330 |
| 6,469,345 B2 | * | 10/2002 | Aoki et al. ............... 257/330 |
| 6,476,444 B1 | * | 11/2002 | Min ........................... 257/330 |
| 6,559,025 B2 | * | 5/2003 | Kim .......................... 438/396 |

* cited by examiner

Primary Examiner—John F. Niebling
Assistant Examiner—Jennifer M. Kennedy
(74) Attorney, Agent, or Firm—Antonelli, Terry, Stout & Kraus, LLP

(57) ABSTRACT

A reduction of the junction electric field intensity is accomplished in the semiconductor regions for the sources and drains of field effects transistors. For this purpose, a structure is provided where the gate electrodes 9 of the MIS.FETQs for memory cell selection of a DRAM are buried within the trenches 7a and 7b created in the semiconductor substrate 1. The bottom corners within the trench 7b are rounded so as to have a radius of curvature in accordance with the sub-threshold coefficient of the MIS.FETQs for memory cell selection. In addition, the gate insulating film 8 within the trench 7b is made to have a laminated structure of a thermal oxide film and a CVD film.

40 Claims, 39 Drawing Sheets

SEMICONDUCTOR INTEGRATED CIRCUIT DEVICE AND PROCESS FOR MANUFACTURING THE SAME

BACKGROUND OF THE INVENTION

The present invention relates to a process for manufacture of a semiconductor integrated circuit device and to a semiconductor integrated circuit device technology. In particular, the invention relates to a process for manufacture of a semiconductor integrated circuit device having capacitor elements for information storage and to a technology which is effective in the application of such a semiconductor integrated circuit device.

A typical example of a semiconductor integrated circuit device having capacitor elements for information storage is a DRAM (Dynamic Random Access Memory). A memory cell of a DRAM is formed of one transistor, for memory cell selection, and a capacitor (an element for information storage) which is directly connected thereto; and, therefore, the DRAM is widely used as the main memory of a variety of computers, which require a large capacity memory, and for communication apparatuses, because the integrity is high and the price per unit per bit can be inexpensive. Since a capacitor is used for an element for information storage, however, in the case that it is left as it is, a signal charge used for information storage leaks as time elapses so that the storage content is eventually lost. Therefore, in a DRAM, a so-called refreshing operation, which periodically reproduces the storage content, is required in order to maintain the information of the memory cell. Therefore, in a semiconductor integrated circuit device having a DRAM, a variety of research and substantial technological development concerning the structure and circuit arrangement have been carried out in an attempt to increase the operation speed of the entire DRAM and to increase the refreshing characteristics. As for the technology for increasing the refreshing characteristics, since the refreshing characteristics are in inverse proportion to the junction electric field intensity in the semiconductor regions for sources and drains of the transistors for memory cell selection, the optimization of the impurity concentration diffusion in the semiconductor regions for the sources and drains has been developed so as to increase the refreshing characteristics by reducing the above junction electric field intensity.

For example, in the Japanese patent Laid-Open No. 61486/1994 (U.S. Pat. No. 5,426,326), a technology is described wherein contact holes are opened in an interlayer insulating film which covers MOS (Metal Oxide Semiconductor) transistors for memory cell selection in a DRAM memory cell so that the semiconductor regions for the sources and drains are exposed, and, after that, impurities for electric field relaxation are introduced beneath the semiconductor regions for the sources and drains through the above contact holes. In addition, for example, in the Japanese patent Laid-Open No. 359842/1998, a technology is disclosed wherein impurities (boron, or the like) for controlling the threshold voltage Vth of the MOS transistors for memory cell selection are implanted only on the side to which bit lines are connected in the semiconductor substrate so as not to be implanted on the capacitor side, and, thereby, the impurity (boron, or the like) concentration of the semiconductor substrate on the capacitor side is lowered so as to lower the junction electric field intensity in the semiconductor substrate on the capacitor side.

SUMMARY OF THE INVENTION

The present inventors have, however, found that the above described technologies have the following problems.

That is to say, as the miniaturization of elements proceeds, the impurity concentration in a semiconductor substrate with respect to, for example, the element dimension is enhanced, and the side wall insulating film formed on the side walls of the gate electrodes becomes thinner, so that the gate electrodes and the semiconductor regions (high impurity concentration regions) for the sources and drains become closer in distance; and, thereby, the above described junction electric field intensity becomes larger, and, as a result, a problem arises in that the deterioration of the refreshing characteristics cannot be prevented even in the case of the use of conventional technologies. Though, in a conventional DRAM, the power consumption has been limited in order to lengthen the refreshing time when the integration is heightened, the refreshing time cannot help but be made shorter since the junction electric field intensity becomes larger when the miniaturization of the element progresses to a higher integration. As a result of this, a problem arises in that, in the case where integration continues to be heightened at the present rate, the increase in the power consumption cannot be avoided.

An object of the present invention is to provide a technology which can reduce the junction electric field intensity in the semiconductor regions for the sources and drains of field effect transistors.

Another object of the present invention is to provide a technology which can increase the driving performance of field effect transistors.

Still another object of the present invention is to provide a technology which can increase the refreshing characteristics of a semiconductor integrated circuit device.

Yet another object of the present invention is to provide a technology which can reduce power consumption of a semiconductor integrated circuit device.

Still another object of the present invention is to provide a technology which can increase the element integrity of a semiconductor integrated circuit device.

A further object of the present invention is to provide a technology which can increase the reliability of a semiconductor integrated circuit device.

An additional object of the present invention is to provide a technology which can increase the yield of a semiconductor integrated circuit device.

The above described, as well as other, objects and novel characteristics of the present invention will be clarified through the description provided in this specification and the attached drawings.

A summary of a representative aspect of the invention which is disclosed in the present application will be briefly described as follows.

That is to say, the present invention provides the step of forming first trenches in a semiconductor substrate, the step of forming isolation parts by filling in said first trenches with an insulating film, the step of forming trenches for forming wires so as to overlap, in a plane manner, said isolation parts and active regions which are surrounded by said isolation parts, the step of forming an isolation film inside the trenches for forming said wires and the step of forming wires inside of said trenches for forming wires via said isolation film inside trenches, wherein in said step of forming trenches for forming wires, the corners of the bottom are rounded, and in said step of forming an isolation film inside the trenches part of, or all of, the insulating film is formed inside of the trenches through a deposition method.

In addition, the present invention provides the step of forming first trenches in a semiconductor substrate, the step of forming isolation parts by filling in said first trenches with an insulating film, the step of forming a mask having aperture parts including part of, both, of said isolation parts and active regions surrounded by said isolation parts on the semiconductor substrate, the step of forming third trenches by forming second trenches by removing the insulating film of the isolation parts which are exposed from said aperture parts and, after that, by removing the semiconductor substrate part which is exposed from said aperture parts, and the step of forming wires inside said second and third trenches.

In addition, the present invention provides first trenches formed in a semiconductor substrate, isolation parts formed by filling in said trenches with an insulating film, trenches for forming wires formed so as to overlap, in a plane manner, said isolation parts and active regions which are surrounded, in a plane manner, by said isolation parts, an insulating film inside the trenches formed inside said trenches for forming wires and wires formed inside said trenches for forming wires via the isolation film inside the trenches, wherein said insulating film inside the trenches has an insulating film formed through deposition and the corners of the bottom inside said trenches for forming wires are rounded.

In addition, in accordance with the present invention, said step of forming trenches for forming wires includes a step of creating the trenches, a step of oxidizing the inner surface of the trenches and a step of removing the oxide film formed through the above oxidization step.

In addition, in accordance with the present invention, the radius of curvature of the angles of the bottom inside said trenches for forming wires has a value which doesn't exceed a predetermined value of a sub-threshold coefficient of field effect transistors, of which the gate electrodes are said wires.

In addition, in accordance with the present invention, the radius of curvature of the angles of the bottom inside said trenches for forming said wires is 10 nm or more.

In addition, in accordance with the present invention, forward tapers are formed on the side surfaces of said trenches for forming wires.

In addition, in accordance with the present invention, said trenches for forming wires are formed so that the width of the aperture parts is wider than the width of the bottoms.

In addition, in accordance with the present invention, said step of forming the trenches for forming wires has the step of forming a mask having aperture parts including part of, both, of said isolation parts and active regions which are surrounded by said isolation parts on the semiconductor substrate, the step of forming the second trenches by removing the insulating film of the isolation parts which is exposed from said aperture parts and the step of forming the third trenches by removing the semiconductor substrate parts which are exposed from said aperture parts.

In addition, in accordance with the present invention, said step of forming the trenches for forming wires includes the step of forming a mask which has aperture parts including part of, both, of said isolation parts and active regions which are surrounded by said isolation parts and the step of forming the third trenches by forming the second trenches by removing the insulating film of isolation parts which is exposed from said aperture parts and, after that, by removing the semiconductor substrate parts which are exposed from said aperture parts and the second trenches.

In addition, in accordance with the present invention, said step of forming the trenches for forming wires has the step of forming said third trenches deeper than the second trenches and the step of oxidizing the inside of said third trenches and, after that, removing the oxide film.

In addition, in accordance with the present invention, at the time of forming said second trenches, the insulating film of isolation parts remains at the bottoms of the second trenches so that a parasitic element is not, finally, formed in the lower part of the wires.

In addition, in accordance with the present invention, the thickness of the insulating film of the isolation parts which remains at the bottoms of said second trenches is 100 nm or more.

In addition, in accordance with the present invention, the depth of said first trenches finally becomes deeper than that of said second and third trenches.

In addition, in accordance with the present invention, said step of forming an insulating film inside the trenches includes the step of forming an insulating film by oxidizing the semiconductor substrate which is exposed from said trenches for forming wires, and the step of forming an insulating film through a deposition method.

In addition, in accordance with the present invention, said wires are made of metal and the insulating film, formed through a deposition method, which is said insulating film inside the trenches, is made of silicon nitride.

In addition, in accordance with the present invention, said step of forming wires has the step of filling in the inside of said second and third trenches with the first film, the step of removing said first film so that part of the first film remains within said second and third trenches and the step of filling in the recesses of the top surface of the first film within said second and third trenches with the second film.

In addition, the present invention has the step of further removing said first film so that part of the first film remains within said second and third trenches after the recesses on the top surface of said first film are filled in with a second film.

In addition, in accordance with the present invention, said wires are made of a metal or a compound of metal and silicon.

In addition, in accordance with the present invention, said wires are made of a metal and the insulating film formed through a deposition method of said insulating film within the trenches is made of silicon nitride.

In addition, the method of the present invention includes, after said step of forming wires, the step of forming a cap insulating film on the wires inside said trenches for forming wires.

In addition, the method of the present invention includes, after forming said cap insulating film, the step of depositing an insulating film on said semiconductor substrate, the step of opening holes in said insulating film from which said active regions are exposed, the step of filling in said holes with a conductive film and the step of forming semiconductor regions in the active regions by diffusing impurities to the semiconductor substrate from said conductive film.

In addition, in accordance with present invention, said step of forming holes includes the step of applying an etching treatment under conditions where the etching rate is faster in said insulating film than in the cap insulating film.

In addition, in accordance with the present invention, said insulating film of isolation parts is formed of silicon oxide while said cap insulating film is formed of silicon nitride.

In addition, in accordance with the present invention, the thickness of said cap insulating film is 40 nm or more.

In addition, in accordance with the present invention, said insulating film of isolation parts is formed of silicon oxide, said cap insulating film is formed of silicon nitride and said insulating film on the semiconductor substrate is formed of silicon oxide.

In addition, the method of the present invention includes, after said step of forming wires, the step of forming semiconductor regions for the sources and drains of field effect transistors of which the gate electrodes are the wires on both sides of the wires, in a plane manner, in said semiconductor substrate.

In addition, in accordance with the present invention, the height of the top surface of said gate electrodes is lower than the height of said trenches for forming wires and of the main surface of the semiconductor substrate where the first trenches are not formed.

In addition, in accordance with the present invention, said gate electrodes are spaced away from high concentration regions wherein the impurity concentration is relatively high in said semiconductor regions for the sources and drains.

In addition, in accordance with the present invention, the distance between said gate electrodes and said high concentration regions is 40 nm or more.

In addition, in accordance with the present invention, said gate electrodes and said high concentration regions wherein the impurity concentration is comparatively high in said semiconductor regions for the sources and drains are spaced from each other, and low concentration regions where the impurity concentration is comparatively low in said semiconductor regions for the sources and drains are formed deeper than the top surface of said gate electrodes.

In addition, in accordance with the present invention, said field effect transistors form transistors for memory cell selection and a capacitor element for information storage is electrically connected to one of said semiconductor regions for the sources and drains.

In addition, the semiconductor integrated circuit device of the present invention has trenches created in a semiconductor substrate, first semiconductor regions which are formed to extend up to a position deeper than said trenches in said semiconductor substrate, a gate insulating film formed inside said trenches, gate electrodes formed inside said trenches via the gate insulating film, and semiconductor regions for the sources and drains formed on both sides of said gate electrodes, in a plane manner, in the semiconductor substrate, wherein said semiconductor regions for the sources and drains are formed to extend up to a position shallower than said first semiconductor regions, and second semiconductor regions, of which the conductivity type is opposite to that of said first semiconductor regions, and third semiconductor regions, of which the conductivity type is same as that of said second semiconductor regions, are formed to extend up to a position shallower than said second semiconductor regions, and the impurity concentration of said third semiconductor regions is higher than the impurity concentration of said second semiconductor regions.

In addition, in accordance with the present invention, borders between said second semiconductor regions and third semiconductor regions are formed at positions shallower than the top surface of said gate electrodes.

In addition, in accordance the present invention, the distance between said borders and said gate electrodes is 40 nm or more.

In addition, in accordance with the present invention, borders between said first semiconductor regions and said second semiconductor regions are formed at positions deeper than the top surface of said gate electrodes.

In addition, in accordance with the present invention, a cap insulating film is formed on said gate electrodes inside said trenches.

In addition, in accordance with the present invention, the thickness of said cap insulating film on the gate electrodes is 40 nm or more.

In addition, in accordance with the present invention, said cap insulating film on the gate electrodes is made of silicon nitride.

In addition, in accordance with the present invention, said gate electrodes are made of metal or a silicide film of metal and said gate insulating film has an insulating film formed through a deposition method.

In addition, in accordance with the present invention, said gate insulating film formed through a deposition method is made of silicon nitride.

In addition, the semiconductor integrated circuit device of the present invention has a plurality of memory cells formed of field effect transistors having said gate electrodes and capacitor elements for information storage which are electrically connected to one of said semiconductor regions for the sources and drains.

In addition, in accordance with the present invention, said semiconductor regions for the sources and drains to which the capacitor elements for information storage are connected are formed to be deeper than the other semiconductor regions for the sources and drains.

In addition, in accordance with the present invention, field effect transistors in a peripheral circuit region of a memory region formed of said memory cells have a buried gate electrode structure, and the semiconductor regions for the sources and drains of the field effect transistors of the buried gate electrode structure in said peripheral circuit region are formed to be deeper than the semiconductor regions for the sources and drains of the field effect transistors of said memory cells.

DESCRIPTION OF THE PREFERRED EMBODIMENTS

In the following, the embodiments of the present invention will be described in detail with reference to the drawings. Here, elements having the same function throughout all of the drawings are all referred to by the same numerals and repetitive descriptions of them are omitted. In addition, in the present embodiments, a p channel type MIS.FET (Metal Insulator Semiconductor Field Effect Transistor) is abbreviated as pMIS, while an n channel type MIS.FET is abbreviated as nMIS. In addition, in the present specification, an MIS.FET of an ordinary gate electrode structure refers to an MIS.FET with a structure having gate electrodes formed by patterning a conductive film deposited on the semiconductor substrate. In addition, in the present specification, a high concentration region is a region where the concentration of impurities which become donors or acceptors is comparatively high in comparison with a low concentration region. In addition, corner parts inside the trenches or angles of the bottoms inside the trenches include, in addition to angled parts formed between side surfaces and the bottoms inside the trenches, parts of which the radius of curvature is the smallest in the inside of the trenches.

(Embodiment 1)

Figure 1:
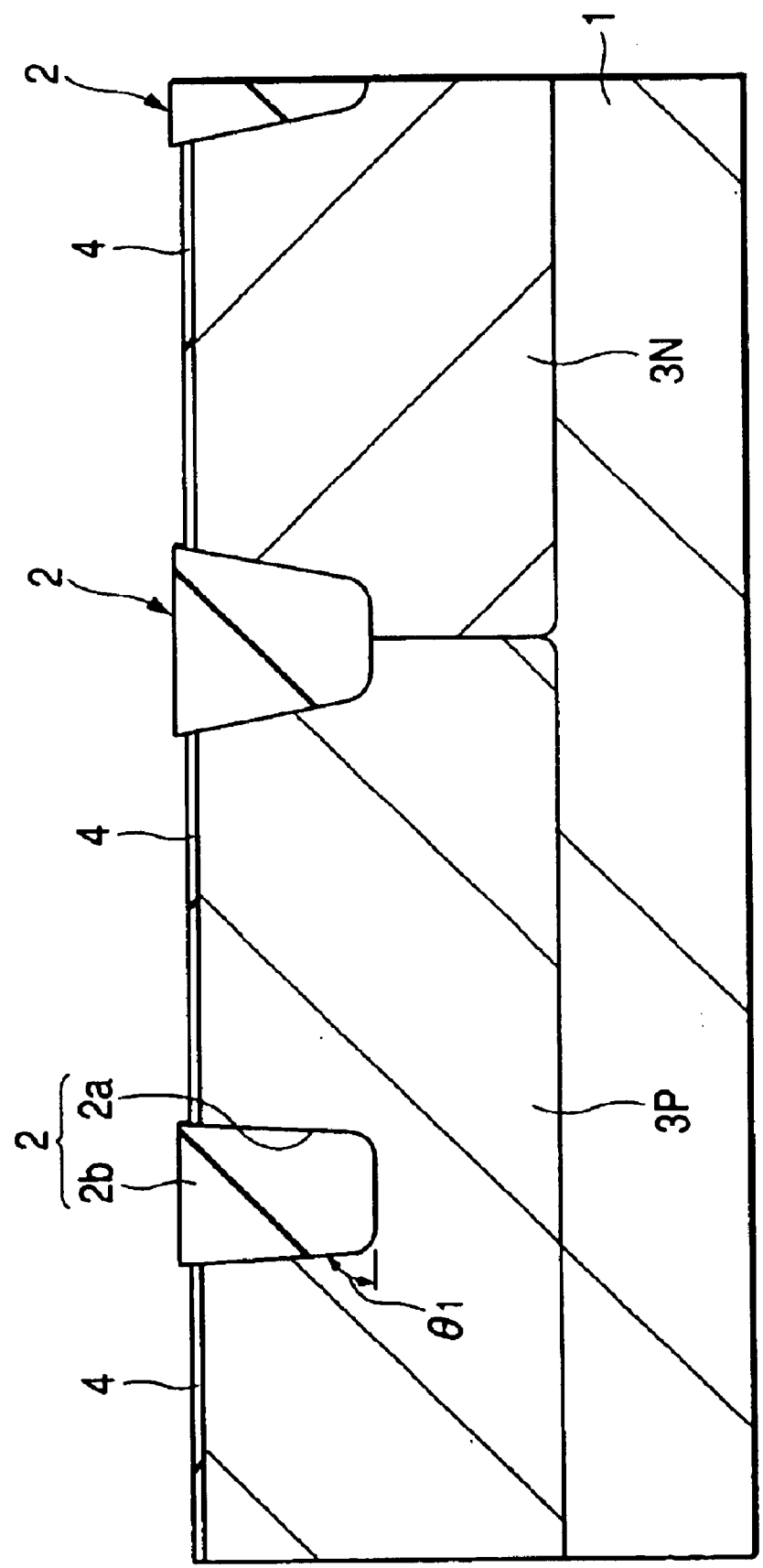
FIG. 1 is a cross-sectional view of the main part of a semiconductor integrated circuit device during processing according to one embodiment of the present invention.
Figure 2:
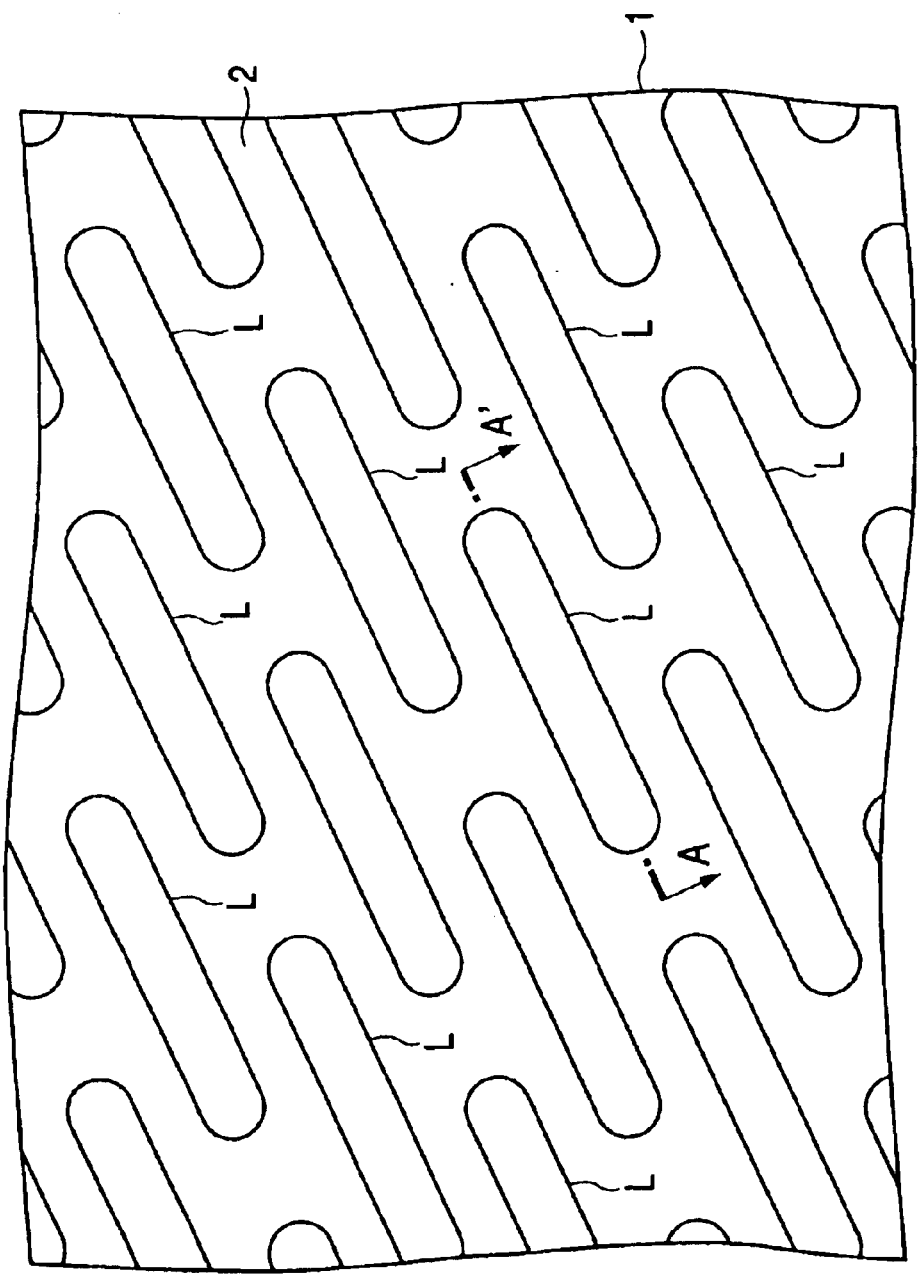
FIG. 2 is a plan view of the main part of a memory cell region of FIG. 1.

In the present Embodiment 1, a case where the present invention is applied to, for example, a DRAM will be described. FIG. 1 shows a cross section of the main part of a memory cell region and a peripheral circuit region during processing. Here, the cross section of the main part of the memory cell region is a cross section taken along line A–A' in FIG. 2. And, FIG. 2 shows a plan view of the main part of 10 the memory cell region of FIG. 1.

At this stage, the semiconductor substrate 1 is a semiconductor thin slate (so-called semiconductor wafer) made of a p-type silicon single crystal, or the like, in, for example, approximately a circular plane form. And, for example, trench types of isolation parts (trench isolations) 2 are formed in the isolation regions. Those isolation parts 2 are the parts which perform the functions of element separation, separation within an element, or the like, and active regions L are formed in the regions surrounded by those isolation parts 2. The plane form of the active regions L has rounded parts on both edges in the memory cell region, as shown in FIG. 2, and is formed in a band form pattern extending in the diagonal direction.

The method of formation of such isolation parts 2 is, for example, as follows. First, isolation trenches (first trenches) 2a, having a depth of approximately, for example, 350 nm, are formed in the semiconductor substrate 1 through a photolithographic technology, a dry etching technology, and the like. The isolation trenches 2a are formed so that the width gradually spreads out from the bottom to the upper part. Accordingly, the inside surfaces of the isolation trenches 2a are inclined so as to be formed to have a forward taper. The inclination angle θ1 formed from the inner surfaces of the isolation trenches 2a and the main surface, using the main surface of the semiconductor substrate 1 as a reference, is smaller than 90 degrees.

With respect to the dry etching technology for forming the isolation trenches 2a, when an etching with large anisotropy is utilized in order to increase the integrity of the isolation trenches 2a, the radius of curvature of the bottom corner within the trenches becomes small, so that stress concentrates on the corner parts and transposition occurs within the semiconductor substrate 1 so as to degrade the element isolation characteristics.

In addition, when fluorine is added to the etching gas, etching characteristics are exhibited wherein the radius of curvature of the bottom corners within the trenches becomes larger and, at the same time, undercuts are formed beneath the hard mask due to the expansion of the trench width accompanying the etching.

Therefore, by employing a step etching technology at the time of the formation of the isolation trenches, trenches with a large radius of curvature of the bottom corners are formed, while limiting the undercuts to a small size. Here, the step etching technology is a technology to control the form of the aperture of the trenches into a predetermined form by carrying out an etching treatment under etching conditions of relatively strong anisotropy at the time of forming trenches in the semiconductor substrate 1 (First Step), and, after that, by carrying out an etching treatment under etching conditions where the composition of the gas is changed during etching so that the bottom corners within the trenches exhibit rounding (Second Step). In the case of this technology, deep trenches are formed, without inviting an increase, to a great degree, of the width dimension, under the etching conditions in the First Step, and, after that, roundness can be created in the bottom corners within the trenches under the etching conditions in the Second Step.

In the present embodiment, an etching method with a relatively large anisotropy is utilized at the initial phase of etching, and the gas is switched to the one to which fluorine is added in the later phase of etching. By doing so, the under cuts are controlled, as described above, and it becomes possible to obtain trenches with a large radius of curvature of the corners within the above-described trenches of a desired depth.

Then, an insulating film 2b made of, for example, silicon oxide ($SiO_2$, or the like, hereinafter the same) is deposited on the main surface of the semiconductor substrate 1 after forming the isolation trenches 2a through a CVD method using a mixture gas of, for example, tetraethoxysilane (TEOS) and ozone ($O_3$), or a mixture gas of mono-silane and oxygen, and, after that, isolation parts 2 are formed by polishing the isolation film 2b in such a way as to leave only the portion within the isolation trenches 2a through a chemical mechanical polishing (CMP) method.

Then, an insulating film 4 made of silicon oxide, or the like, having a thickness of approximately 10 nm, is formed on the surface of the semiconductor substrate 1 by oxidizing the surface of the semiconductor substrate 1 through a thermal oxidation method, or the like, and, after that, a p well (first semiconductor region) 3P and an n well 3N are formed in the semiconductor substrate 1. The p well 3P and the n well 3N are formed by introducing separate impurities, respectively, using a separate photoresist (hereinafter referred to merely as resist) film as a mask, respectively, and, after that, by carrying out heat treatment. The p well 3P, wherein MIS.FETs for selecting memory cells are formed, is formed by implanting, for example, boron (B) at 300 keV, 130 keV and 40 keV, respectively, in the amount of $1 \times 10^{13}/cm^2$, $2 \times 10^{12}/cm^2$ and $1 \times 10^{12}/cm^2$ and, after that, by carrying out a heat treatment at, for example, 1000° C. for 30 minutes. Here, for example, phosphorous (P) or arsenic (As) is introduced in the n well 3N.

After that, in the memory cell region, impurities for forming low concentration regions of the source and drain regions of the MIS.FETs for selecting memory cells may be formed in the semiconductor substrate through an ion implantation method. In this case, it becomes possible to implant ions having the main surface of the semiconductor substrate 1 as a reference so that it becomes possible to increase the uniformity of the impurity concentration profile in the direction of the depth of the semiconductor substrate 1. Here, in the present Embodiment 1, this step is carried out in a later step.

Figure 3:
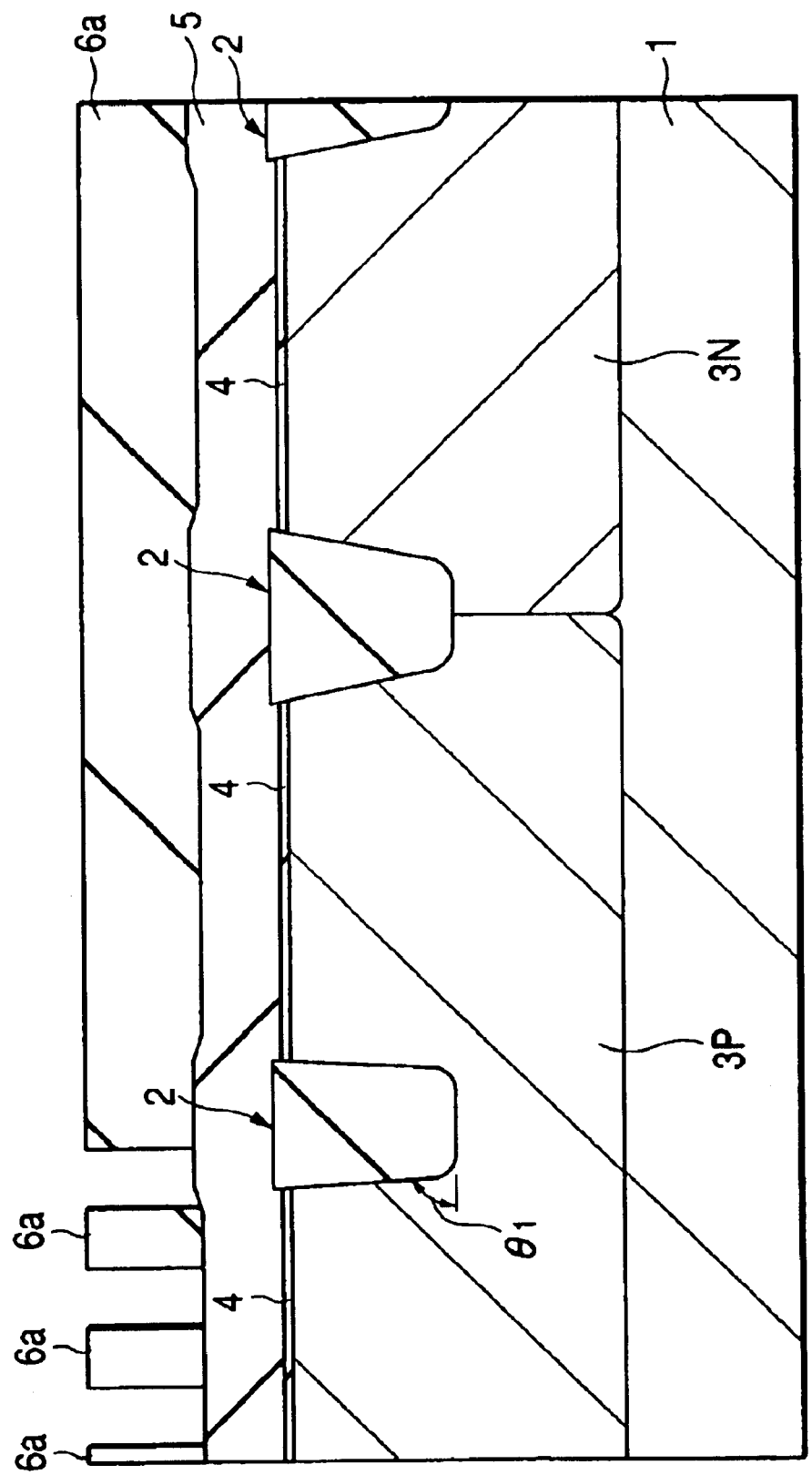
FIG. 3 is a cross-sectional view of the main part of the semiconductor integrated circuit device during processing subsequent to that of FIGS. 1 and 2.
Figure 4:
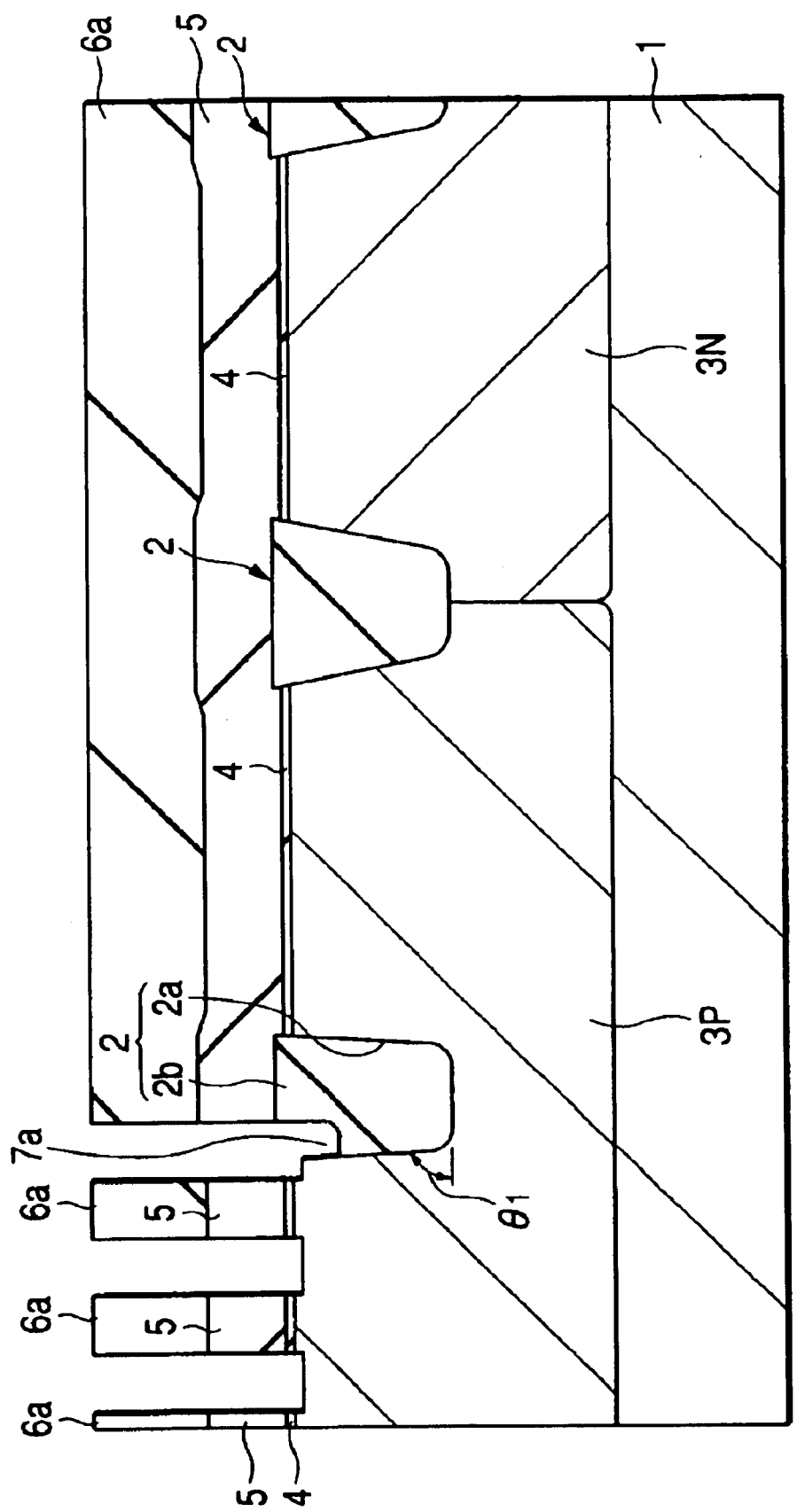
FIG. 4 is a cross-sectional view of the main part of the semiconductor integrated circuit device during processing subsequent to that of FIG. 3.

Next, as shown in FIG. 3, an insulating film 5 made of silicon nitride ($Si_3N_4$, or the like, hereinafter the same) of the thickness of, for example, approximately 50 nm, is formed on the main surface of the semiconductor substrate 1 through a CVD (chemical vapor deposition) method, or the like. Then, a resist film 6a is formed on the insulating film 5. As for the plane form of the resist film 6a, a pattern is formed wherein word line (wire) formation regions are exposed and other regions are covered. Here, a reflection preventive film may be applied between the insulating film 5 and the resist film 6a. After that, as shown in FIG. 4, the insulating films 5 and 4, as well as the insulating film 2b, are removed through etching in sequence by using the resist film 6a as a mask (in the case that the reflection preventive film exists, the reflection preventive film is also removed). Thereby, trenches (second trenches, trenches for forming wires) 7a are formed in the isolation parts 2 in the semiconductor substrate 1. The depth of these trenches 7a is shallower than the isolation trenches 2a of the isolation parts 2. The depth of trenches 7a is set so that the insulating film 2b remains at the bottom of the trenches 7a even after the insulating film 2b is slightly shaved, since it is shaved in a later described step.

Figure 5:
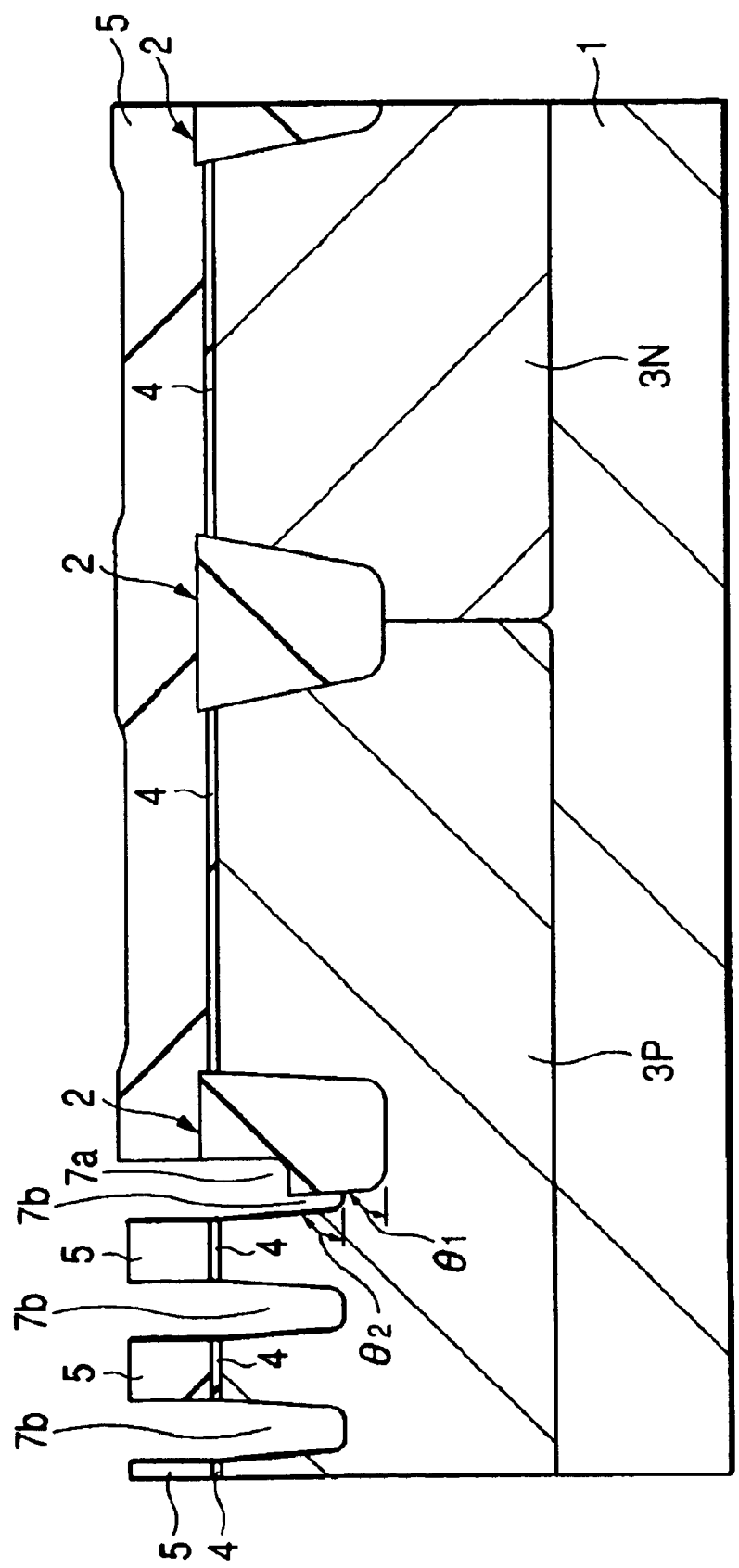
FIG. 5 is a cross-sectional view of the main part of the semiconductor integrated circuit device during processing subsequent to that of FIG. 4.

Next, after removing the resist film 6a (in the case where a reflection preventive film is formed the reflection preventive film is also removed), by using the insulating film 5 as an etching mask, areas of the semiconductor substrate 1, which are exposed therefrom, are removed through etching, and, thereby, the trenches (third trenches, trenches for forming wires) 7b are formed. At this stage the trenches 7b are deeper than the trenches 7a, but they are shallower than the isolation trenches 2a. The inner surfaces of those trenches 7b are also inclined so as to be formed to have a forward taper. Having the main surface of the semiconductor substrate 1 as a reference, the inclination angle θ2 of the inner surfaces of the trenches 7b, with respect to the main surface, is smaller than 90 degrees. Those trenches 7a and 7b form trenches for forming word lines. Here, the trenches 7b may be formed without removing the resist film 6a and the reflection preventive film. In addition, the trenches for forming word lines extend in a direction toward and away from the paper surface of FIG. 5.

Here, at the time of forming trenches for forming word lines, the reasons why trenches 7b (partial removal of the semiconductor substrate 1) are formed after the trenches 7a (partial removal of the insulating film 2b of the isolation parts 2) are formed are, for example, as follows.

Figure 6:
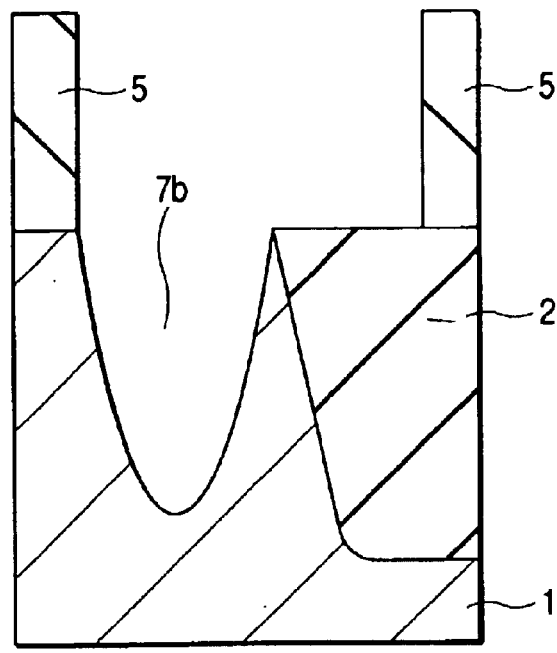
FIG. 6 is a sectional diagram which illustrates schematically the defects at the time of forming trenches for forming wires in a semiconductor substrate.
Figure 7:
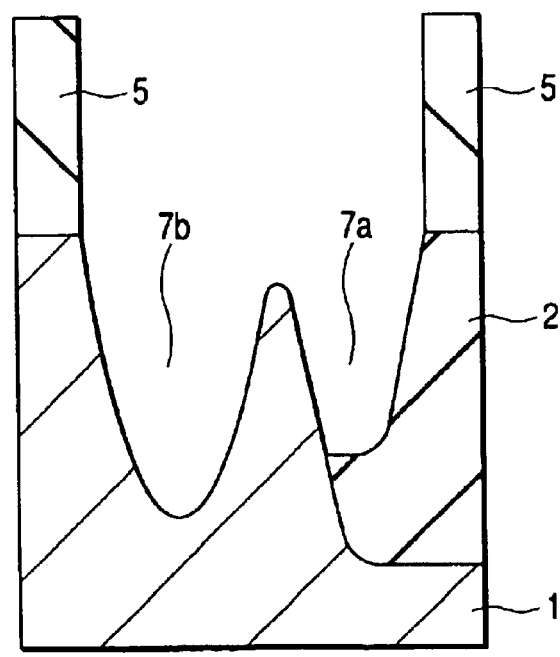
FIG. 7 is a sectional diagram of the formation in a step subsequent to that of FIG. 6 which illustrates schematically the defects at the time of forming trenches for forming wires in a semiconductor substrate.

One reason is that the trenches can be formed without generating etching residue of the semiconductor substrate (silicon) at the bottom of the trenches for forming word lines. That is to say, there are some cases in which etching residue is generated at the bottom of the trenches when the trenches 7a are formed after the trenches 7b are formed. This is because, as shown in FIG. 6, if the trenches 7b are first created, tapers are formed on the side surfaces of the isolation parts 2, since the width of the isolation parts 2 becomes gradually narrower in the downward direction in FIG. 6, so that the parts which contact the isolation parts 2 at the bottom of the trenches 7b are in a shadow so as to result in the etching residue of the semiconductor substrate (silicon). Under this condition, as shown in FIG. 7, when the insulating film 2b of the isolation parts 2 is shaved to form the trenches 7a, microscopic protrusions of the semiconductor substrate are formed at the bottom of the trenches for forming word lines constructed of the trenches 7a and 7b. Those protrusions become the cause of defects related to the withstanding voltage, or the like, of the gate insulating film. Another reason is that, after removing the insulating film 2b (silicon oxide film) through etching, boron ions, or the like, can be implanted for the purpose of selectively increasing the element isolation within the trenches 7a.

In addition, the reason why the insulating film 5 made of silicon nitride is used as a mask at the time of formation of the trenches 7b is, for example, as follows. One reason is that a silicon nitride film is hard to etch at the time when the semiconductor substrate 1 made of silicon is etched. Another reason is that a polycrystal silicon film is polished in a later step and the silicon nitride film functions as a stopper at that time. In addition, another reason is that even if the trenches 7b are created at the same time when the trenches 7a are created, it is hard to etch silicon oxide of the isolation parts 2b and silicon of the semiconductor substrate 1 at an equal rate. On the other hand, the thickness of the resist film 6a is not sufficient for carrying out etching divided into two stages. Though it is necessary for the resist film to be thick enough to avoid falling down due to the surface tension of the developer in the drying step after developing, the resist film ordinarily falls down when the height of the resist film exceeds approximately three times the width of the resist film. When the width of the resist film 6a is, for example, approximately 0.13 μm, the limit of the height of the resist film 6a becomes approximately 0.4 μm. In the case of the formation of the trenches 7a and 7b, the depth of the etching corresponds to the thickness of the reflection preventive film (approximately 100 nm)+the thickness of the silicon nitride film (approximately 100 nm)+the thickness of silicon oxide film (approximately 200 nm)+the depth of the trenches in the silicon (approximately 200 nm); and, therefore, the resist film 6a is eliminated during etching, which results in the failure of trench pattern formation.

In addition, the reason why the depth of the trenches 7b is deeper than the trenches 7a is, for example, as follows. One reason is in consideration of reducing the resistance of the word lines. A leakage current between the storage electrodes on both sides of word lines is determined by the relative relationships between the depth of the isolation trenches 2a and the depth of the gate electrodes (word lines) provided within the isolation film 2b of the isolation parts 2. The larger the difference between the depth of the isolation trenches 2a and the depth of the gate electrodes within the insulating film 2b is, the smaller the leakage current between the storage electrodes on both sides of the word lines becomes. The upper limit of the tolerance value of this leakage current is approximately 1 fA, or less. That is to say, the upper limit value of the tolerated leakage current determines the upper limit value of the depth of the gate electrodes within the insulating film 2b of the isolation parts 2. Moreover, in the case of a DRAM, it is preferable for the resistance of word lines to be lower, since this is an important factor which influences the reading out and writing in speed. In order to increase the speed, the reduction of the resistance of word lines is an effective means. The resistance of a word line is determined by the material of the word line and a mean cross-sectional area of the word line. However, as described above, the upper limit value of the depth of the gate electrodes within the insulating film 2b of the isolation parts 2 is determined by the leakage current between the storage electrodes on both sides of the word line; and, therefore, it is effective to increase the mean cross-sectional area by making the depth of the trenches 7a deeper on the side of the semiconductor substrate 1 in order to reduce the resistance of the word line. Accordingly, by making the depth of the trenches 7b deeper than the trenches 7a at this stage, the above described problem of the leakage current between the storage electrodes can be avoided, while the reduction of the resistance of word lines can be achieved.

In addition, another reason is that, at the time of filling in the trenches for forming word lines with a word line material (gate electrode material), it is better to have less unevenness on the interface on the bottoms of the trenches 7a and 7b. In order to minimize the unevenness of the surfaces of the trenches 7a and 7b at the time of filling in the trenches 7a, and 7b with the word line material, essentially the depths of the trenches 7a and 7b are made equal. However, after forming the trenches 7b, as will be described later, it is necessary to form a sacrificial oxide film through a thermal oxidization method, or the like, in order to remove the damage at the time of trench formation in the semiconductor substrate 1 and to remove that sacrificial oxide film with hydrofluoric acid, or the like. At the time of removing this sacrificial oxide film, since the insulating film 2b of the isolation parts 2 has a greater etching rate than the sacrificial oxide film formed through the thermal oxidation method, the etching amount of the insulating film 2b, that is to say, the increase of the depth of the trenches 7a becomes larger than the etching amount of the semiconductor substrate 1, that is to say, the increase of the depth of the trenches 7b. Therefore, in order to make the depth of the trenches 7a and 7b more nearly equal at the time of filling in of the word line material, the depth of the trenches 7b is made deeper than the trenches 7a at the stage of formation of those trenches 7b so as to compensate the difference of the depth increase.

After the step of the above described formation the trenches 7a and 7b, a thermal oxidization treatment is applied to the semiconductor substrate 1 so that the above described sacrificial oxide film, having the purpose of removing the damage, is formed within the trenches 7a and 7b. After forming such a sacrificial oxide film, impurities for adjusting the threshold voltage of the MIS.FETs for memory cell selection are introduced into the semiconductor substrate 1 through an ion implantation method, or the like. By introducing impurities for threshold voltage adjustment after forming the sacrificial oxide film, the diffusion of the impurities can be controlled or prevented so as to increase the operational reliability. As for the implantation of the impurities, the impurities can be implanted in all of the surfaces of the inner walls of the trenches 7b through the implantation in both directions diagonal to and perpendicular to the main surface of the semiconductor substrate 1.

It is also possible to carry out the introduction of the impurities for adjusting threshold voltage through a vapor phase doping. In this case, it becomes possible to introduce impurities more uniformly in the inner surfaces of the trenches 7b compared to the case where impurities are introduced through the ion implantation method.

Figure 8:
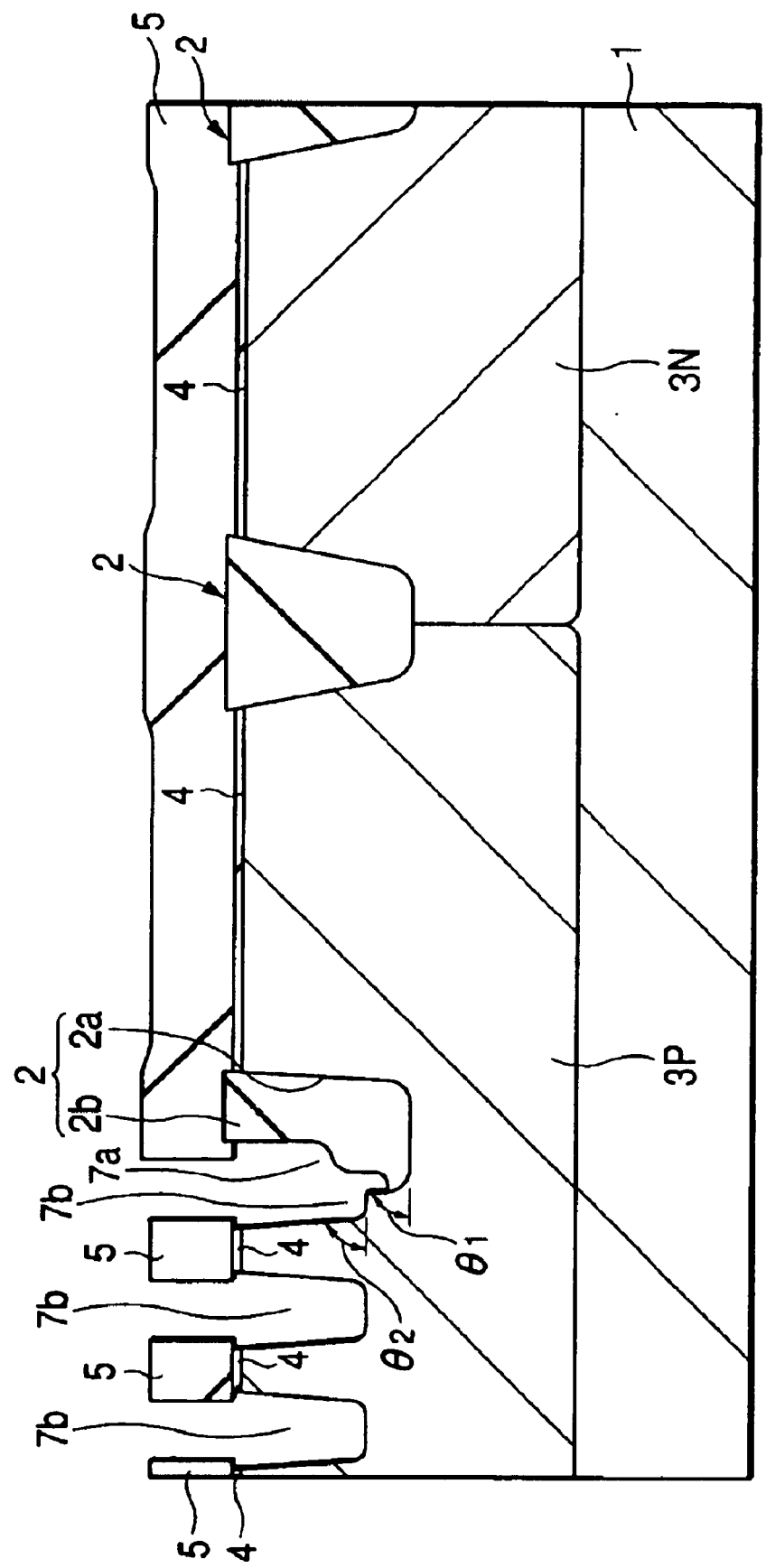
FIG. 8 is a cross-sectional view of the main part of a semiconductor integrated circuit device during processing subsequent to that of FIG. 5.

After the above-described implantation of impurities for adjusting the threshold voltage, the sacrificial oxide film is removed with, for example, hydrofluoric acid. At this time the etching rate of the insulating film 2b of the isolation parts 2, which is exposed from the trenches 7a, is larger than that of the sacrificial oxide film, and this is taken into consideration so as to have a difference between the depths of the trenches 7a and 7b, and, therefore, as shown in FIG. 8, the trenches 7a are not deeper than the trenches 7b. Here, though a case is shown in which the trenches 7b after the above step are deeper than the trenches 7a, they may be approximately equal. At this stage, it is preferable for the bottom of the interface between those trenches 7a and 7b not to have large and steep steps or unevenness compared to that at the time of the formation of the trenches 7a and 7b.

In addition, in the present Embodiment 1, the gate trenches are formed through the above-described step etching method, and, thereby, the undercuts beneath the hard mask can be prevented and trenches of a desired depth which have a large radius of curvature of the bottom corners of the above-described trenches can be obtained. Thereby, the characteristics of the MIS.FETs of a buried gate electrode structure, especially the sub-threshold characteristics, can be increased (sub-threshold coefficient can be made smaller). That is to say, the divergence of the electric field in the vicinity of the bottom corners within the trenches 7b can be relaxed so that the channel resistance can be reduced and a desired drain current can be obtained at a predetermined threshold voltage. Therefore, it becomes possible to increase the element driving performance. In addition, it becomes unnecessary to make the transistors of the depletion type, and, therefore, the increase of the leakage current can be prevented, and it also becomes possible to prevent an increase of power consumption. In the present Embodiment 1, the radius of curvature of the bottom corners within the trenches 7b is made to be, for example, 10 nm or more, or, for example, approximately 30 nm. The radius of curvature in the bottom corners within the trenches 7b will be described in more detail later.

Figure 9:
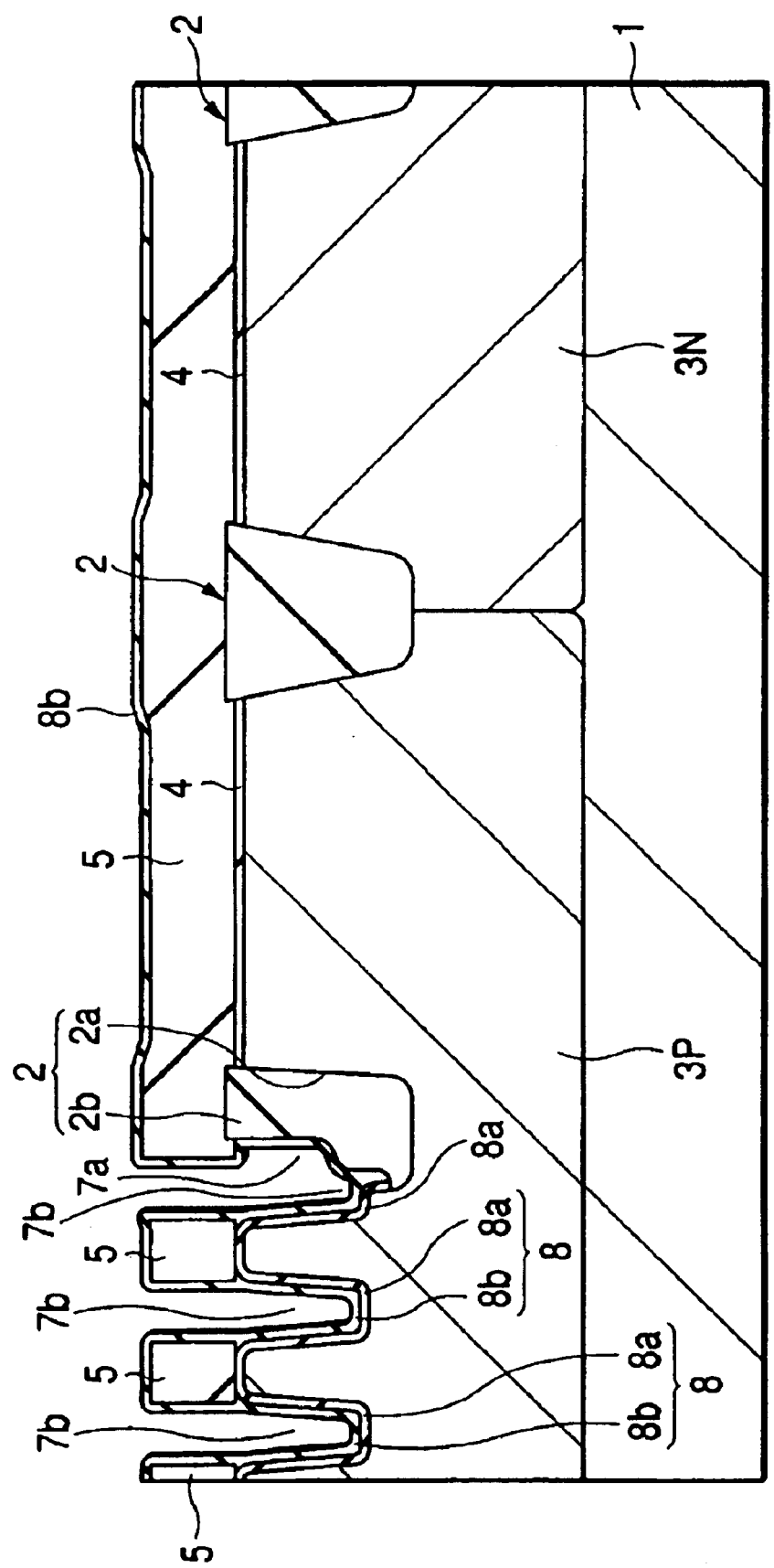
FIG. 9 is a cross-sectional view of the main part of a semiconductor integrated circuit device during processing subsequent to that of FIG. 8.
Figure 10:
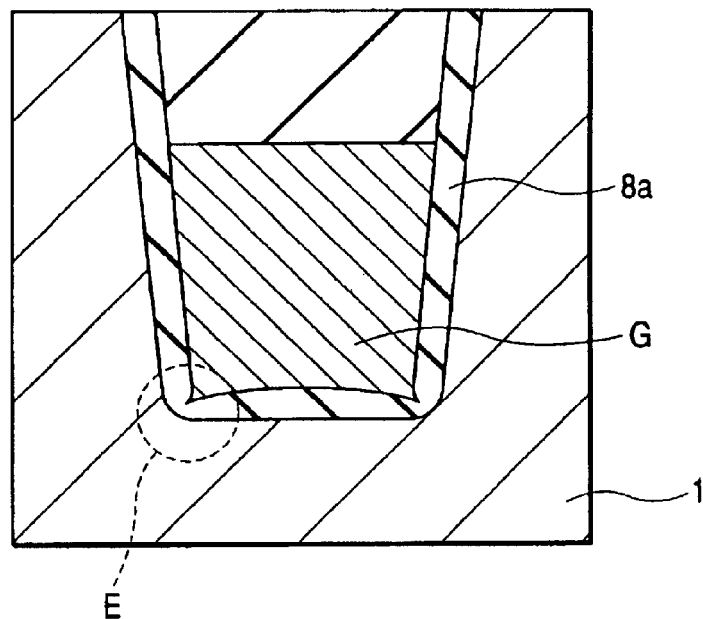
FIG. 10 is a sectional diagram schematically illustrating the case where a gate insulating film is formed only through a thermal oxidation method.
Figure 11A:
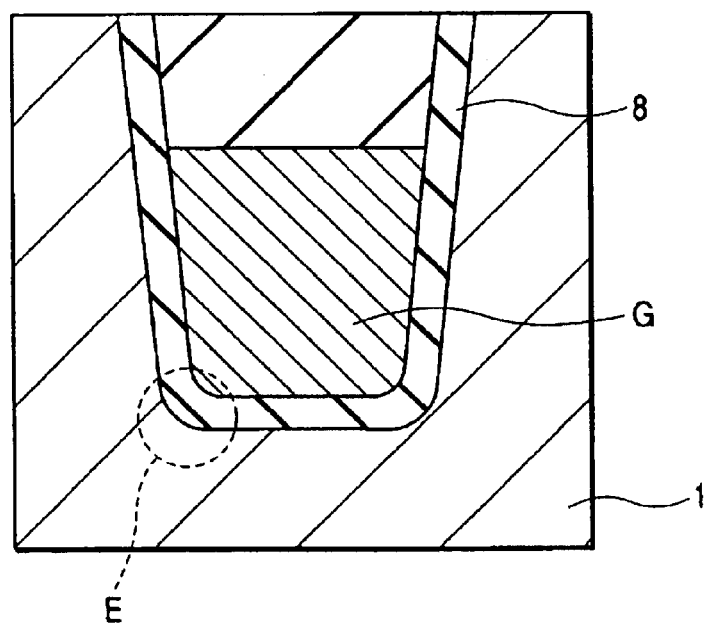
FIG. 11(a) is a section diagram schematically illustrating the case wherein a gate insulating film is formed of layered films through a thermal oxidation method and a CVD method.
Figure 11B:
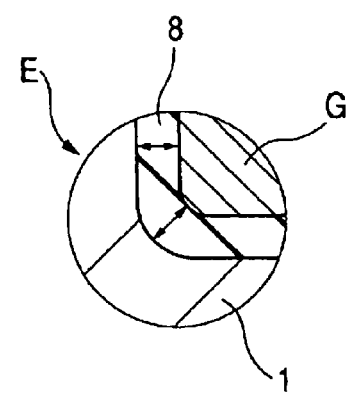
FIG. 11(b) is an enlarged cross-sectional view of the region E of FIG. 11(a)

Then, a gate oxidization treatment is applied to the semiconductor substrate 1, and, thereby, as shown in FIG. 9, a gate insulating film 8a made of silicon oxide, or the like, having, for example, a thickness of approximately 4 nm, is formed on the surface of the semiconductor substrate 1 which is exposed from the trenches 7b. After that, a gate insulating film 8b made of silicon nitride, or the like, having, for example, a thickness of approximately 10 nm, is deposited thereon (within the trenches 7a and 7b) through a low pressure CVD method, or the like. Thereby, a gate insulating film 8 (8a, 8b) is formed within the trenches 7a and 7b. In the present Embodiment 1, the deterioration of the coverage of the gate insulating film 8a within the trenches 7a and 7b can be compensated for by forming a gate insulating film 8b through a CVD method, or the like, and, therefore, it becomes possible to increase the withstanding voltage of the gate insulation. FIG. 10 schematically shows the case where the gate insulating film is formed only through a thermal oxidization method. In this case, the coverage of the gate insulating film 8a deteriorates due to the occurrence of stress accompanying the formation of the thermal oxide film in the regions E of the bottom corners within the trenches 7b, so that an electric field concentration easily occurs at those locations. That is to say, a gate insulation breakdown occurs at these places so that a leakage current flows between the gate electrodes G and the semiconductor substrate 1. Since an uneven part can easily be created on the interface part between the trenches 7a and 7b, this phenomenon easily occurs in the case where the gate insulating film is formed only through the thermal oxidization method. Here, the symbols SD denote source and drain regions. On the other hand, FIGS. 11(a) and 11(b) schematically show the case where the gate insulating film is formed through a CVD method. FIG. 11(b) is an enlarged view of the region E of FIG. 11(a). In this case, the gate insulating film grows in a conformal manner with respect to the base, and, therefore, the coverage in the bottom corners within the trenches can be increased so that the problem of the deterioration of the withstanding voltage of the insulation of the bottom corners can be controlled or prevented. In addition, in the case where the gate insulating film is formed of a layered film through a thermal oxidization method and a CVD method, the gate insulating film 8b formed through the CVD method can compensate for the locations which cannot be covered with the gate insulating film 8a formed through the thermal oxidization method, and, therefore, it becomes possible to control or prevent the above described problem.

In addition, as for the material of the gate insulating film 8b, the following effects can be gained by selecting silicon nitride. First, in the present Embodiment 1, though titanium silicide, or the like, is used as a material of a gate electrode, as described below, the reliability of the gate insulating film can be increased when silicon nitride is used as a gate insulating film material. This is because, if the step of formation of titanium silicide on the gate insulating film 8a, made of silicon oxide, is carried out under conditions where the gate insulating film 8b, made of silicon nitride, doesn't exist, the gate insulating film 8a deteriorates (for example, a leakage current flows between the gate electrodes and the semiconductor substrate) as a result of absorption of oxygen in the gate insulating film 8a by titanium. In the case where polycrystal silicon, tungsten, or the like, are used as the gate electrode material, a silicon oxide film or tantalum oxide ($Ta_2O_5$), for example, can be used as a material of the gate insulating film 8b. Second, since the gate capacity can be increased, the sub-threshold coefficient can be made small. Accordingly, it becomes possible to increase the element driving performance due to the increase of the ON/OFF current ratio without inviting an increase in power consumption. In the case in which tantalum oxide is used as a material of the gate insulating film 8b, this effect can be gained.

Figure 12:
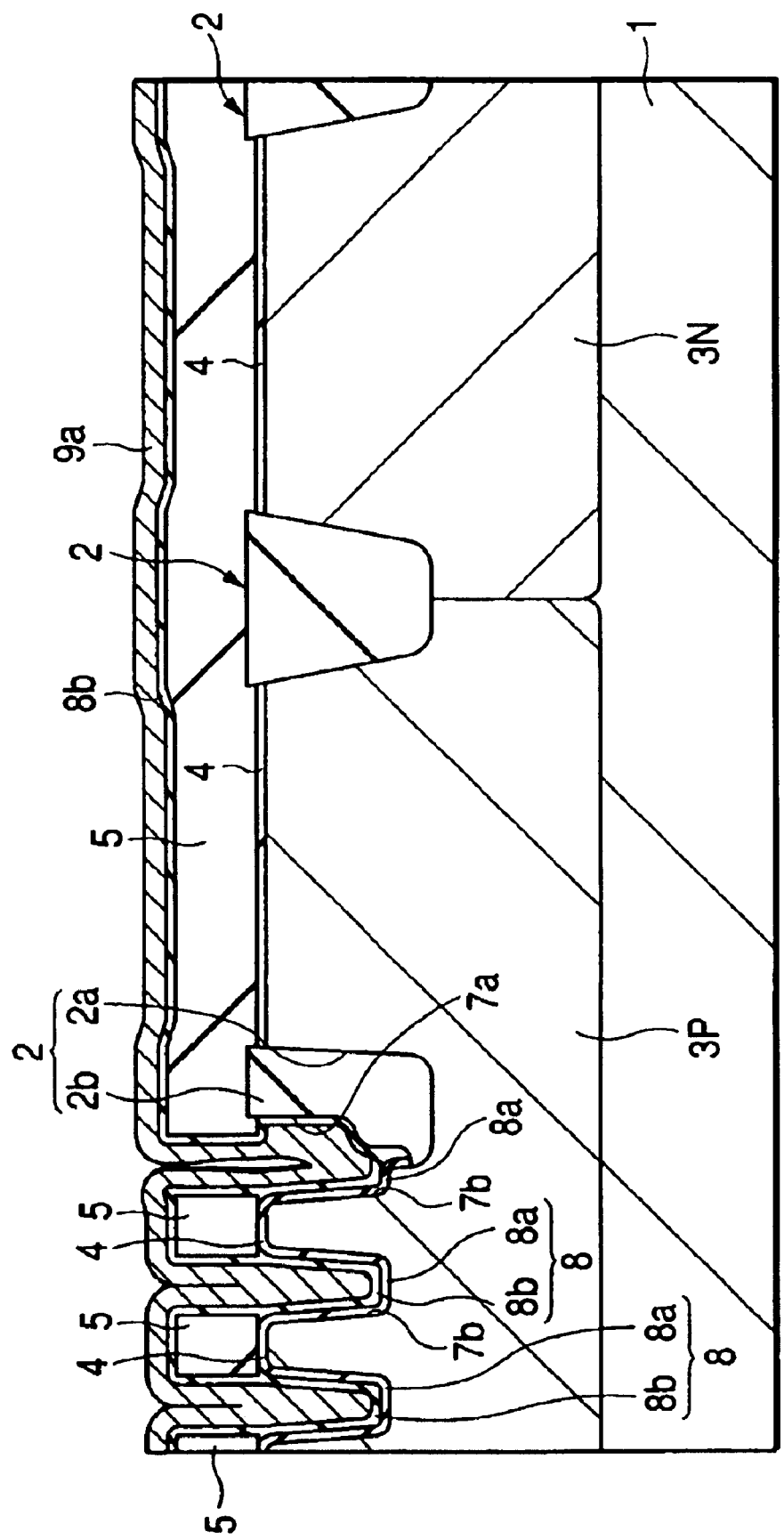
FIG. 12 is a cross-sectional view of the main part of a semiconductor integrated circuit device during processing subsequent to that of FIG. 9.
Figure 13:
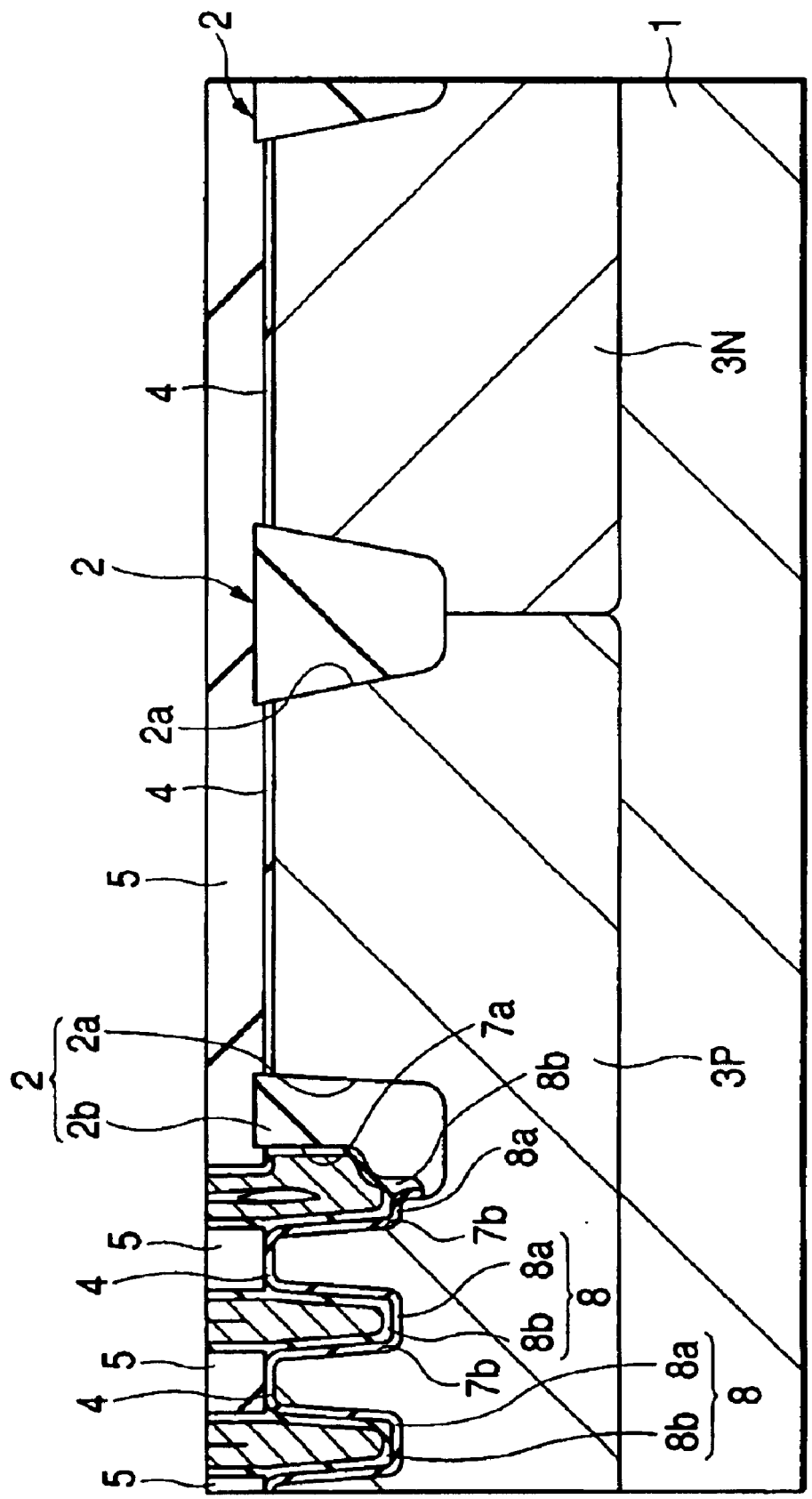
FIG. 13 is a cross-sectional view of the main part of a semiconductor integrated circuit device during processing subsequent to that of FIG. 12.
Figure 14:
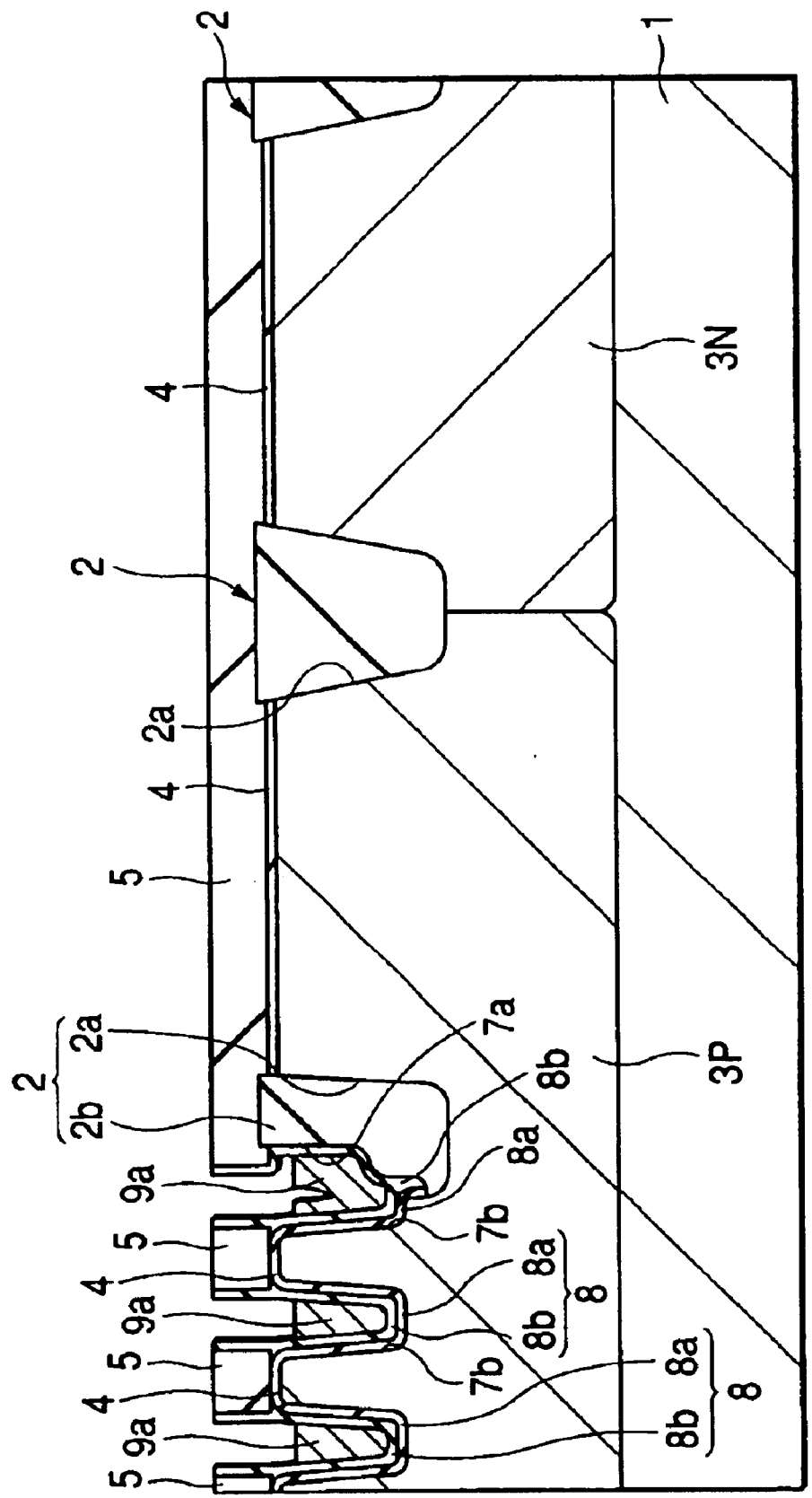
FIG. 14 is a cross-sectional view of the main part of a semiconductor integrated circuit device during processing subsequent to that of FIG. 13.

Next, as shown in FIG. 12, a gate electrode forming film 9a made of non-doped amorphous silicon, which can be effectively filled in, for example, even into narrow trenches, is deposited through a CVD method, or the like, on the semiconductor substrate 1, including the trenches 7a and 7b, and, after that, this is polished through a CMP method, or the like, as shown in FIG. 13, by using the insulating film 5, made of silicon nitride, or the like, as an etching stopper. Thereby, the unevenness of the surface of the gate electrode forming film 9a due to the difference of the depths of the trenches 7a and 7b can be eliminated. At this stage, the top surface of the gate electrode forming film 9a within the trenches 7a and 7b is at almost an equal height to the top surface of the remaining insulating film 5. Then, since the trench width has become larger within the trenches 7a and 7b due to the etching treatment, or the like, of the above described sacrificial oxide film by hydrofluoric acid, there are some cases where voids are formed in the gate electrode forming film 9a, which is filled in into there; and, therefore, the top part of the gate electrode forming film 9a is removed through etching by means of an isotropic etching treatment, or the like, until the voids are opened using the insulating film 5 as an etching mask, as shown in FIG. 14. Though it is possible to carry out the removal of the gate electrode forming film 9a until the voids are opened through only etching, the etching proceeds into a gate electrode forming film 9a at the void bottom through this method so that the gate insulating film 8b is exposed therefrom, so as to include the risk of defects. Accordingly, as described in the present embodiment, the step of removing the gate electrode forming film 9a until the voids are opened can be carried out by CMP up to the midway point in the process, and by reducing the etching amount of the gate electrode forming film 9a at the void bottoms can be reduced so as to prevent the occurrence of the above described problem.

Figure 15:
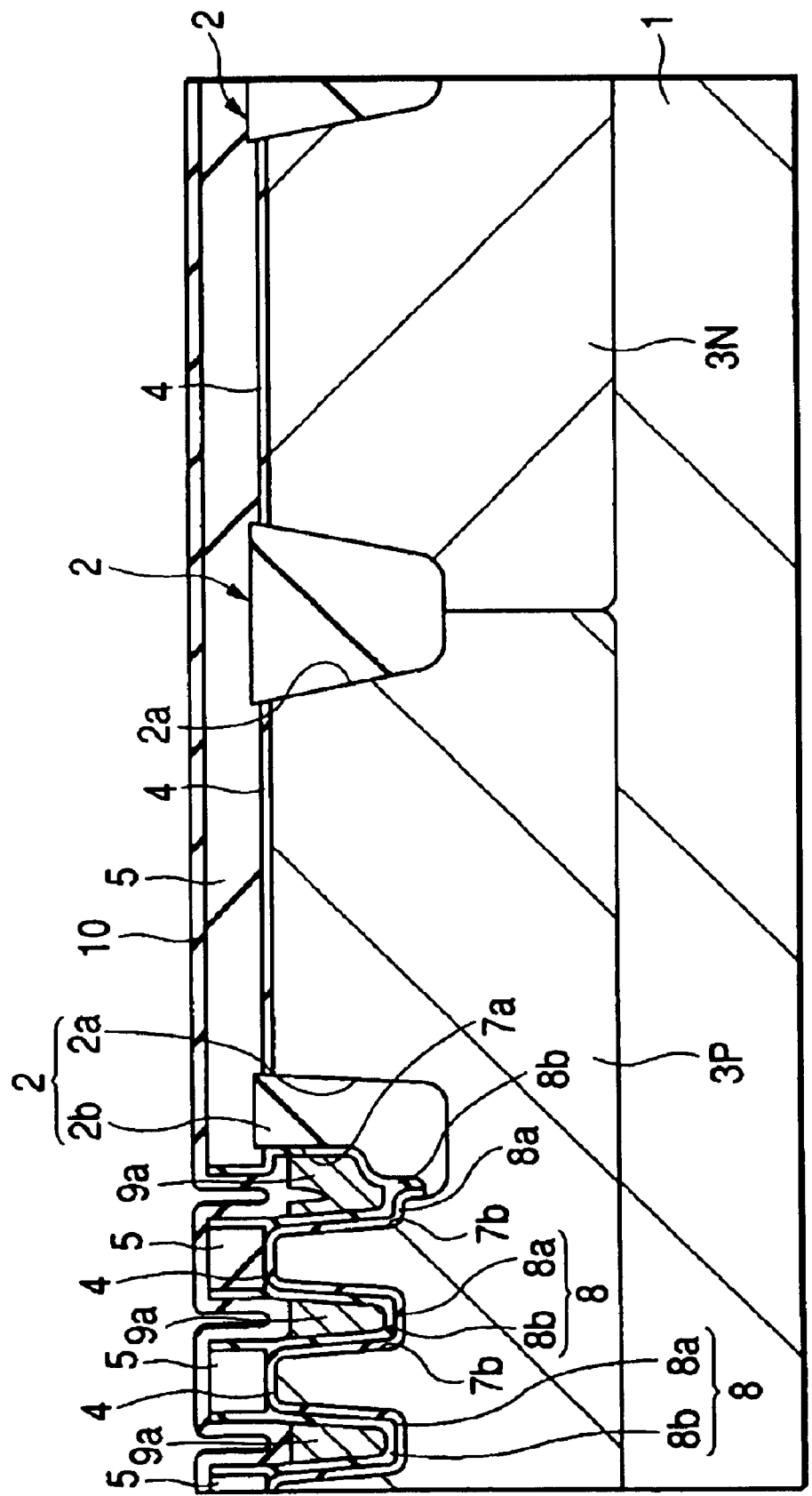
FIG. 15 is a cross-sectional view of the main part of a semiconductor integrated circuit device during processing subsequent to that of FIG. 14.
Figure 16:
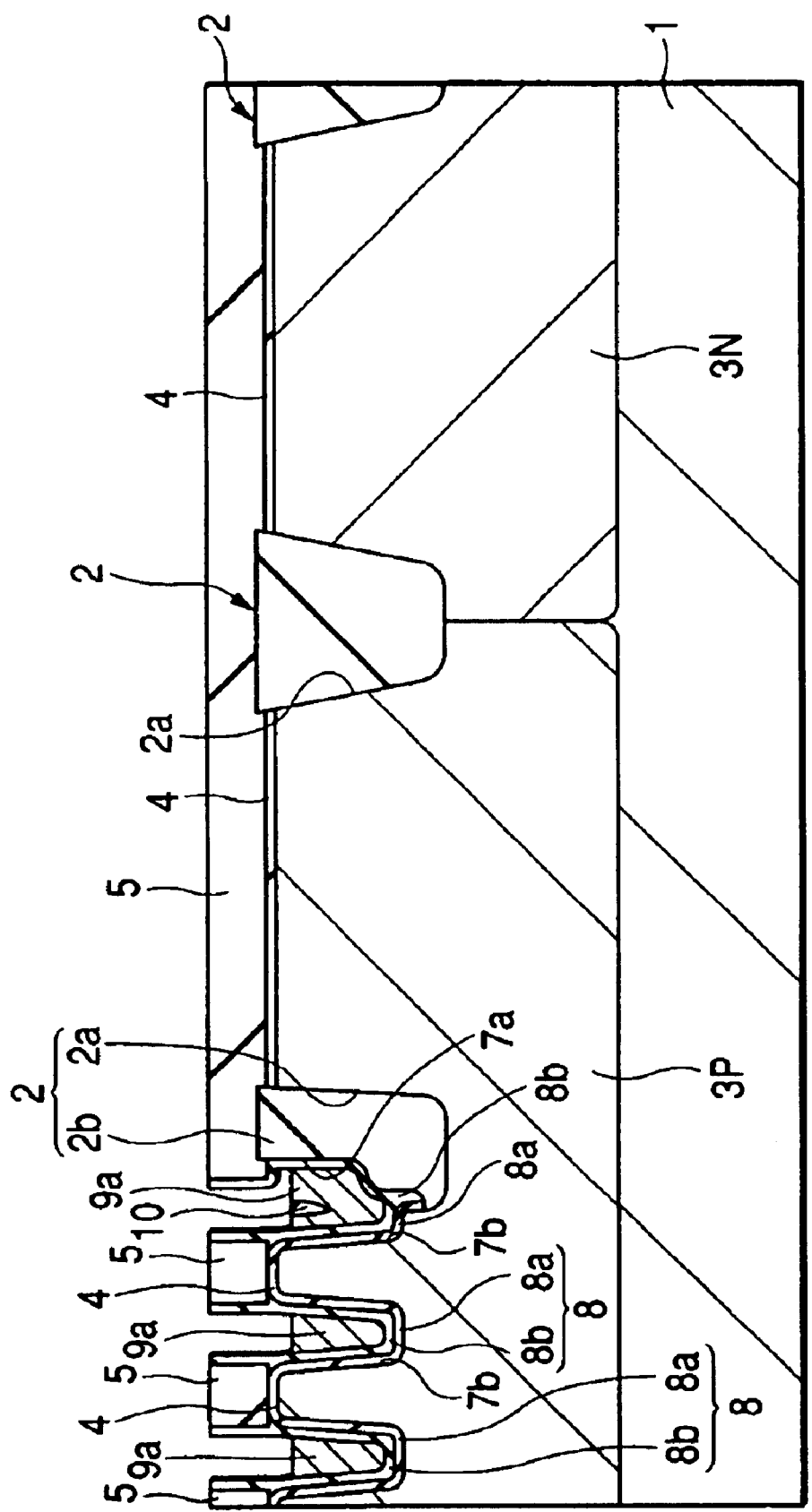
FIG. 16 is a cross-sectional view of the main part of a semiconductor integrated circuit device during processing subsequent to that of FIG. 15.

After that, as shown in FIG. 15, after an insulating film 10 made of, for example, silicon nitride, is deposited through a CVD method, or the like, by etching back the insulating film 10 through an isotropic dry etching method, an insulating film 10 is filled in the voids on the upper surface of the gate electrode forming film 9a, which is filled into the trenches 7a and 7b, as shown in FIG. 16. At this time the insulating film 10 is supposed not to leave a residue on the upper side walls of the trenches 7a and 7b.

Figure 17:
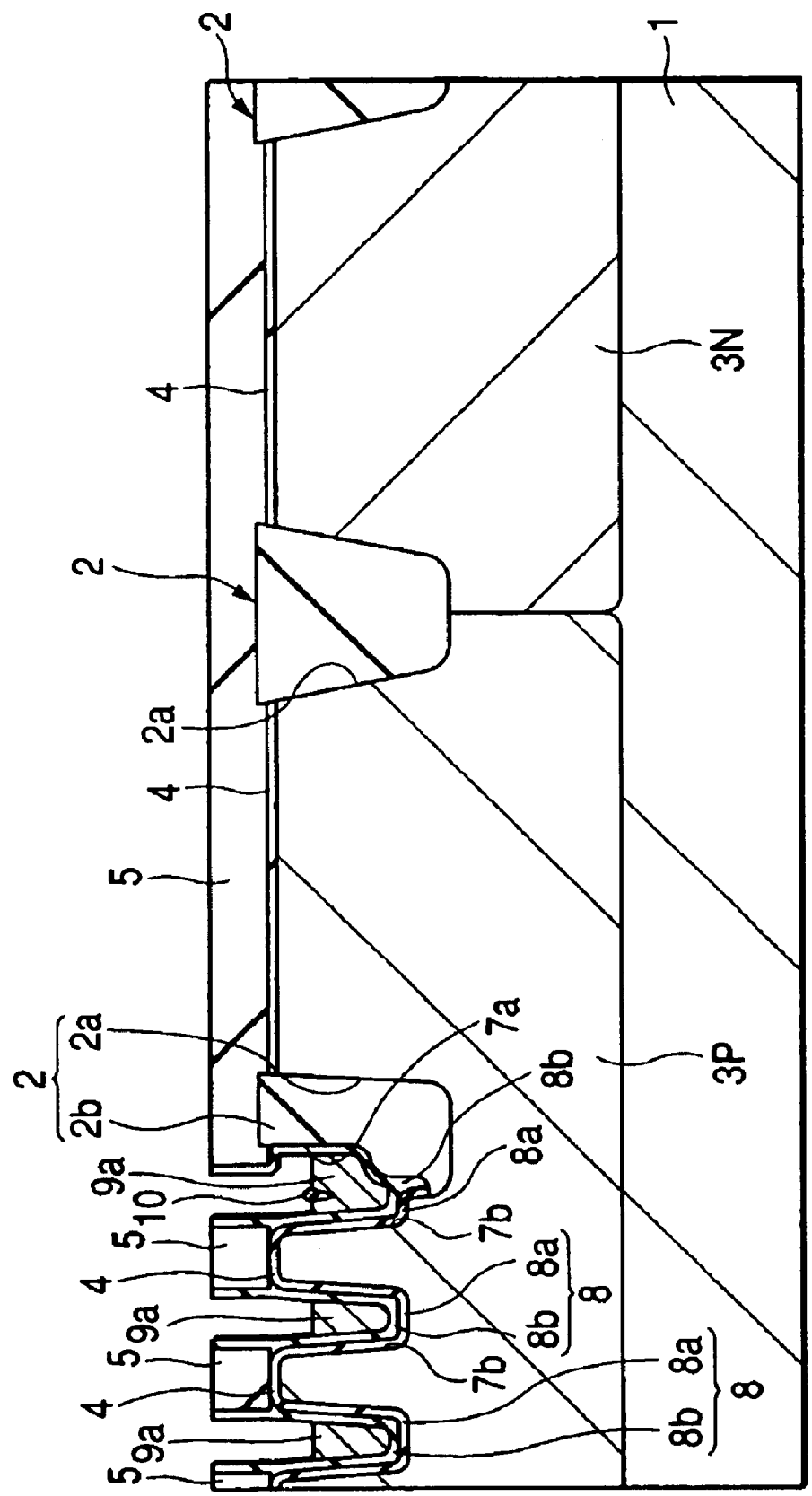
FIG. 17 is a cross-sectional view of the main part of a semiconductor integrated circuit device during processing subsequent to that of FIG. 16.
Figure 18:
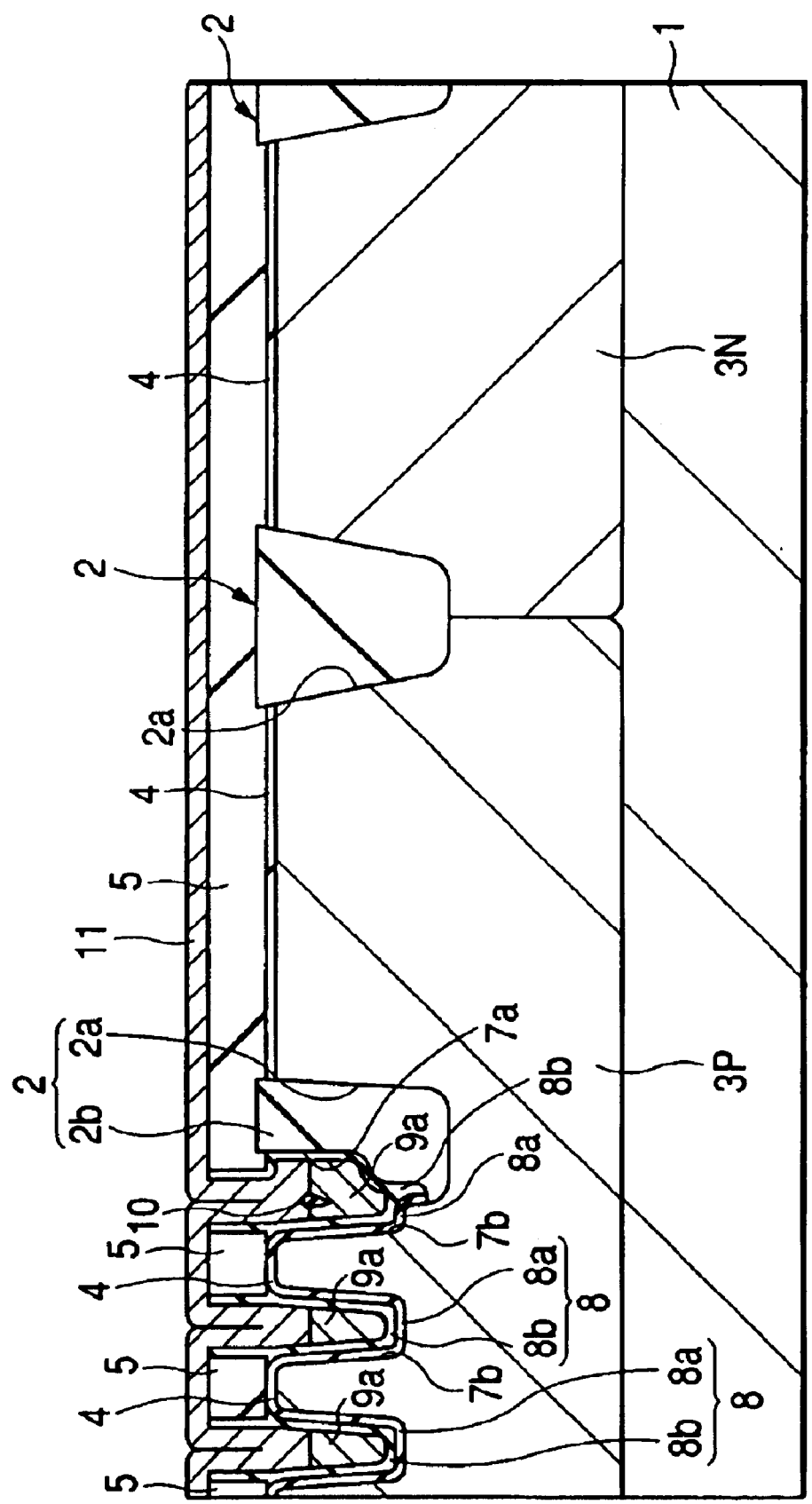
FIG. 18 is a cross-sectional view of the main part of a semiconductor integrated circuit device during processing subsequent to that of FIG. 17.
Figure 19:
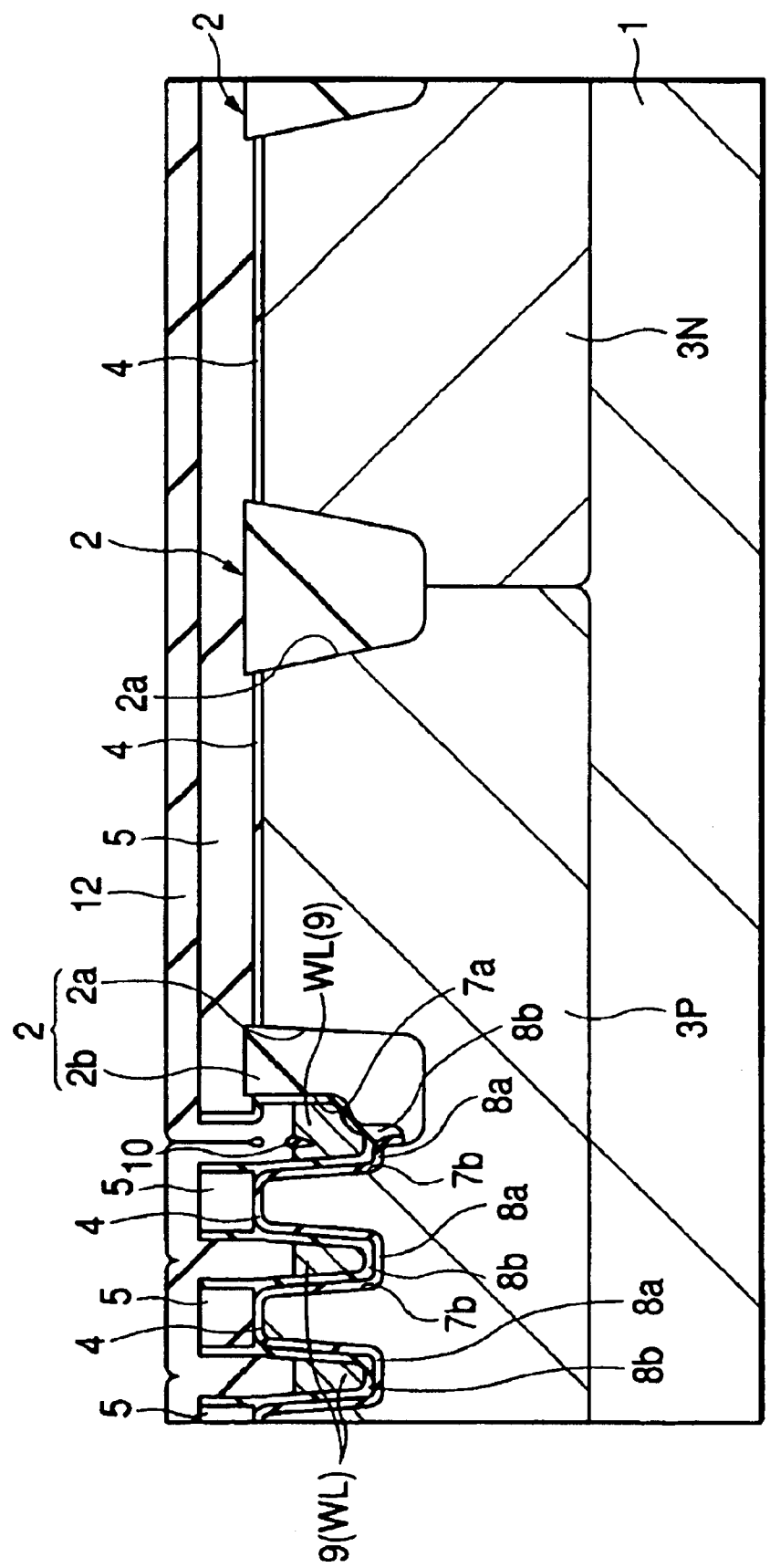
FIG. 19 is a cross-sectional view of the main part of a semiconductor integrated circuit device during processing subsequent to that of FIG. 18.
Figure 20:
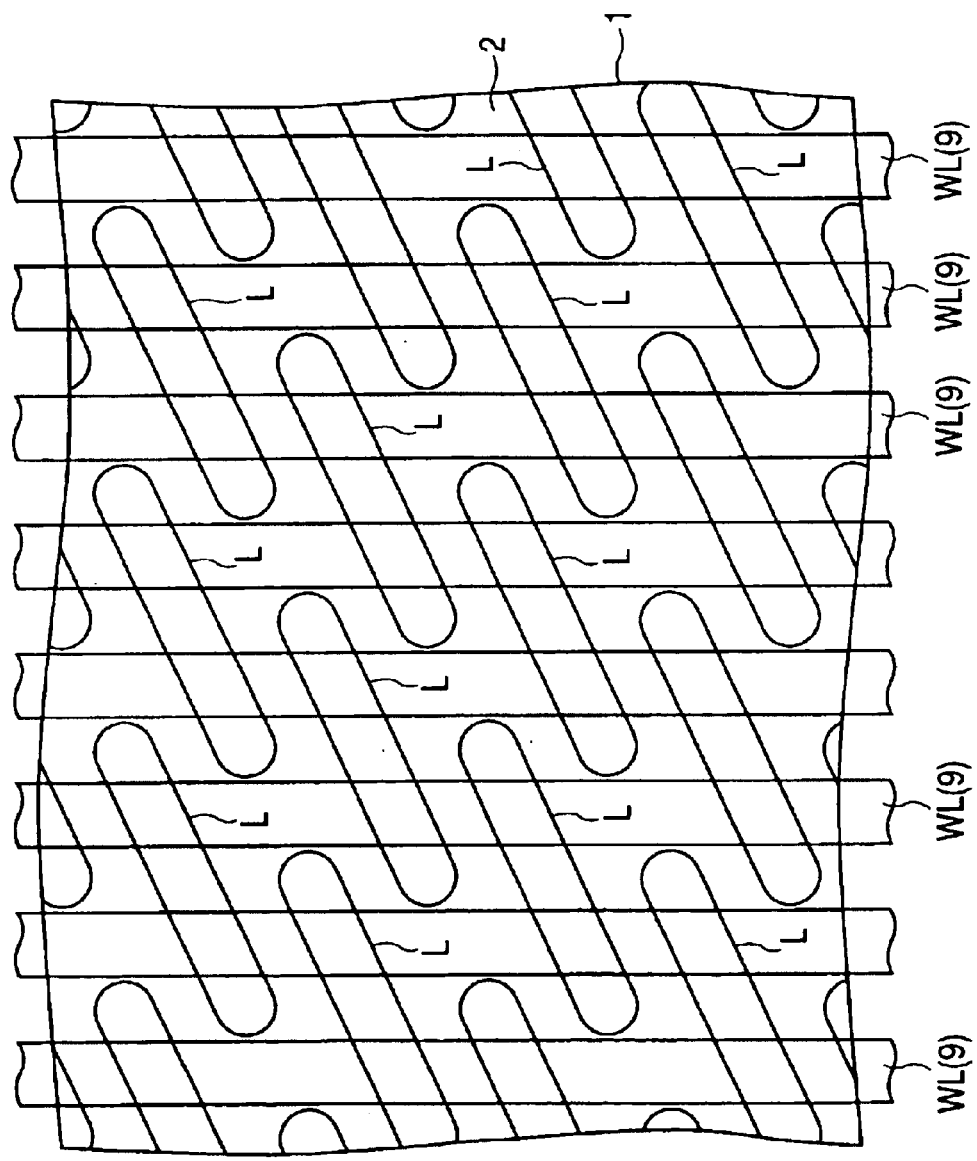
FIG. 20 is a plan view of the main part of the memory cell region of FIG. 19.

Next, as shown in FIG. 17, the gate electrode forming film 9a is, again, etched back through an isotropic dry etching treatment. At this time, the insulating film 5 on the semiconductor substrate 1 and the insulating film 10, which is filled in the voids of gate electrode forming film 9a, are used as an etching mask. The reason why the insulating film 10 is formed in the voids in this way is that, if the insulating film 10 does not exist, the etching proceeds more in the void parts than in other parts at the time of the etching back treatment of the gate electrode forming film 9a, and, therefore, the gate insulating film 8b is exposed so as to include the risk of defects. Accordingly, in case such a problem doesn't occur, the step of formation of the insulating film 10 may be eliminated. Then, an oxidization process is applied to the semiconductor substrate 1 and, thereby, amorphous silicon is oxidized, and, after that, the part oxidized by this is removed by hydrofluoric acid, or the like. Thereby, it becomes possible to remove the residue of amorphous silicon even if it remains within the trenches 7a and 7b. After that, as shown in FIG. 18, a conductive film 11 made of, for example, titanium (Ti), or the like, is deposited through a CVD method, a sputtering method, or the like, and then the conductive film 11 and the gate electrode forming film 9a cause a silicidation reaction through the process of annealing. After that, by removing the conductive film 11, which hasn't reacted, using hydrogen peroxide, or the like, word lines WL (gate electrodes 9) made of, for example, titanium silicide, or the like, are formed within the trenches 7a and 7b, as shown in FIGS. 19 and 20. In the present Embodiment 1, microscopic trenches 7a and 7b are filled in with amorphous silicon which makes an effective filling in possible, and, after that, the amorphous silicon is made to be silicide through silicidation, and, thereby, the gate electrodes 9 made of titanium silicide, or the like, which is of low resistance, can be formed within the trenches 7a and 7b in an effective filled in manner. Here, the filled in gate electrode material is not limited to titanium silicide, but, rather, can be changed in a variety of ways. For example, the surface of the titanium silicide can be further nitrided so as to gain a structure where titanium nitride is layered. In this case, it becomes possible to increase the withstanding characteristics of the gate electrode at the time of the cleaning treatment after contact holes are created in the insulating film so that gate electrodes are exposed in the later steps. In addition, by using metal, such as tungsten, the resistance of the word lines WL can be reduced to a great extent. Furthermore, a structure can be gained wherein, for example, a polycrystal silicon of low resistance, tungsten nitride and tungsten are stacked in this order from the lower layer. In this case, by making the lowest layer of polycrystal silicon p-type, the threshold voltage can be made larger by the difference of work function with the n-type silicon, and, therefore, it becomes possible to secure a desired threshold voltage under the condition where the impurity concentration of the semiconductor substrate 1 is made lower. This effect can be gained in the case where tungsten is used as a gate electrode material. In addition, the gate electrodes may be constructed of, only, a polycrystal silicon of low resistance.

In addition, in the present Embodiment 1, it is preferable that the top surfaces of the word lines WL (gate electrodes 9) are formed in locations 40 nm, or more, deeper than the main surface of the semiconductor substrate 1. Though it is not particularly limitative in the present Embodiment 1, the top surfaces of the word lines WL are formed at positions, for example, approximately 70 nm deeper than the main surface of the semiconductor substrate 1. The reason for this will be described later. In addition, FIG. 20 shows a plan view of the main part of the memory cell region. The word lines WL are arranged so as to cross the active regions L.

Two word lines WL are arranged so as to overlap in a plane over one active region L. The part in a word line WL which overlaps in a plane over an active region L becomes a gate electrode 9. Here, the active regions L are arranged diagonally relative to the extending direction of the word lines WL.

Figure 21:
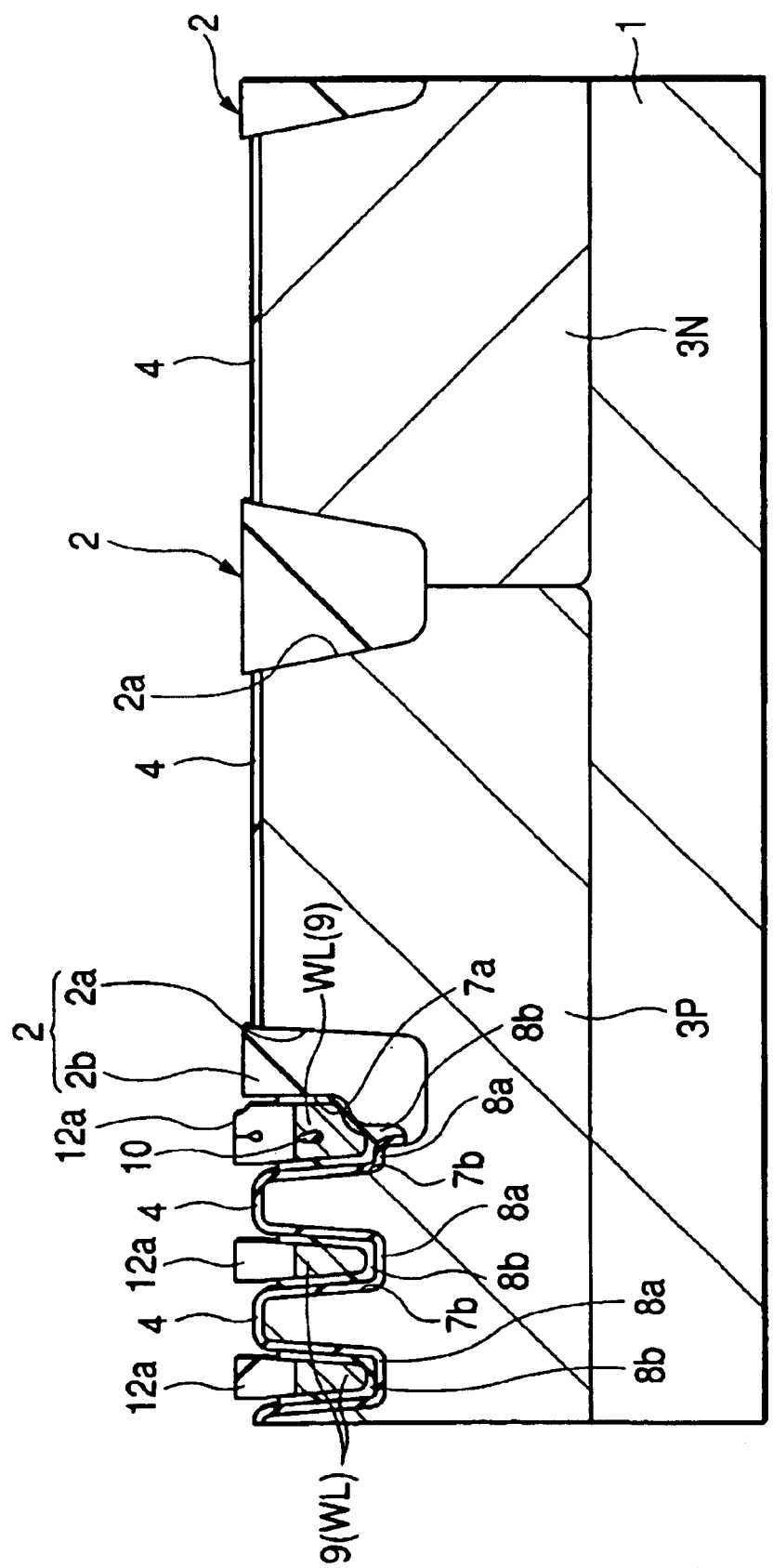
FIG. 21 is a cross-sectional view of the main part of a semiconductor integrated circuit device during processing subsequent to that of FIGS. 19 and 20.
Figure 22:
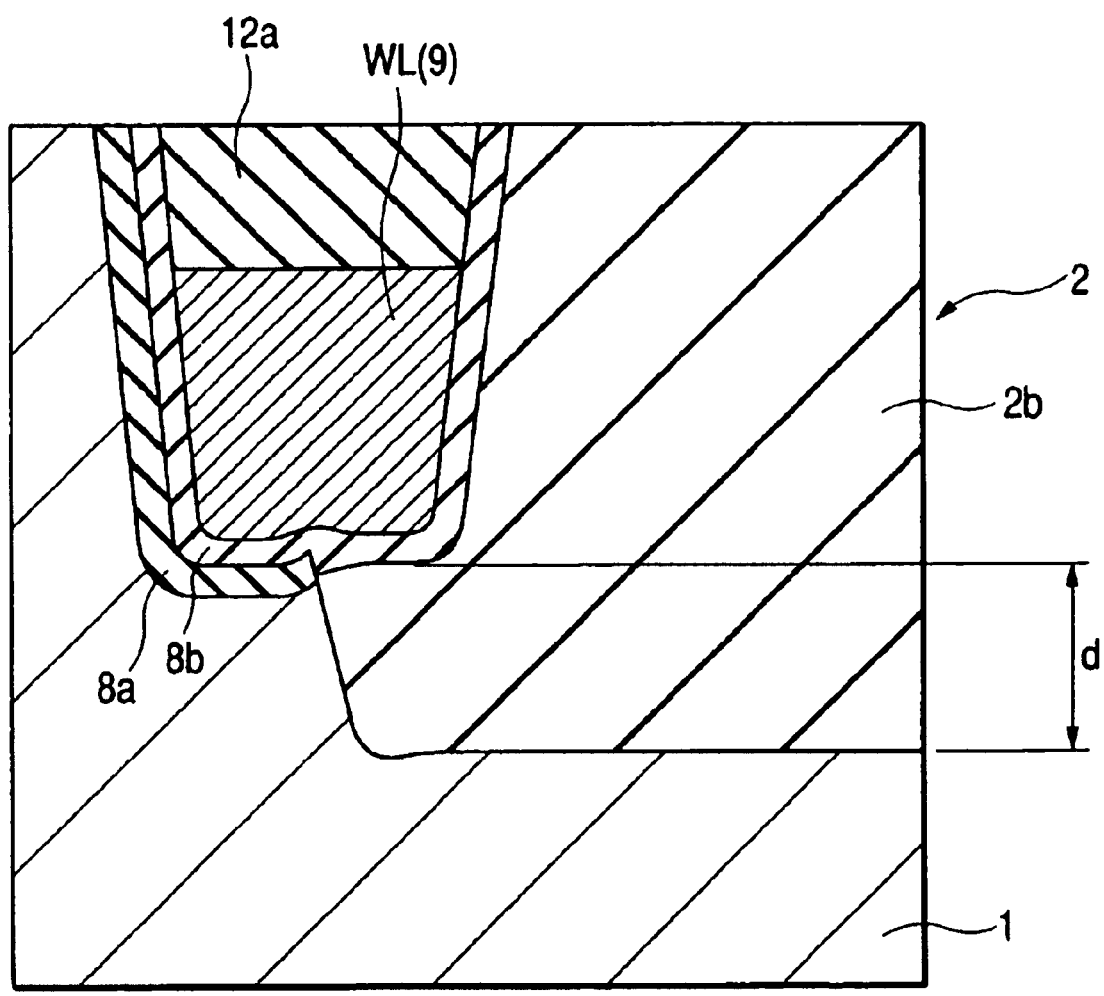
FIG. 22 is a sectional diagram schematically illustrating a part of the cross-sectional structure of the semiconductor integrated circuit device of FIG. 21 during processing.

Next, after an insulating film 12 made of, for example, silicon oxide is deposited on the semiconductor substrate 1 through a CVD method, or the like, the insulating film 12 is polished through a CMP method, or the like, using the insulating film 5 as an etching stopper. Then, the remaining insulating film 5 is removed using heated phosphate and, thereby, a cap insulating film 12a made of, for example, silicon oxide is formed on the word lines WL (gate electrodes 9) as shown in FIG. 21. At this stage, as shown in FIG. 22, the insulating film 2b of the isolation parts 2 remains in the lower part of the word lines WL (gate electrodes 9) within the trenches 7a. This is for the purpose of controlling or preventing parasitic elements from being formed, since parasitic elements are formed using the word lines WL as its parts when the thickness of the insulating film 2b secured on the bottom side of the trenches 7a is too thin. As a result of the investigation by the present inventors, it is preferable that the thickness d of the insulating film 2b is, for example, approximately 100 nm or more. In addition, the depth of the trenches 2b of the isolation parts 2 is formed to be deeper than the trenches 7a and 7b in order to secure the desired element isolation performance.

Figure 23:
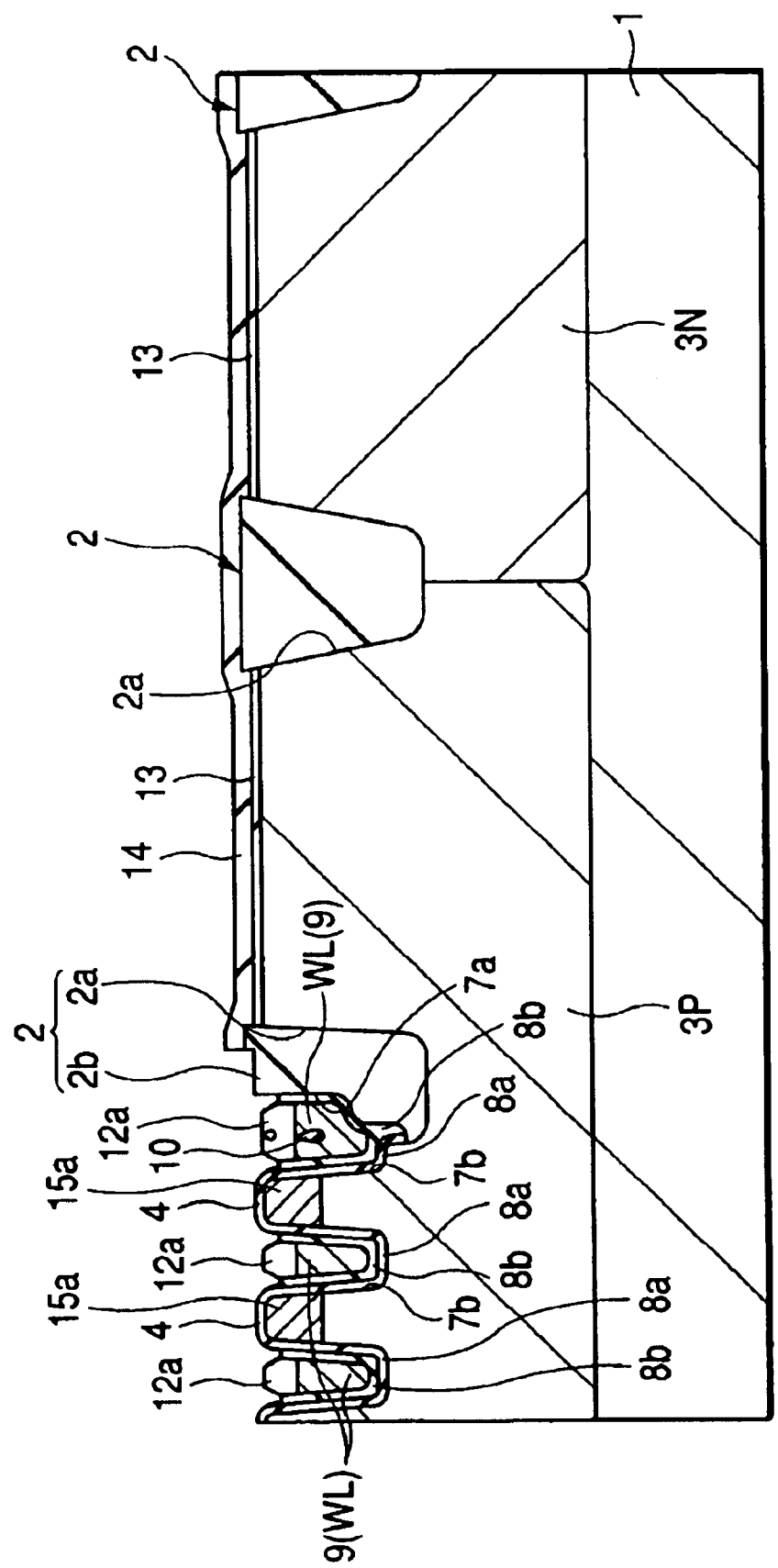
FIG. 23 is a cross-sectional view of the main part of a semiconductor integrated circuit device during processing subsequent to that of FIG. 21.

Next, impurities for adjusting the threshold voltage of MIS.FETs of an ordinary gate electrode structure, which is not a buried gate electrode type, are selectively introduced to the semiconductor substrate 1 using a resist film as a mask. At this time, for example, boron is introduced to the nMIS forming regions while, for example, phosphorous is introduced to the pMIS forming regions. Then, after removing the resist film which has been used at the time of impurity introduction for threshold voltage adjustment, the regions for forming buried gate electrodes 9 (word lines WL) in the main surface of the semiconductor substrate 1 are covered with a resist film. After that, the oxide film on the main surface of the semiconductor substrate 1 is removed by using hydrofluoric acid, buffered hydrofluoric acid, or the like, and then a gate oxidization process is applied to the semiconductor substrate 1 after the resist film is removed. Thereby, as shown in FIG. 23, a gate insulating film 13 is formed on the MIS.FET forming regions (regions for forming both nMIS and pMISI) of an ordinary gate electrode structure on the main surface of the semiconductor substrate 1.

Next, after depositing an insulating film 14 made of, for example, silicon oxide, on the main surface of the semiconductor substrate 1 through a CVD method, or the like, this is patterned so that the regions for forming word lines WL (buried gate electrodes 9) are exposed and other regions are covered through a photolithographic technology and a dry etching technology. Then, impurities for sources and drains of MISFETs of the buried gate electrode structure are introduced in the semiconductor substrate 1 using the insulating film 14 as a mask. Here, for example, phosphorous is introduced at 20 keV in approximately $2 \times 10^{13}/cm^2$. Thereby, low concentration regions (second semiconductor regions) 15a, in which the impurity concentration is relatively low, are formed within the semiconductor regions for sources and drains. And, after that, the insulating film 14 is removed by hydrofluoric acid, or the like.

Figure 24:
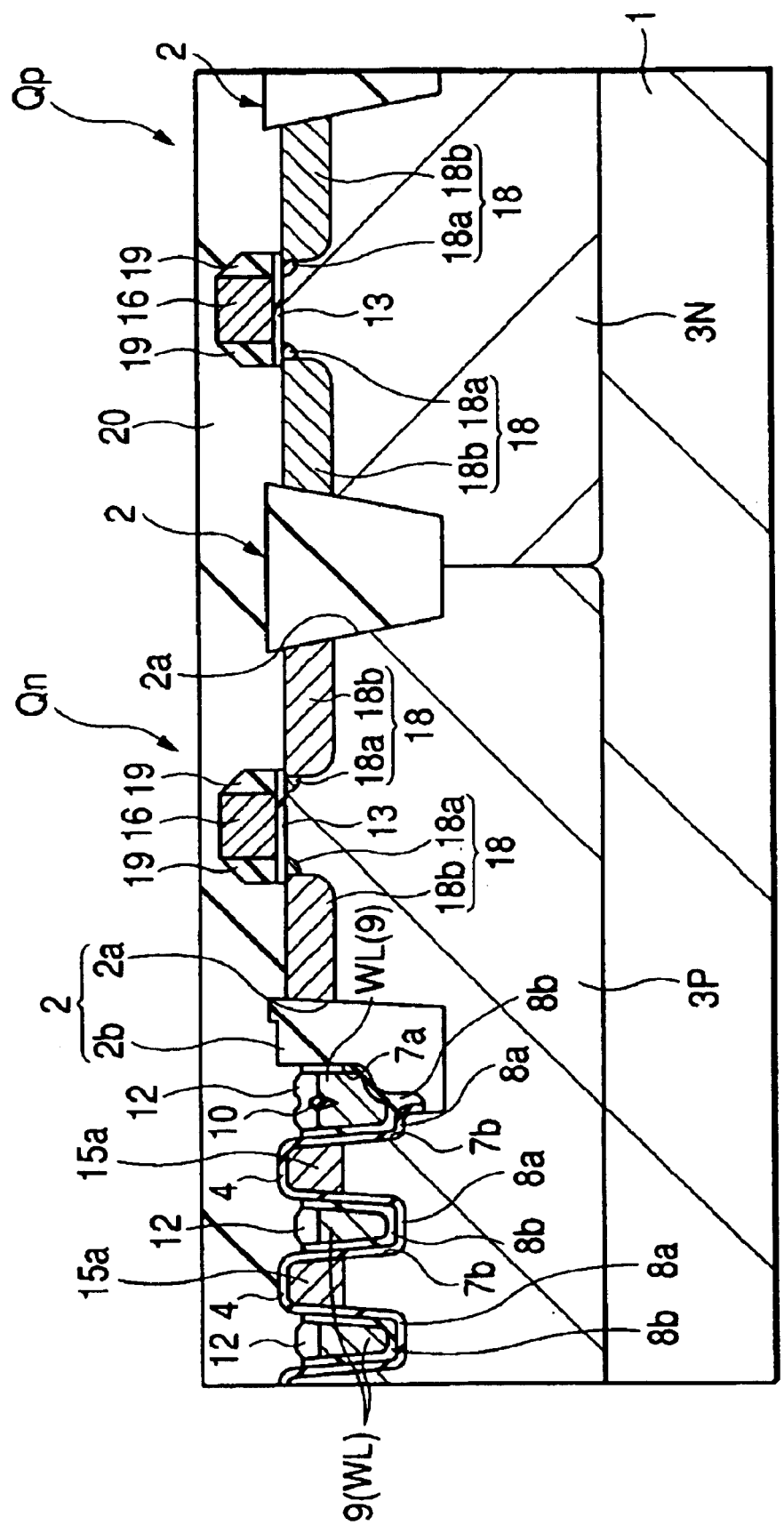
FIG. 24 is a cross-sectional view of the main part of a semiconductor integrated circuit device during processing subsequent to that of FIG. 23.

Next, after depositing a gate electrode forming film 16a made of, for example, amorphous silicon on the main surface of the semiconductor substrate 1 through a CVD method, or the like, n-type gate regions and p-type gate regions are formed by implanting ions using a resist film as a mask. Then, after removing the resist film, annealing is carried out in order to activate the impurities. After that, the gate electrode forming film 16a is patterned through a photolithographic technology and a dry etching technology so as to form ordinary gate electrodes 16, as shown in FIG. 24. After that, low concentration regions 17a and 18a are formed in a self-aligned manner with respect to the gate electrodes 16 by using the resist film as a mask and by introducing impurities for forming low concentration regions, in which the impurity concentration is relatively low, through an ion implantation method, or the like, within the semiconductor regions for sources and drains of an ordinary gate electrode structure in the semiconductor substrate 1. Here, for nMIS and for pMIS the above impurities are separately implanted by using separate resist films as masks. In nMIS forming regions, for example, phosphorous or arsenic are introduced while in pMIS forming regions, for example, boron is introduced.

Next, after depositing an insulating film made of, for example, silicon oxide through a CVD method, or the like, so as to cover the surface of the gate electrodes 16 on the main surface of the semiconductor substrate 1, by etching back the above through an anisotropic dry etching method, side walls 19 are formed on the side surfaces of the gate electrodes 16. Then, impurities for forming high concentration regions, in which the impurity concentration is relatively high, are introduced through an ion implantation method, or the like, within the semiconductor regions for sources and drains of the MIS.FET of an ordinary gate electrode structure in the semiconductor substrate 1 by using the gate electrodes 16 and the side walls 19, as a mask and, therefore, high concentration regions 17b and 18b are formed in a self-aligned manner with respect to the gate electrodes 16. Here, for nMIS and for pMIS the above impurities are separately implanted by using separate resist films as masks. In nMIS forming regions, for example, phosphorous or arsenic are introduced while in pMIS forming regions, for example, boron is introduced. In this way, semiconductor regions 17 and 18 for the sources and drains of nMISQn and pMISQp are formed in the peripheral circuit region.

Figure 25:
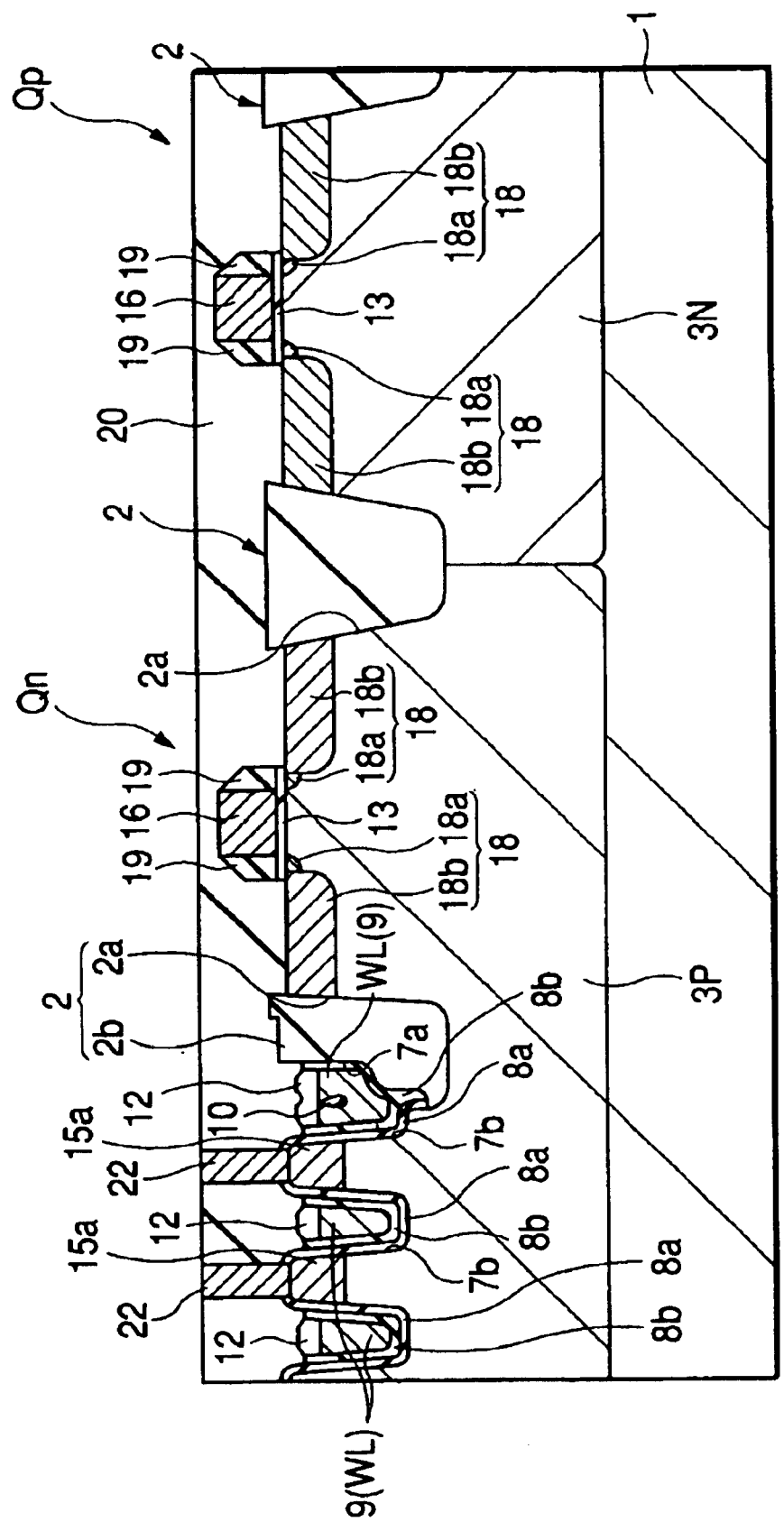
FIG. 25 is a cross section view of the main part of a semiconductor integrated circuit device during processing subsequent to that of FIG. 24.
Figure 26:
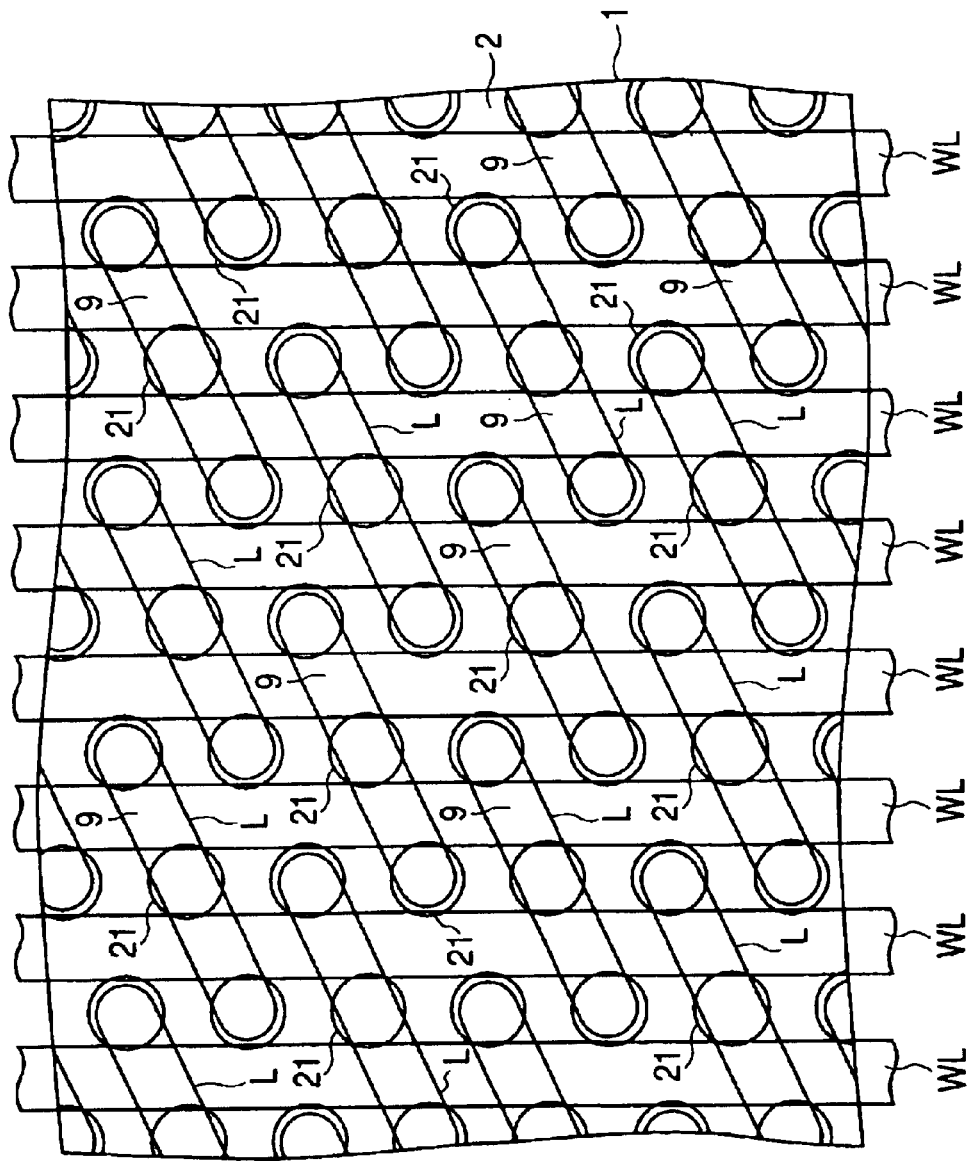
FIG. 26 is a plan view of the main part of the memory cell region in FIG. 25.
Figure 27:
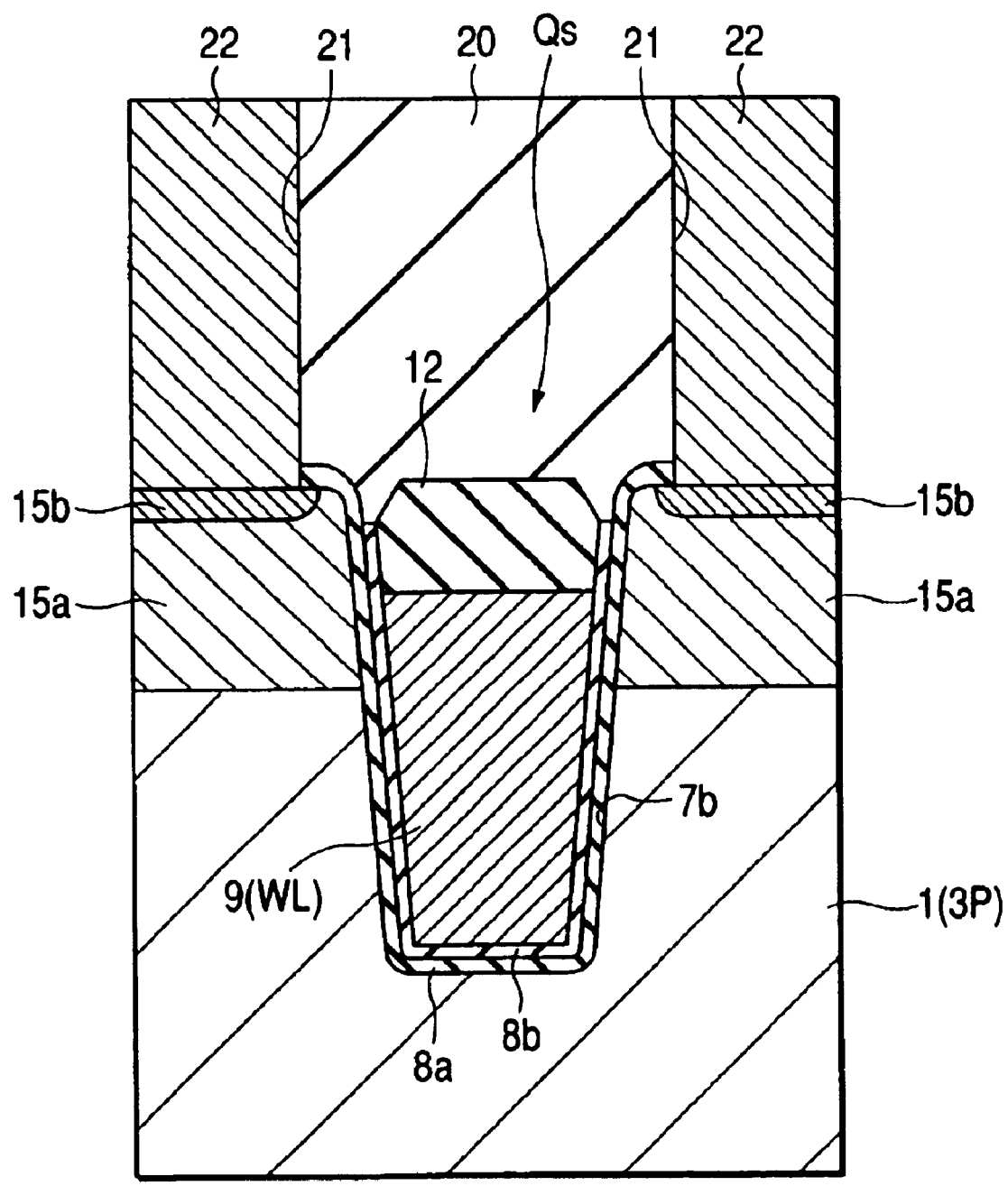
FIG. 27 is an enlarged cross-sectional view of the main part of a memory cell region of FIG. 25.

Next, after depositing an insulating film 20 made of silicon oxide having a thickness of, for example, approximately 100 nm on the main surface of the semiconductor substrate 1, the top surface is made flat by polishing the above through a CMP method. Then, as shown in FIGS. 25 and 26, contact holes 21 are formed in the insulating film 20 so as to expose the semiconductor regions (low concentration regions 15a) for the sources and drains of the MIS.FET (MIS.FET for memory cell selection of a buried gate electrode structures. FIG. 26 shows a plan view of the main part of the memory cell region in the step of FIG. 25. The contact holes 21 are formed, for example, in a plane circular form and are arranged at positions overlapping the active regions L in a plane between word lines WL (gate electrodes 9) neighboring each other. That is to say, the contact holes 21 are arranged so as to overlap on both ends and in the center of the active regions L in a plane manner. After that, a polycrystal silicon to which, for example, phosphorous is doped, is deposited on the semiconductor substrate 1 and, after that, an annealing treatment is carried out for activating the impurities. At this time, impurities, (phosphorous) are diffused into the semiconductor substrate 1 from the plug 22, and, thereby, high concentration regions are formed in the semiconductor regions for sources and drains of a MIS.FET having a buried gate structure. After that, the polycrystal silicon film is polished through a CMP method, or the like, so as to leave only the portion within the contact holes 21, and, thereby, plugs 22 are formed within the contact holes 21. FIG. 27 shows an enlarged view of a MIS.FET (MIS.FETQs for memory cell selection) part of a buried gate electrode structure in the semiconductor substrate 1 after the above step. The source and drain regions of MIS.FETQs for memory cell selection have low concentration regions 15a and high concentration regions 15b formed in the upper part thereof. The borders between the low concentration regions 15a and the p well 3P are formed at positions deeper than the top surface of the gate electrodes 9 (word lines WL) of a buried type. In addition, the borders between the high concentration regions 15b and the low concentration regions 15a are formed at positions shallower than the top surface of the gate electrodes 9 (word lines WL) of a buried type. These high concentration regions 15b are formed through the diffusion of impurities from the plugs 22. Capacitor elements for information storage are electrically connected to one type of plug 22 (that is to say, high concentration regions 15b) while bit lines are electrically connected to the other type of plug 22 (that is to say, high concentration regions 15b).

Figure 28:
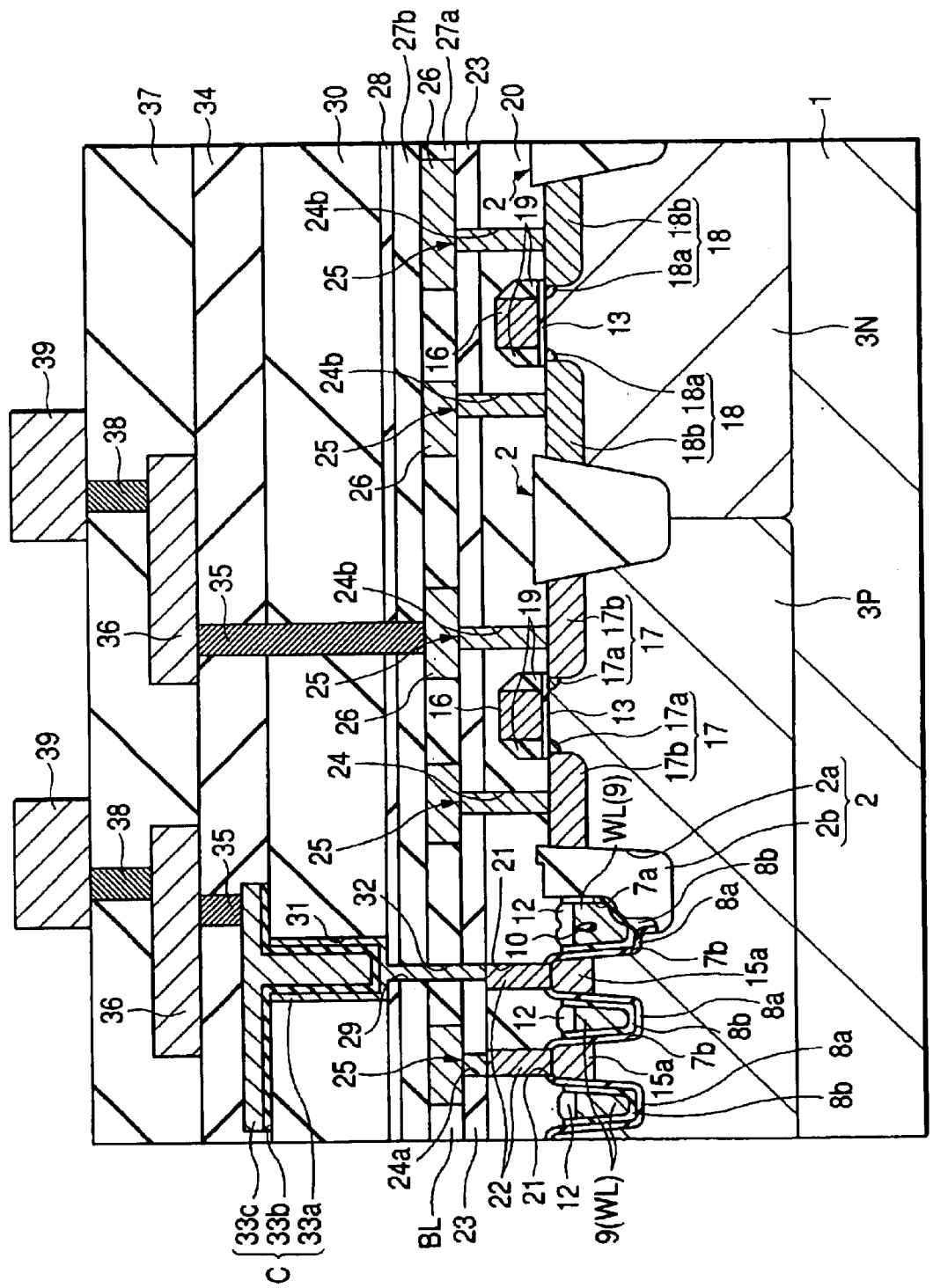
FIG. 28 is a cross-sectional view of the main part of a semiconductor integrated circuit device during processing subsequent to that of FIGS. 25 to 27.
Figure 29:
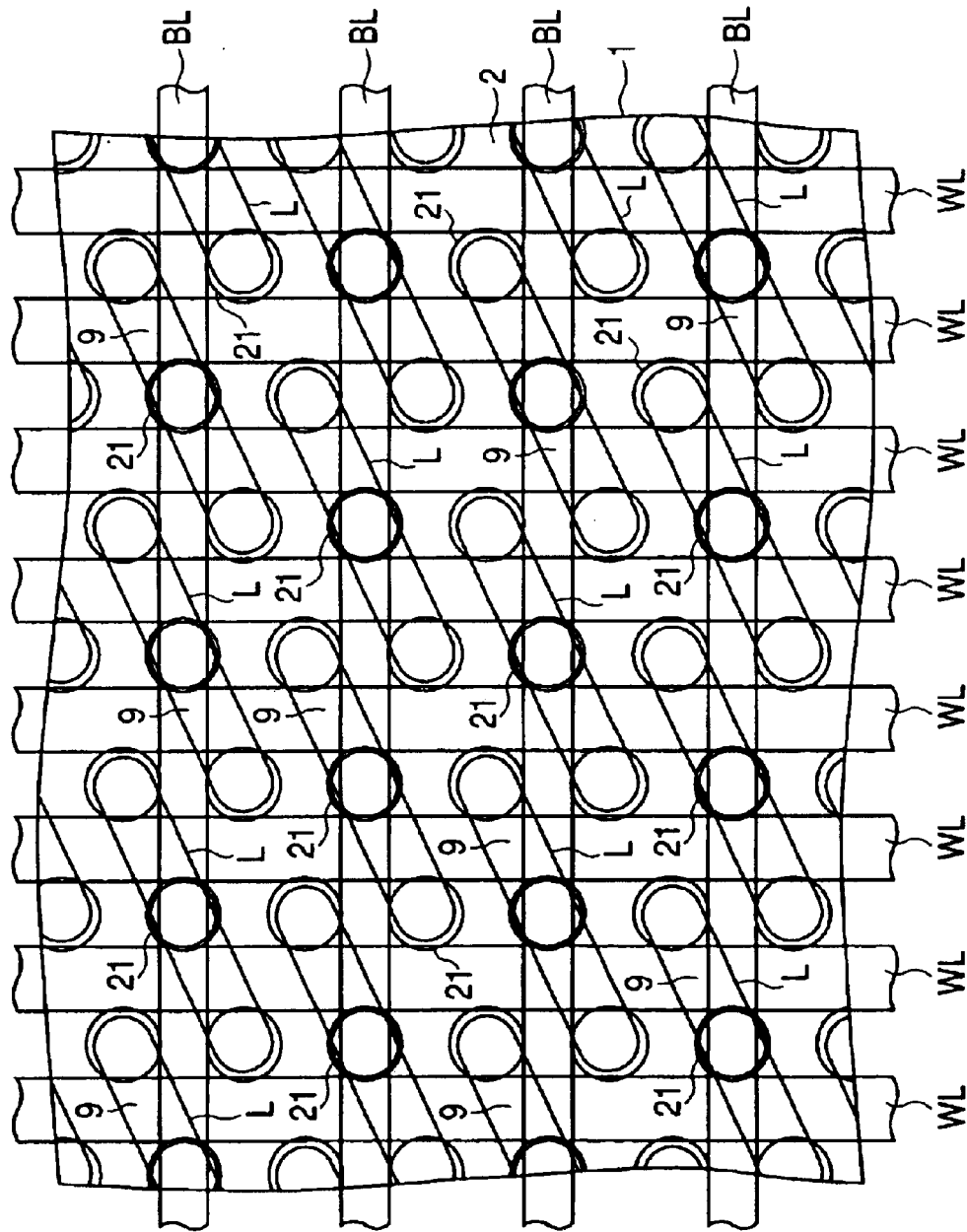
FIG. 29 is a plan view of the main part of a memory cell region of a semiconductor integrated circuit device during processing subsequent to that of FIG. 25.
Figure 30:
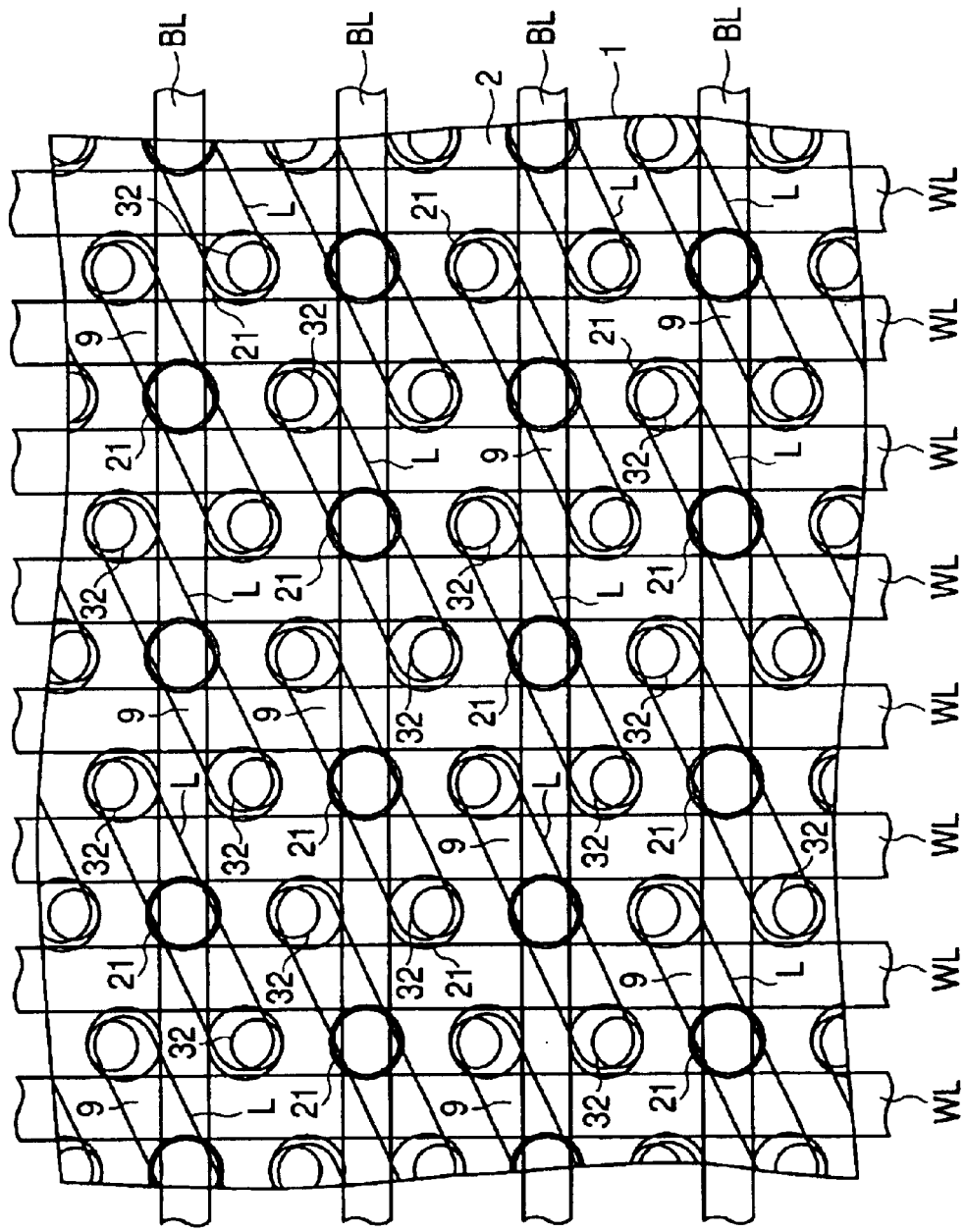
FIG. 30 is a plan view of the main part of a memory cell region of a semiconductor integrated circuit device during processing subsequent FIG. 25.

Next, as shown in FIG. 28, an insulating film 23 made of, for example, silicon oxide is deposited on the semiconductor substrate 1 through a CVD method, or the like, of which the top surface is then made flat through a CMP method, or the like, and, after that, through holes 24a, which expose the top surfaces of the plugs 22, are formed in the insulating film 23, and contact holes 24b which expose the semiconductor regions 17 and 18 for the sources and drains of nMISQn and pMISQp in the peripheral circuit region are formed in the insulating films 23 and 20. Then, for example, titanium and titanium nitride are deposited on the semiconductor substrate 1 in this order from the lower layer through a sputtering method, a CVD method, or the like, and, after that, tungsten, or the like, is deposited through a CVD method, or the like. Titanium and titanium nitride have functions as a barrier film for preventing tungsten and silicon from reacting during the heat treatment in the following capacitor formation steps. After that, the plug 25 is formed in through holes 24a and contact holes 24b by polishing a layered film, such as titanium, titanium nitride and tungsten, through a CMP method, or the like. At this time, the insulating film 23 functions as a stopper. After that, an insulating film 27a made of, for example, silicon oxide is formed on the insulating film 23, and, after that, trenches for forming wires are formed in the former film. Then, on top of this, a conductive film, such as tungsten, is deposited through a sputtering method, or the like, and, after that, by polishing the above through a CMP method, or the like, bit lines BL and the first layer wires 26 of a buried type are formed. Here, a plan view of the main part of the memory cell region at this stage is shown in FIG. 29. The bit lines BL extend in the direction perpendicular to the word lines WL in a plane manner and are arranged so as to overlap the contact holes 21 in the middle of the active regions L in a plane manner.

Next, As shown in FIG. 28, after depositing an insulating film 27b made of, for example, silicon oxide on the semiconductor substrate 1 through a CVD method, or the like, an insulating film 28 made of, for example, silicon nitride is further deposited thereon. Then, through holes 29 for connecting the lower electrodes of the capacitors and plug 22 are formed in the insulating film 28, and, after that, an insulating film 30 made of, for example, silicon oxide is deposited on the insulating film 28 through a CVD method, or the like. After that, capacitor holes 31 are created in the insulating film 30. At this time, by carrying out etching under the condition that silicon oxide has a higher etching rate than silicon nitride, the insulating films 23 and 27, which are exposed from the through holes 29 at the capacitor holes 31, are removed through etching using the insulating film 28 as a mask, and, thereby, through holes 32 which expose the top surfaces of the plugs 22 are formed.

Next, as shown in FIG. 28, capacitor elements C for information storage are formed by forming lower electrodes 33a, capacitor insulating film 33b and upper electrodes 33c. The lower electrodes 33a are made of a low resistance polycrystal silicon film to which, for example, P (phosphorous) is doped, and they are electrically connected to the plugs 22 through the through holes 32. The capacitor insulating film 33b is, for example, made of a layered film of a silicon oxide and a silicon nitride film or tantalum oxide ($Ta_2O_5$) while the upper electrodes 33c are, for example, made of titanium nitride. Next, an insulating film 34 made of, for example, silicon oxide is deposited on the insulating film 30 through a CVD method, or the like, and, after that, plugs 35 which are connected to the upper electrodes 33c and the first layer wires 26 in the peripheral circuit region are formed in the same way as the above described plugs 25 (same method and same materials); and, in addition, the second layer wires 36 are formed on the insulating film 34 in the same way as the first layer wires 26. Here, for example, aluminum or aluminum alloy can be used as the material for the second layer wires 36. The second layer wires 36 are electrically connected to the upper electrodes 33c and the first layer wires 26 through the plugs 35. After that, an insulating film 37 made of, for example, silicon oxide is deposited on the insulating film 34 through a CVD method, or the like, and, after that, plugs 38 which are connected to the second layer wires 36 are formed in the same way as the above described plugs 25 (same method and materials), and, in addition, the third layer wires 39 are formed on the insulating film 37 in the same way as the second layer wires 36. The materials for the third layer wires 39 are the same as those for the second layer wires 36. The second layer wires 39 are electrically connected to the second layer wires 36 through the plugs 38.

Figure 31:
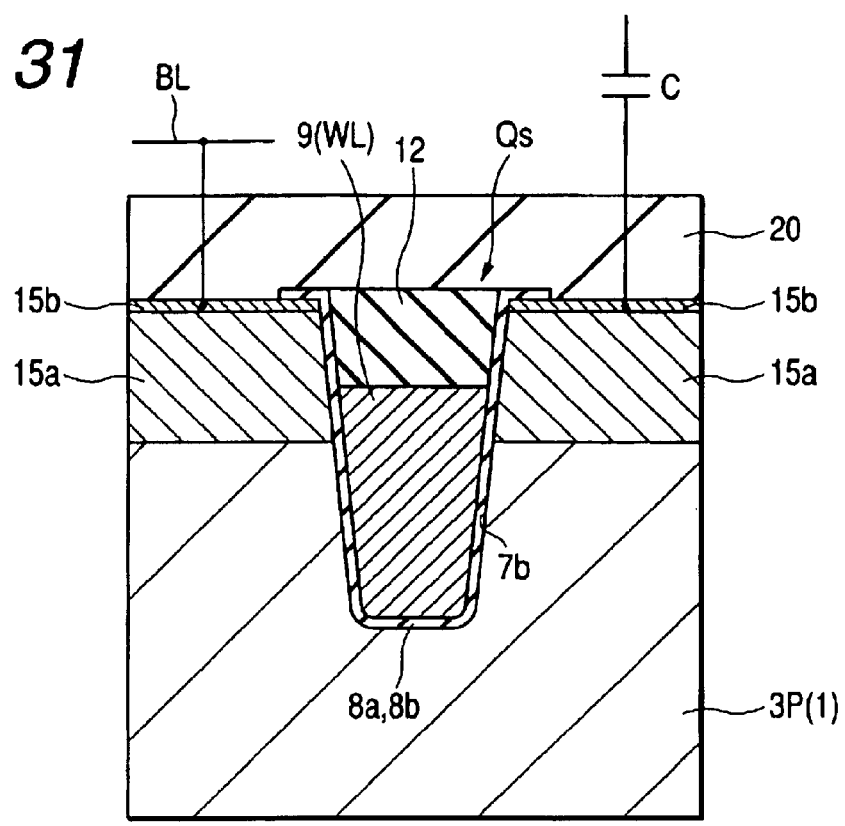
FIG. 31 is a sectional diagram schematically illustrating the structure of buried gate electrode parts of a semiconductor integrated circuit device according to one embodiment of the present invention.

Next, operations and working effects of the semiconductor integrated circuit device according to the present Embodiment 1 will be described. FIG. 31 is an exemplary view schematically showing the cross section of MIS.FETQs for memory cell selection in the semiconductor integrated circuit device according to the present Embodiment 1. First, since the present Embodiment 1 has a structure where gate electrodes 9 (word lines WL) are buried in the semiconductor substrate 1 so that the effective channel length can be made longer, the impurity concentration of the semiconductor substrate 1 can be lowered. Thereby, the junction electric field intensity in the sources and drains can be made smaller. In addition, the capacitance between the plugs 22, to which the bit lines BL and lower electrodes 33a are connected, and word lines WL (gate electrodes 9) can be lowered so that it becomes possible to increase the transmission rate of signals.

Figure 32:
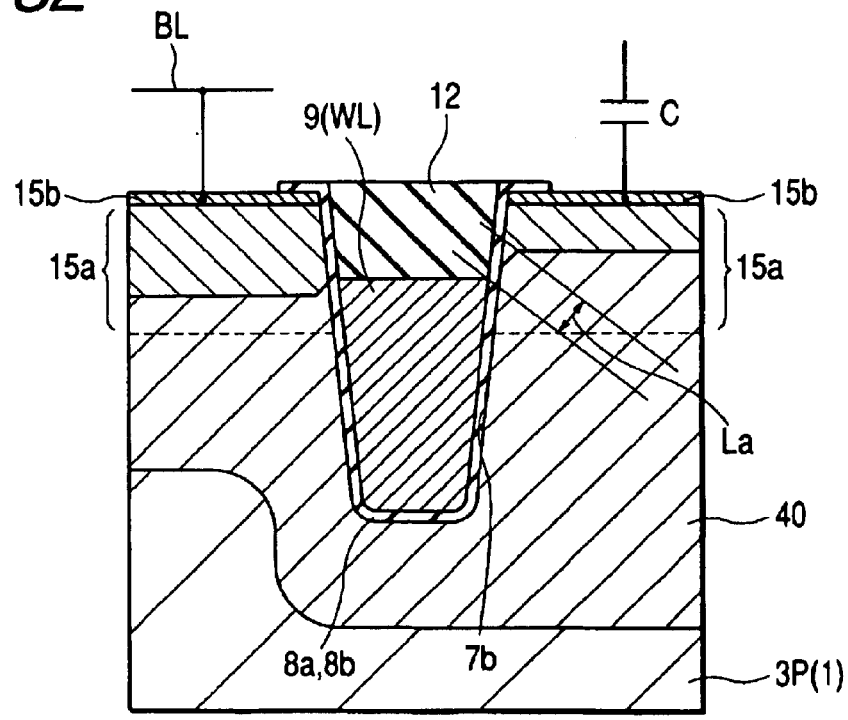
FIG. 32 is a sectional diagram schematically illustrating the structure of buried gate electrode parts of a semiconductor integrated circuit device according to one embodiment of the present invention.
Figure 33A:
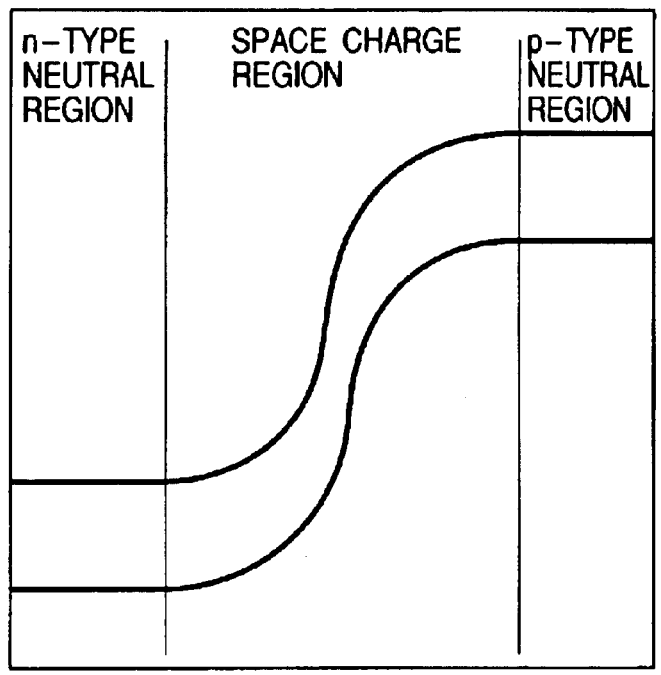
FIGS. 33(a) and 33(b) are diagrams illustrating the effect of the potential of the gate electrodes on depletion layer space charges in field effect transistors of an ordinary gate electrode structure.
Figure 33B:
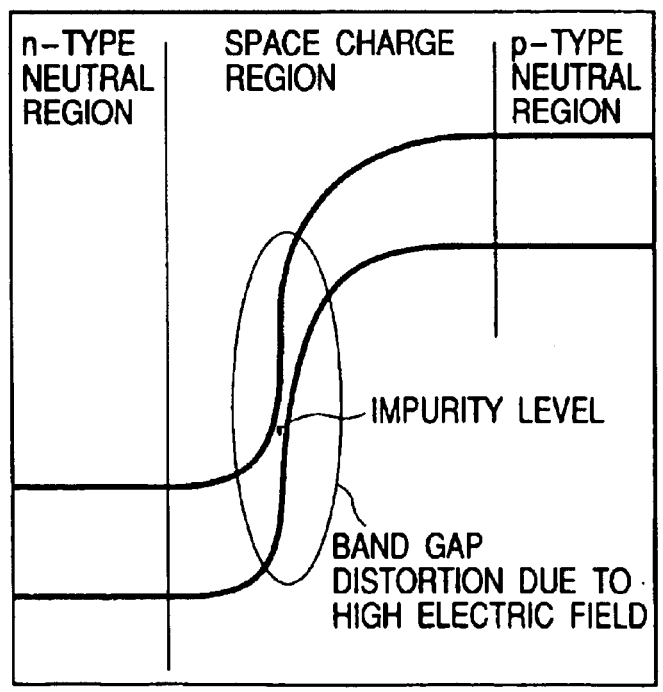

In addition, the electric field intensity of pn junctions in the source and drain regions of MIS.FETQs for memory cell selection, at the time when switched off (for example, at the time when the gate voltage is 0V), can be reduced. The electric field intensity of the pn junctions in the source and drain regions have factors determined by the impurities and factors determined by the radius of curvature at the pn junction edges. In the case of a buried gate electrode structure, as shown in FIG. 32, the pn junction edges in the source and drain regions are overlapped with the gate electrodes 9, that is to say, since the borders between the semiconductor regions 15b and the p well 3P are formed deeper than the top surfaces of the gate electrodes 9, the radius of curvature is quite large or infinite. Correspondingly, the electric field intensity of the pn junctions of the source and drain regions can be reduced. According to the experiments by the present inventors, however, in the case where the distance La between the edge part of the depletion layer 40 at the pn junction part of the source and drain regions, to which a capacitor element C for information storage is connected, and the upper edge part of a gate electrode 9 is too short, the electric field intensity becomes large due to the potential difference between the semiconductor regions 15b, which become sources and drains, and the gate electrodes 9, at the time when it is switched off. For example, FIGS. 33a and 33b are views for describing the influence on the depletion layer space charges by the potential of a gate electrode 9. FIG. 33a shows an ordinary condition. Here, in the case where an edge part of a gate electrode 9 becomes closer to the n-type neutral region (approximately equal to the semiconductor region 15b) under the condition where the potential of a semiconductor region 15b (n region) is higher than the potential of a gate electrode 9 (at the time when the semiconductor region 15b is backward biased and the gate electrodes is not selected (at the time of being switched off)), a distortion occurs in the space charge distribution within the depletion layer which becomes narrower in parts, as shown in FIG. 33b, due to the potential difference between the semiconductor region 15b and the gate electrode 9. A leakage current occurs through band gap parts which have become narrower in the above manner. Especially in the case where an impurity level exists in a distorted part of the band gap, a leakage current easily occurs through a trap assisted tunneling phenomenon. Then, the present Embodiment 1 has a structure wherein the top surfaces of the gate electrodes 9 are lowered to the extent where the effect of the above described distortion in the band gap can be ignored. According to the experimental results obtained by the present inventors, the electric field due to the above described potential difference can be lowered so that the electric field intensity of the pn junctions can be reduced in total by making the top surfaces of the gate electrodes 9 40 nm or more deeper than the main surface of the semiconductor substrate 1 or by making the above described distance La 40 nm or more, though, generally, the above description does not always hold true because other factors may change the case. Here, the thickness of the cap insulating film 12a on the gate electrodes 9 in this structure becomes, for example, 40 nm or more. And, in the case of an ordinary gate electrode structure, though the side walls provided on the side surfaces of the gate electrodes can secure the above described distance La, the film thickness of the side walls is becoming thinner due to miniaturization, in addition to the structure in which the gate electrode edge parts, low concentration regions and high concentration regions are arranged in line along the main surface of the semiconductor substrate 1. In the case of the present Embodiment 1, the high concentration regions 15a for the sources and drains, the low concentration regions 15a and the gate electrode edge parts are arranged along the direction of the thickness of the semiconductor substrate 1, and, therefore, it is possible to scale down the occupied area of the MIS.FETQs for memory cell selection by securing, to a certain degree, the distance La or by making the thickness of the cap insulating film 12a, corresponding to the side walls, thicker, and, therefore, an advantageous structure for a DRAM which requires a higher integration is achieved.

In this way, in the present Embodiment 1, the junction electric field intensity can be reduced in the source and drain regions of the MIS-FETQs for memory cell selection, and, accordingly, the refreshing time can be made longer. Therefore, the charging and discharging cycle at,the time of refreshing can be made longer, and, accordingly, it becomes possible to reduce the power consumption of the DRAM. For example, in the case of the same cell size, the refreshing time can be extended to 300 ms, in comparison with the 100 ms of a memory cell structure (MIS.FET for memory cell selection of an ordinary gate electrode structure) of an asymmetric type DRAM. As a result, the power consumption at the time of waiting can be reduced to approximately 0.5 mA from 1.2 mA in the case of the above asymmetric type.

Next, the effects of an increase in the sub-threshold characteristics (sub-threshold coefficient becomes smaller) through the formation of rounding in the bottom corners within the trenches 7b will be described. The sub-threshold coefficient S is the width of the gate voltage which is required to change the drain current by one digit and can be expressed by $S=\ln 10 \cdot T/q(1+(Cd+Cit)/Cox)$; and, the smaller the value is, the more preferable it is. Here, the depletion layer capacitance is denoted as Cd, the interface level (equivalent capacitance) is denoted as Cit and the gate capacitance is denoted as Cox.

Figure 34:
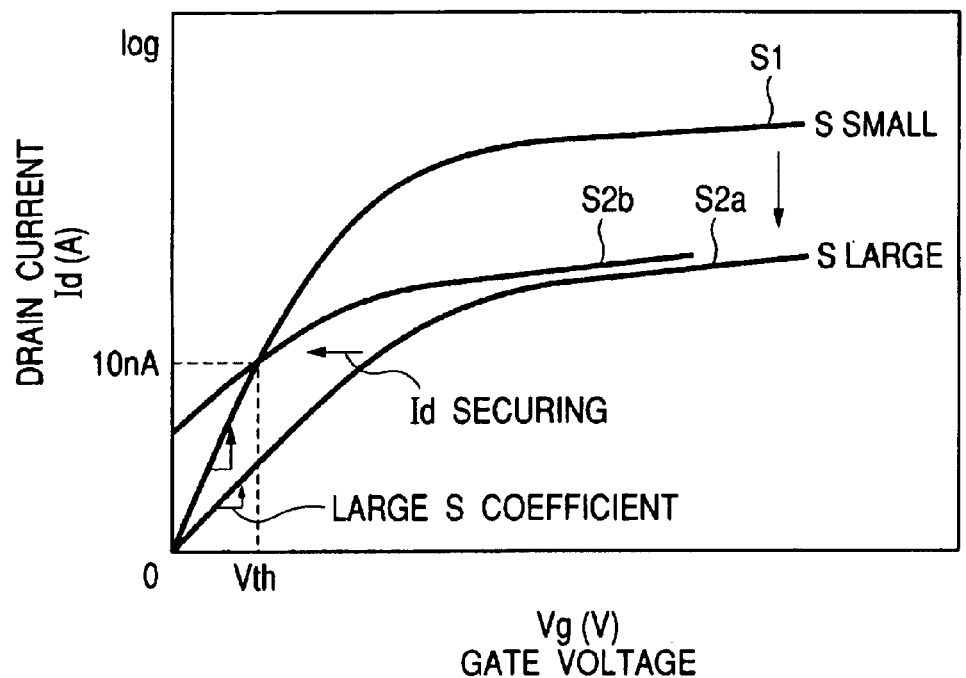
FIG. 34 is a graph showing the relationship between the current characteristics of a field effect transistor and a sub-threshold coefficient.
Figure 35:
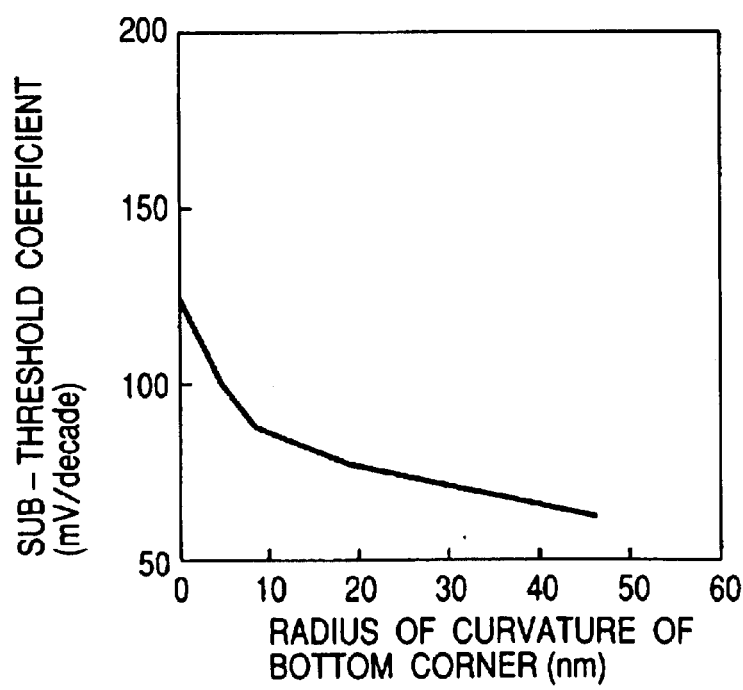
FIG. 35 is a graph showing the relationship between the radius of curvature of the angles of the bottoms inside the trenches obtained by an experiment performed by the present inventors and a sub-threshold coefficient.

In the case that the bottom corners within the trenches 7b do not have rounding, that is to say, the radius of curvature of the bottom corners becomes smaller, the channel resistance increases and the sub-threshold coefficient becomes larger. FIG. 34 shows the relationship between the current characteristics of the MIS.FET and the sub-threshold coefficient. The curve S1 shows the case where the sub-threshold coefficient S is small while the curve S2a and S2b show the cases where the sub-threshold coefficient S is large. The curve S2a where the sub-threshold coefficient S is large converts to the curve S2b which is gained by shifting the curve S2a in the left direction in FIG. 34 when a desired drain current can be gained in the case that the channel implantation, or the like, is reduced for the purpose of gaining drain current Id (for example, 10 nA) at a constant threshold voltage Vth. In this case, however, the transistor becomes a depression type where a leakage current increases at the time when the gate voltage is 0V (at the time of being switched off). That is to say, the power consumption increases. Therefore, in the present Embodiment 1, roundness is given to the bottoms of the trenches 7b. FIG. 35 shows the relationship between the radius of curvature of the bottom corners within the trenches 7b and the sub-threshold coefficient gained by the experiments of the present inventors. According to the experimental results of the present inventors, it is determined to be effective when the radius of curvature is set so that the sub-threshold coefficient has the value smaller than 100. Though the sub-threshold coefficient S changes due to the depletion layer capacitance, the interface level and the gate capacitance, as shown in the above equation, so as not to produce a sweeping generalization, in the case that the radius of curvature is 10 nm or less, the sub-threshold coefficient is too large to have a large ON/OFF current ratio, and in the case that the radius of curvature is made to be 10 nm or more, the sub-threshold coefficient can be made to be 90 mV/decade or less so as to have a large ON/OFF current ratio. Accordingly, the driving performance of the MIS.FETQs for memory cell selection can be improved so that the operation speed (operation speed of writing in or reading out) can be increased. In addition, the sub-threshold coefficient can be made small so as not to increase the leakage current at the time of being switched off and it becomes possible to prevent the power consumption from increasing. Here, the larger the gate capacitance is, the smaller the sub-threshold coefficient becomes. Accordingly, the film thickness of the gate insulating film may be made thinner or materials of high dielectric constant (for example, silicon nitride or tantalum oxide) may be utilized as a material for part of, or all of, the gate insulating film. In addition, the smaller the depletion layer capacitance is, the smaller the sub-threshold coefficient must be. For this purpose, the impurity concentration of the semiconductor substrate 1 is made low or the substrate bias is made deeper (to the negative side) or a structure representing a combination of these may be provided. In the case that the substrate bias is made deeper (directed to the minus), the p well 3P (p well 3P for the memory region) wherein the MIS.FETQs for memory cell selection are formed in the semiconductor substrate 1 is surrounded by the buried n well, which is provided on the bottom and on the sides thereof, so as to gain a structure that is electrically isolated from the p well 3P formed in the peripheral circuit region; and, in this condition, the potential of the p well 3P wherein the MIS.FETQs for memory cell selection are formed may be controlled, that is to say, may be made larger in the direction of minus so as to be in a negative potential. In this case, the contact capacitance between the sources and drains of the MIS.FETQs for memory cell selection and the p well 3P can be reduced. In addition, the lower the interface level density is, the smaller the sub-threshold coefficient becomes.

(Embodiment 2)

In the present Embodiment 2, a variant example of a process for a DRAM according to the above described Embodiment 1 will be described.

Figure 36:
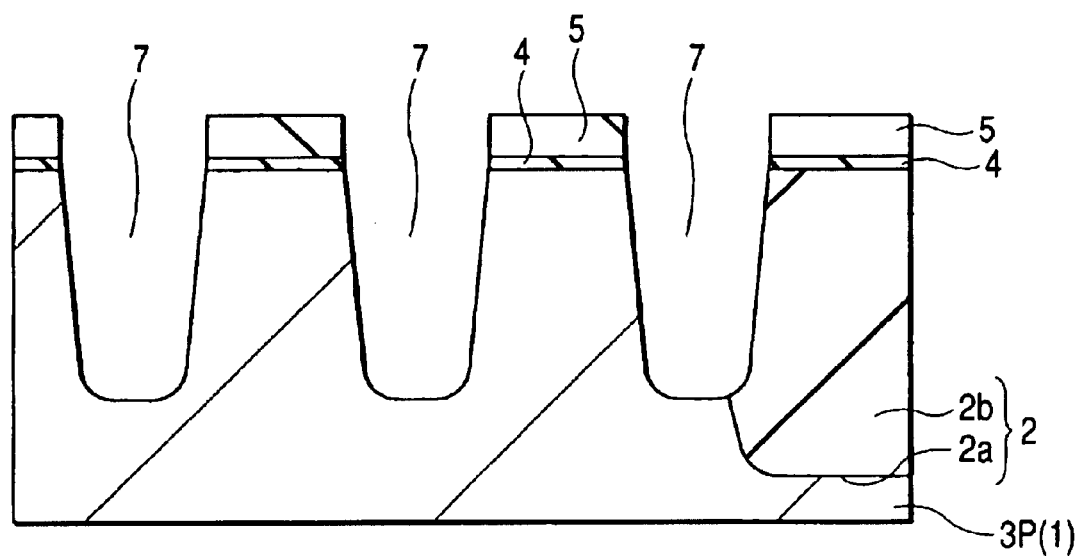
FIG. 36 is a cross-sectional view of the main part of a semiconductor integrated circuit device during processing according to another embodiment of the present invention.

First, as shown in FIG. 36, in the same way as in the above described Embodiment 1, insulating films 4 and 5 are formed on the semiconductor substrate 1, and, after that, using these as a mask, trenches 7, of which the depth is, for example, approximately 230 nm to 250 nm is formed, in the semiconductor substrate 1. The formation of these trenches 7 is carried out through the above-described two step etching process. That is to say, by changing the dry etching conditions at the time of trench processing, corner parts within the trenches 7, of which the plane dimension is small, are removed so as to perform rounding to make the radius of curvature of the corners formed between the inner surfaces and the bottoms of the trenches 7 approximately, for example, 40 nm. In the present Embodiment 2, trenches 7 of approximately the same depth as above are formed, at the same time, in the border parts between the semiconductor substrate 1 and the isolation parts 2.

Figure 37:
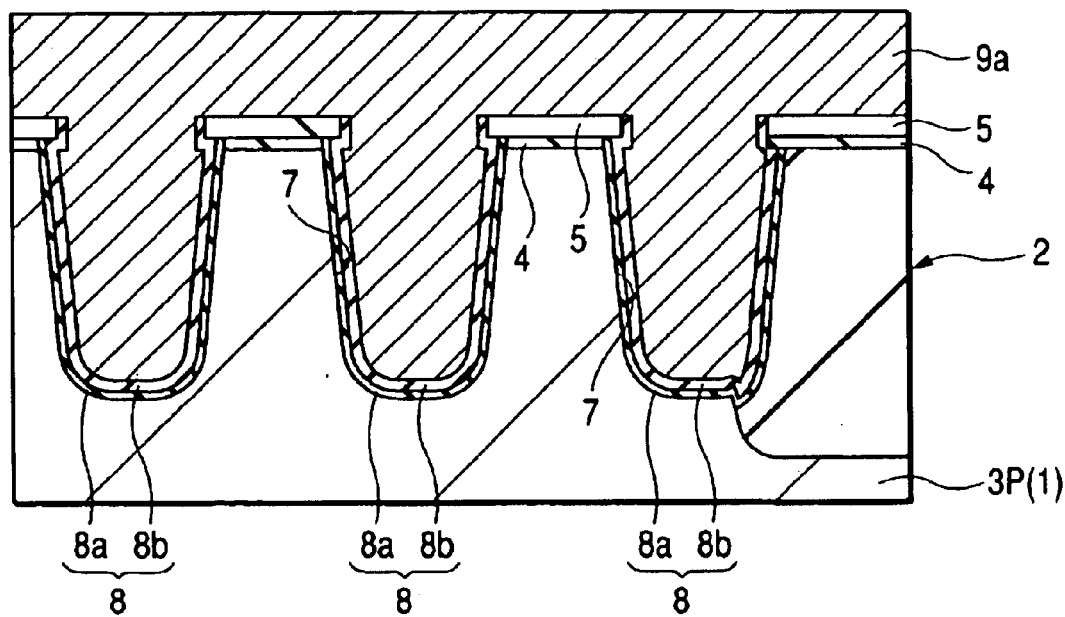
FIG. 37 is a cross-sectional view of the main part of a semiconductor integrated circuit device during processing subsequent to that of FIG. 36.
Figure 38:
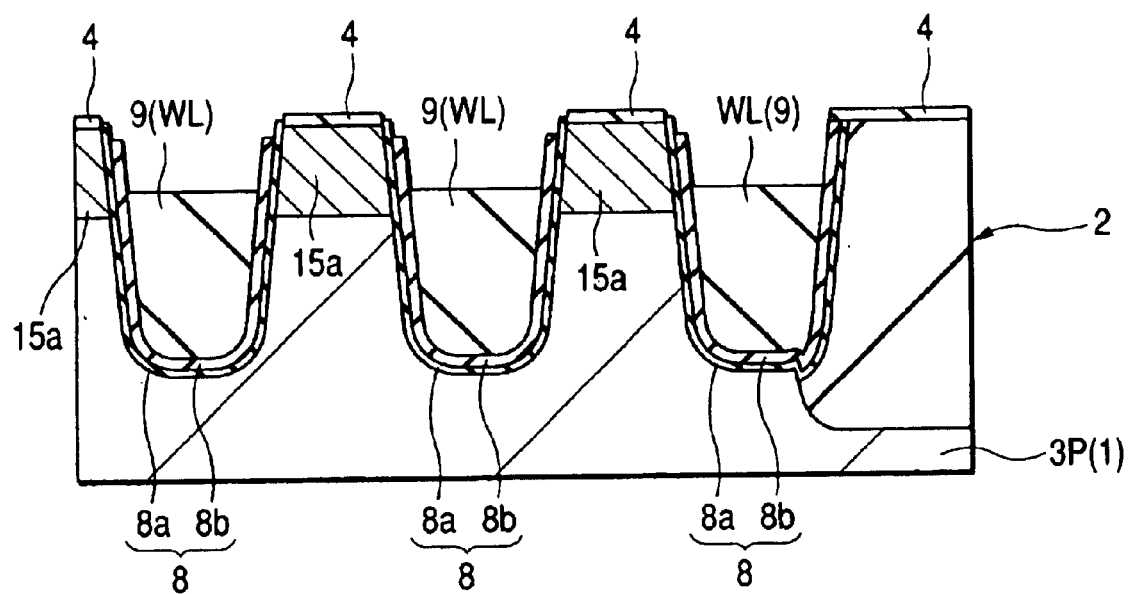
FIG. 38 is a cross-sectional view of the main part of a semiconductor integrated circuit device during processing subsequent to that of FIG. 37.

Then, after carrying out a sacrificial oxidation process and a sacrificial oxide film removal process, in the same way as in the above-described Embodiment 1, as shown in FIG. 37, a gate insulating film 8a made of a silicon oxide film of, for example, the thickness of approximately 4 nm, through a thermal oxidation method; and, after that, a gate insulating film 8b made of silicon nitride of, for example, the thickness of approximately 8 nm, is deposited thereon through a CVD method. After that, a gate electrode forming film 9a made of tungsten, or the like, of, for example, the thickness of approximately 70 nm is deposited on the semiconductor substrate 1; and, after that, this is etched back through a dry etching method. After that, the insulating film 5 is removed through etching. Thereby, as shown in FIG. 38, gate electrodes 9 are formed only within the trenches 7. At this time, the top surfaces of the gate electrodes 9 are lower than the top surface of the semiconductor substrate 1. Here, in the same way as in the above-described Embodiment 1, the depth from the main surface of the semiconductor substrate 1 to the top surface of the gate electrodes 9 within the trenches 7 is, for example, approximately 70 nm. After that, low concentration regions 15a, of which the impurity concentration is relatively low, are formed within the semiconductor regions for the sources and drains of MIS.FETs for memory cell selection in the semiconductor substrate 1.

Figure 39:
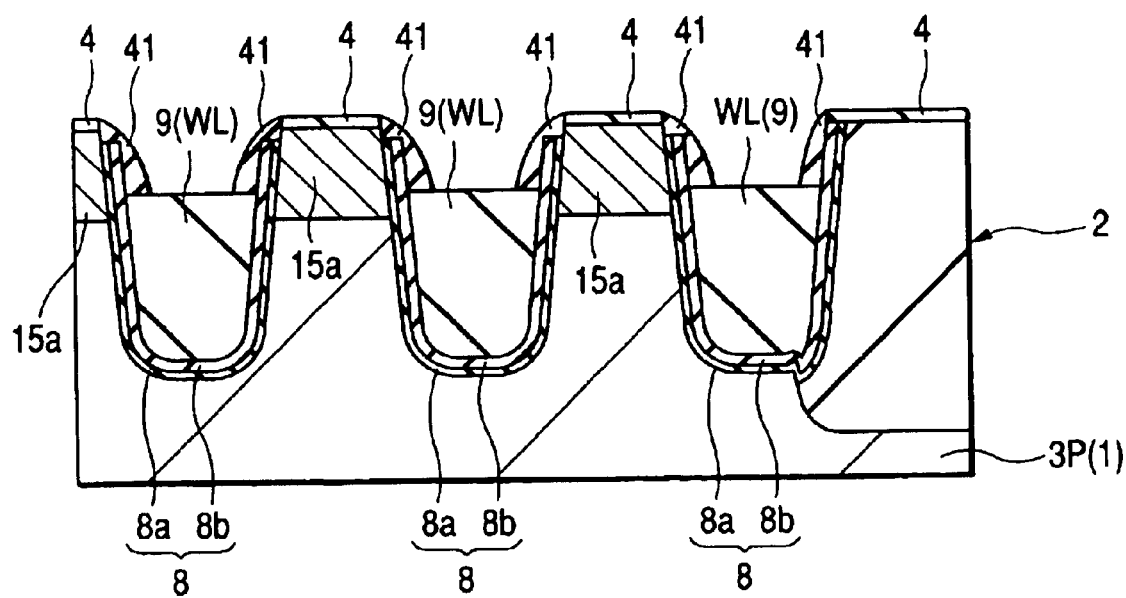
FIG. 39 is a cross-sectional view of the main part of a semiconductor integrated circuit device during processing subsequent to that of FIG. 38.
Figure 40:
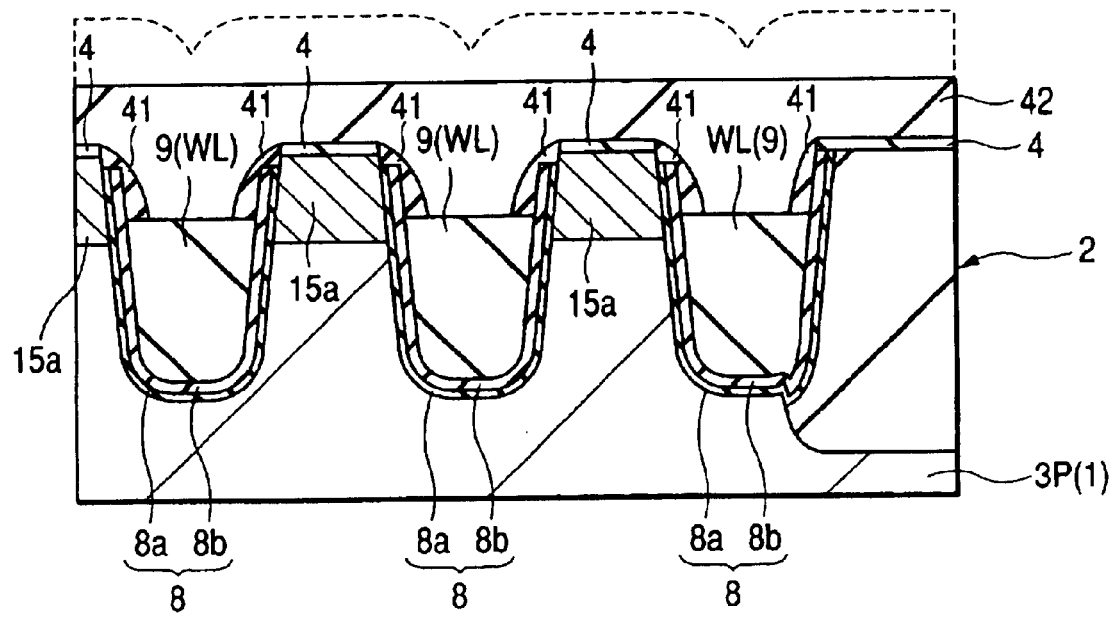
FIG. 40 is a cross-sectional view of the main part a semiconductor integrated circuit device during processing subsequent to that of FIG. 39.

Next, after depositing an insulating film made of silicon nitride of, for example, the thickness of approximately 20 nm, on the semiconductor substrate 1 through a CVD method, or the like, this is etched back through a dry etching method so as to form, as shown in FIG. 39, side walls 41 on the upper parts (side surfaces between the top surfaces of the gate electrodes 9 and the aperture parts of the trenches 7) of the inner surfaces of the trenches 7. Those side walls 41 are for controlling or preventing the peeling of the gate insulating film 8a. Then, as shown in FIG. 40, after depositing an insulating film 42 made of silicon nitride of, for example, approximately 150 nm on the main surface of the semiconductor substrate 1 through a CVD method, or the like, by polishing and reducing this by, for example, approximately 80 nm through a CMP method, or the like, the top surface of the insulating film 42 is made flat. Then, the parts of this insulating film 42 which are deposited on the peripheral circuit region, as described in the above Embodiment 1, are removed through a photolithographic technology and a dry etching technology. Accordingly, the insulating film 42 is formed on the main surface of the semiconductor substrate 1 so as to cover the memory cell region. In addition, part of the insulating film 42 is filled in the upper parts within the trenches 7 so as to have the same functions as a cap insulating film.

Figure 41:
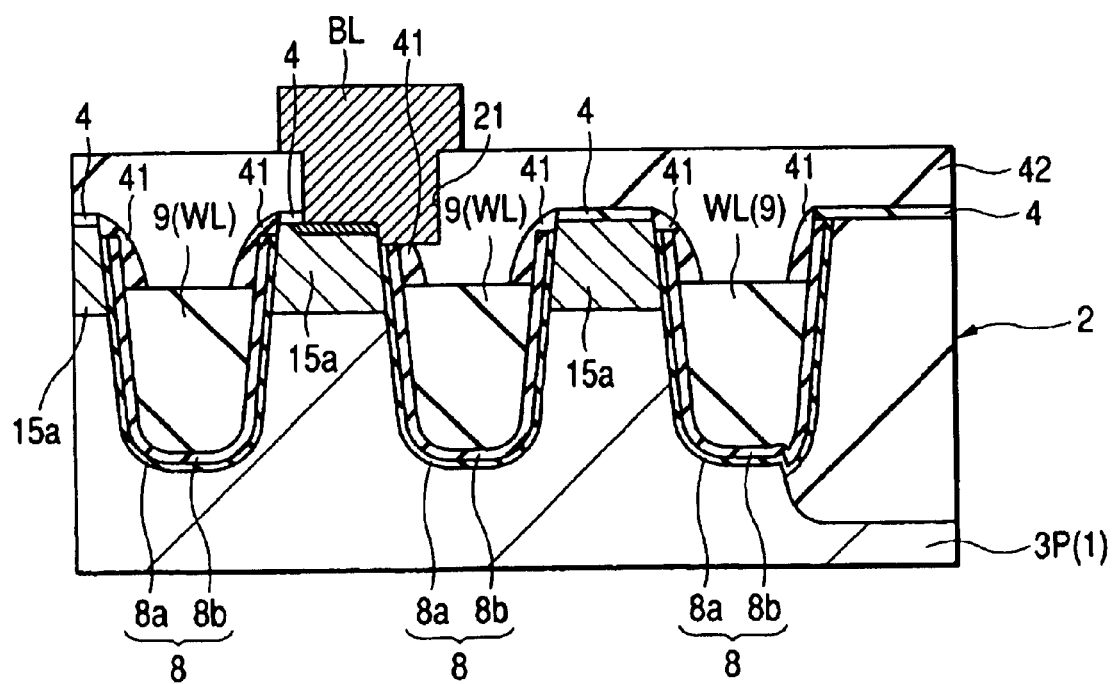
FIG. 41 is a cross-sectional view of the main part of a semiconductor integrated circuit device during processing subsequent to that of FIG. 40.

Next, after forming nMISQn and pMISQp in the peripheral circuit region in the same way as in the above-described Embodiment 1, as shown in FIG. 41, contact holes 21 are formed in the insulating film 42 so as to expose the parts of the low concentration regions 15a for the sources and drains of the MIS.FETs for memory cell selection through a dry etching method, or the like. At this time, in the present Embodiment 2, the etching is carried out under the condition where the etching rate for silicon nitride is faster than that for silicon oxide. Thereby, it becomes possible to control or prevent the upper parts of the isolation parts 2 from being shaved through etching even in the case where over-etching takes place under the condition where, for example, the isolation parts 2 (an isolation film 2b made of silicon oxide, or the like) are exposed from the bottoms of the contact holes 21. Then, by ion implantation of, for example, phosphorous through the contact holes 21, high concentration regions 15a are formed in the upper parts (upper parts of the low concentration regions 15a) in the semiconductor substrate 1. After that, a conductive film, such as tungsten, or the like, is deposited on the semiconductor substrate 1, and, after that, bit lines BL are formed by patterning the above conductive film. The following steps are the same as in the above described Embodiment 1, and, therefore, a repeat of the description thereof will be omitted.

In the present Embodiment 2, it becomes possible to gain the following effects in addition to the effects gained in the above described Embodiment 1.

That is to say, at the time of formation of contact holes 21 in the insulating film 42 through a dry etching method, or the like, by carrying out the etching under a condition where the etching rate of silicon nitride is faster than that for silicon oxide, it becomes possible to control or prevent the upper parts of the isolation parts 2 from being shaved through the etching even in the case where over-etching takes place under a condition where, for example, the isolation parts 2 are exposed from the bottoms of the contact holes 21. Accordingly, it becomes possible to increase the reliability and yield of the MIS-FETs for memory cell selection.

(Embodiment 3)

In the present Embodiment 3, a variant example of a process for a DRAM according to the above-described Embodiments 1 or 2 will be described.

Figure 42:
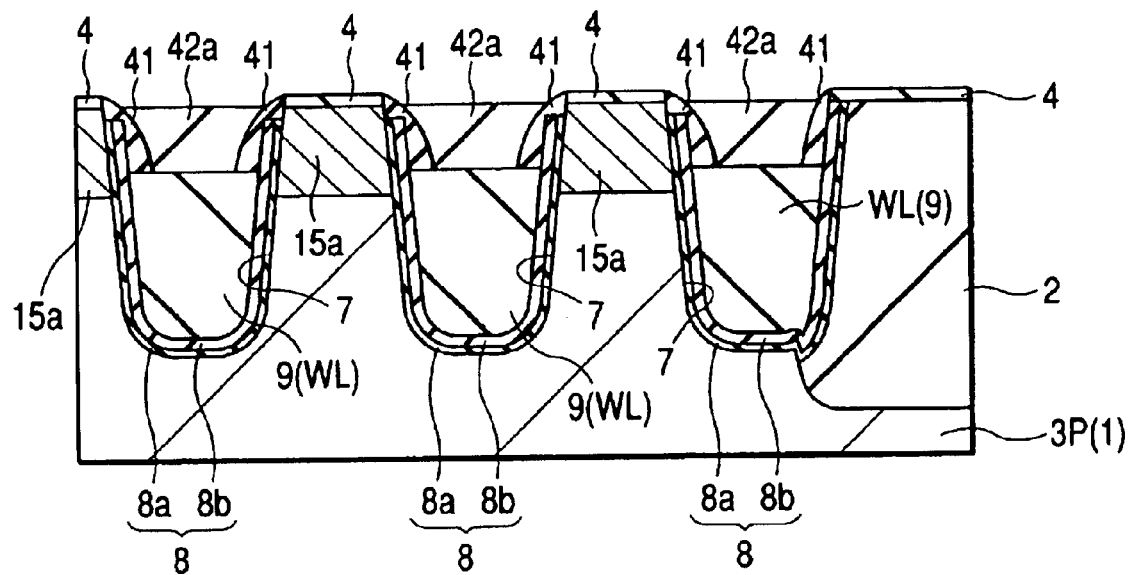
FIG. 42 is a cross-sectional view of the main part of a semiconductor integrated circuit device during processing according to another embodiment of the present invention.
Figure 43:
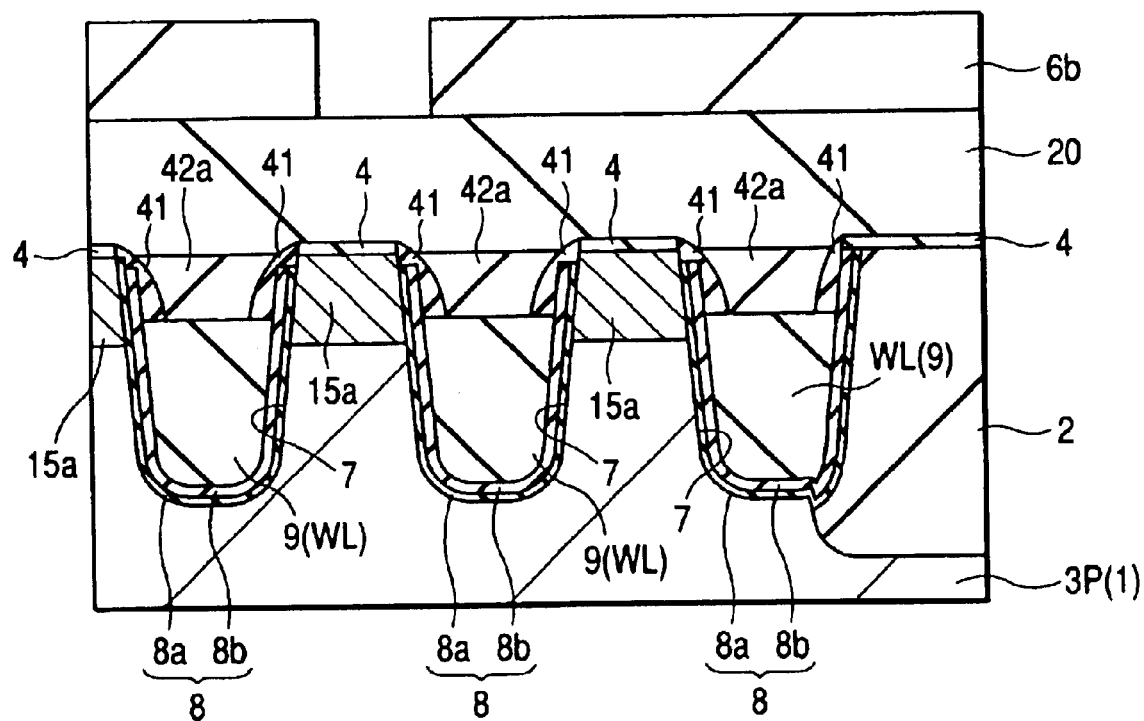
FIG. 43 is a cross-sectional view of the main part of a semiconductor integrated circuit device during processing subsequent to that of FIG. 42.
Figure 44:
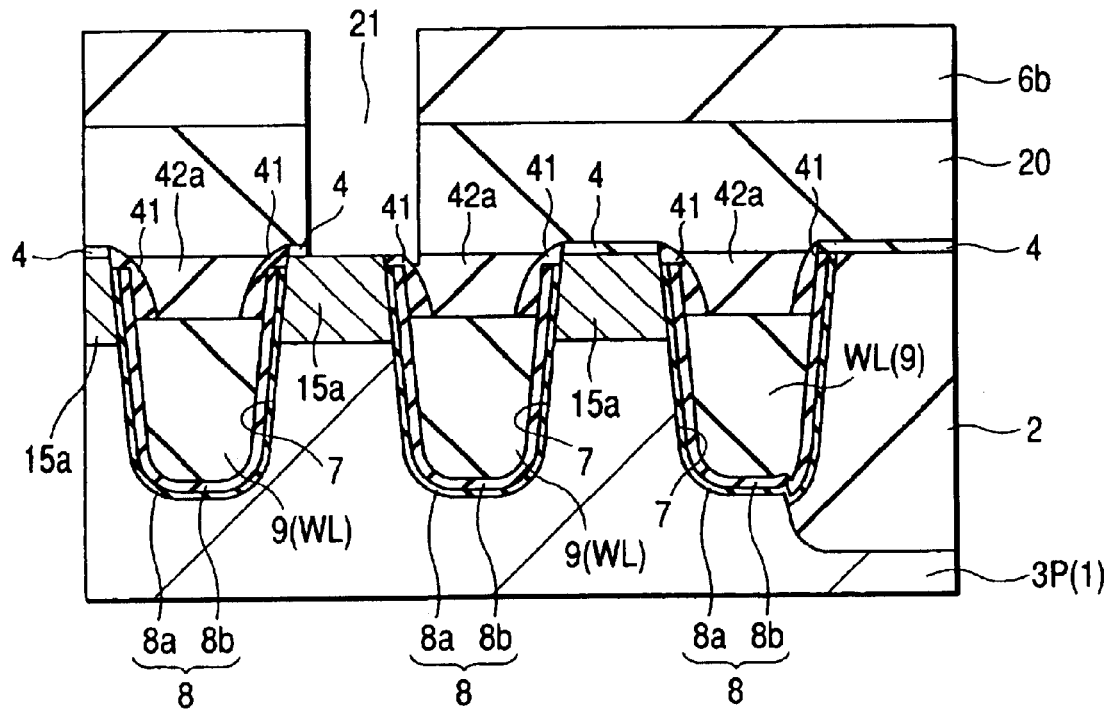
FIG. 44 is a cross-sectional view of the main part of a semiconductor integrated circuit device during processing subsequent to that of FIG. 43.

First, after undertaking the step of FIG. 39, which has been described in the above Embodiment 2, by etching back the insulating film 42, as described with reference to FIG. 40, through a dry etching method, as shown in FIG. 42, a cap insulating film 42a made of, for example, silicon nitride, is formed on the gate electrodes 9 in the upper parts within the trenches 7. When the etching amount of the insulating film 42 at this time is, for example, approximately 90 nm, a cap insulating film 42a of, for example, the thickness of approximately 50 nm, is filled in within the trenches Then, as shown in FIG. 43, after forming an insulating film 20 made of silicon oxide of, for example, the thickness of approximately 100 nm, on the semiconductor substrate 1 through a CVD method, or the like, contact holes 21 for bit lines are created in the insulating film 20, as shown in FIG. 44, by using the resist film 6b as an etching mask.

At this time, in the present Embodiment 3, the etching is carried out under the condition that the etching rate for silicon nitride is faster than that for silicon oxide. In the present Embodiment 3, since the cap insulating film 42a is made of silicon nitride, the contact holes 21 can be prevented from reaching the gate electrodes 9 because of the slow etching rate of the cap insulating film 42a even in the case where over-etching takes place at the time of formation of the contact holes 21. That is to say, the contact holes 21 can be formed in a self-aligned manner with respect to the gate electrodes 9. In addition, in the same way as in the above described Embodiment 2, even in the case where the parts of the isolation parts 2 are exposed from the contact holes 21, they are not shaved off to a great extent through etching.

Figure 45:
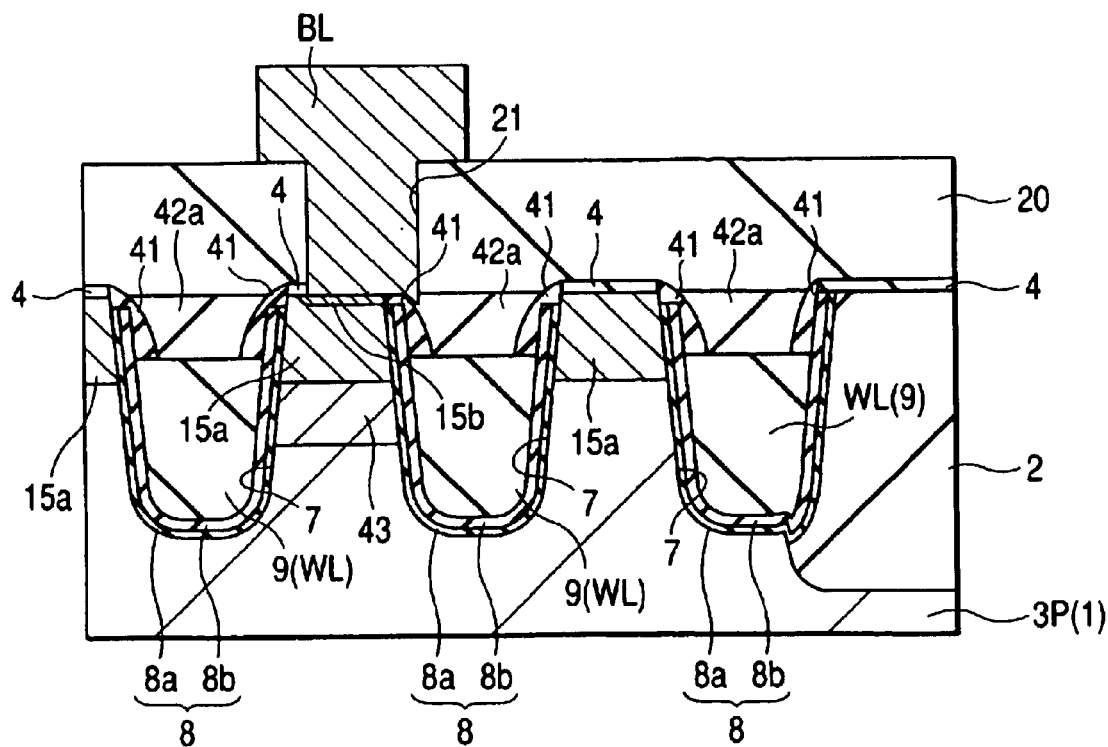
FIG. 45 is a cross-sectional view of the main part of a semiconductor integrated circuit device during processing subsequent to that of FIG. 44.

In addition, here, in the case where the threshold voltage of the MIS.FETQs for memory cell selection is low at the time of completion, impurities (for example, boron) for adjusting this threshold voltage may be implanted in the amount of approximately $1\times10^{12}/cm^2$ to $1\times10^{13}/cm^2$ at, for example, the energy level of approximately 20 keV to 50 keV, through the contact holes 21. Thereby, as shown in FIG. 45, p-type semiconductor regions 43 are formed below the low concentration regions 15a to which bit lines are connected. After that, for example, phosphorous is ion implanted through the contact holes 21 so as to form high concentration regions 15b.

Figure 46:
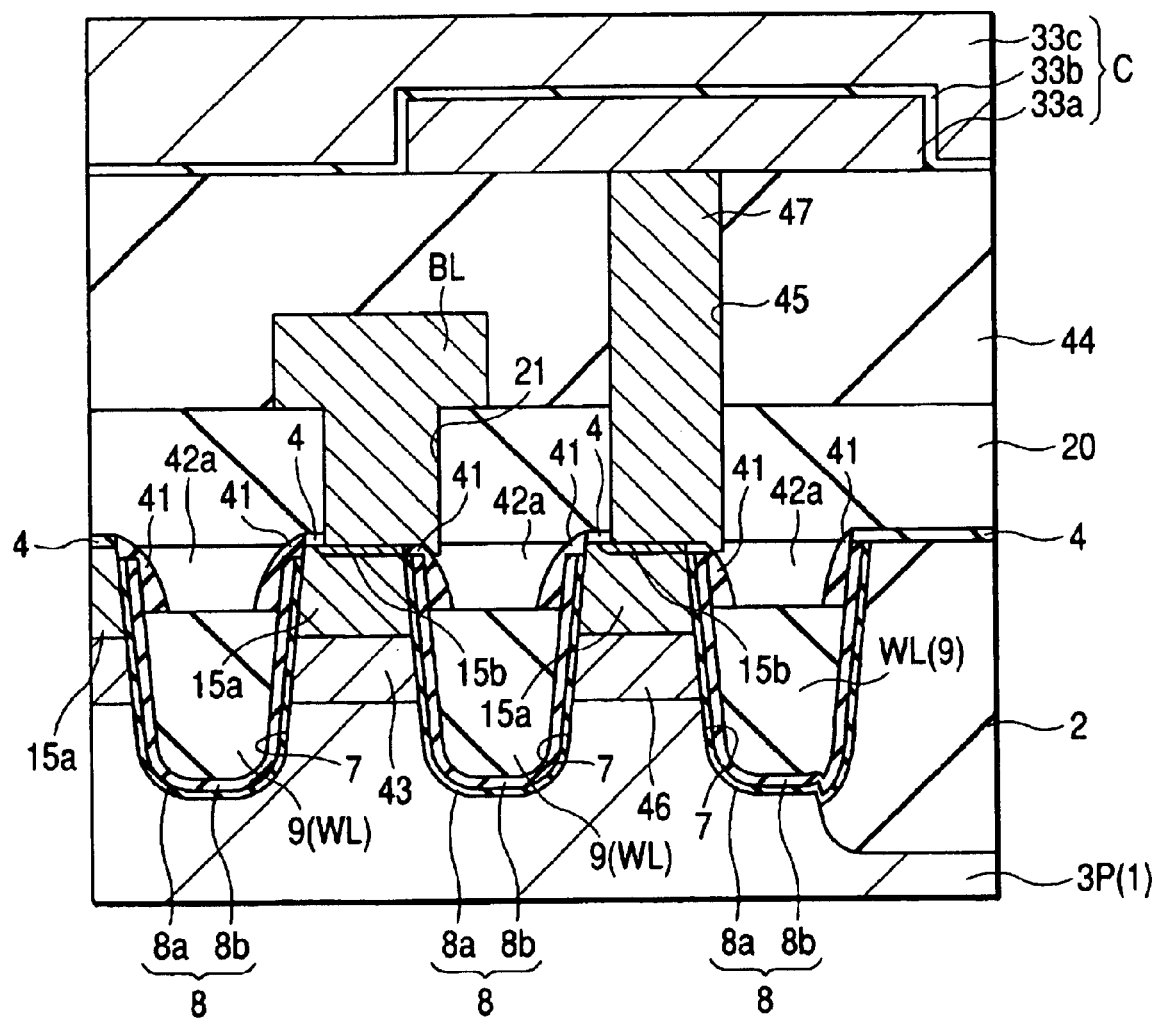
FIG. 46 is a cross-sectional view of the main part of a semiconductor integrated circuit device during processing subsequent to that of FIG. 45.

Next, as shown in FIG. 46, after depositing an insulating film 44 made of silicon oxide of, for example, the thickness of approximately 300 nm on the semiconductor substrate 1, contact holes 45 for capacitors are created in the insulating films 44 and 20. At this time, also, in the present Embodiment 3, by carrying out the etching under the condition where the etching rate for silicon nitride is faster than that for silicon oxide, the contact holes 45 can be prevented from reaching the gate electrodes 9 because of the slow etching rate of the cap insulating film 42a even in the case where over-etching takes place at the time of the formation of the contact holes 45. That is to say, the contact holes 45 can be formed in a self-aligned manner with respect to the gate electrodes 9. In addition, in the same way as in the above-described Embodiment 2, even in the case where parts of the isolation parts 2 are exposed from the contact holes 45, they are not shaved off to a great extent through etching.

In addition, here, for example, phosphorous is ion implanted in the amount of approximately $1\times10^{13}/cm^2$ to $3\times10^{13}/cm^2$ at the energy level of approximately 20 keV to 50 keV through the contact holes 45, and, thereby, n-type semiconductor regions 46, in which the impurity concentration is lower than the low concentration regions 15a, are formed. These n-type semiconductor regions 46 have the function of relaxing the junction electric field intensity in the semiconductor regions for the sources and drains of the MIS.FETs for memory cell selection of the above-described buried gate structure.

Figure 47:
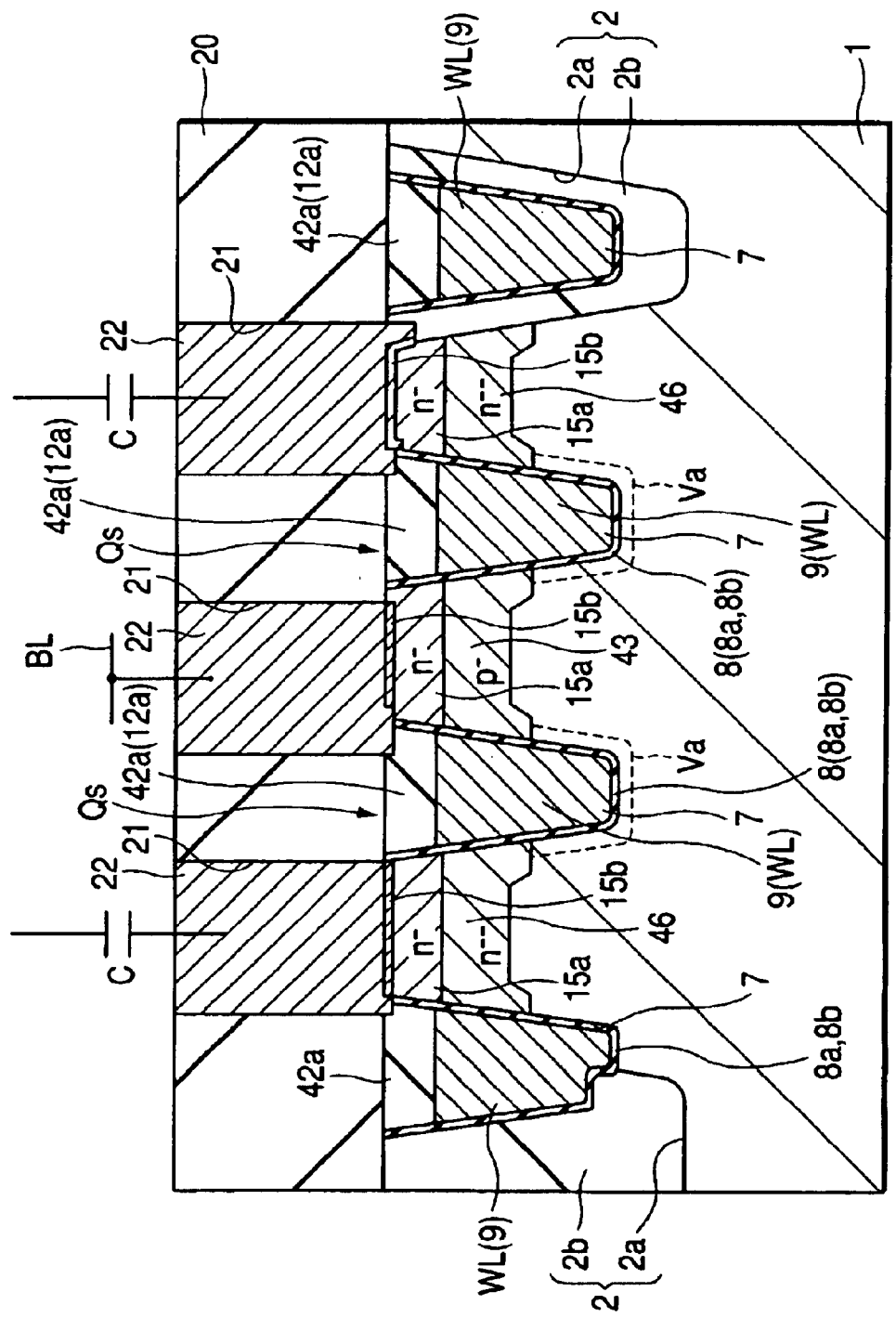
FIG. 47 is a cross-sectional view of the main part of a semiconductor integrated circuit device during processing according to another embodiment of the present invention.

Then, after forming plugs 47 within the contact holes 45 in the same way as the above-described plugs 22 by defusing the impurities of plugs 47 into the semiconductor substrate 1, high concentration regions 15b are formed in the upper parts (upper parts of the low concentration regions 15a) in the semiconductor substrate 1. After that, the lower electrodes 33a of the capacitor elements for information storage are formed; and, then, a capacitor insulating film 33b is formed so as to cover the surface thereof, and, in addition, the upper electrodes 33c are formed. Here also, in the present Embodiment 3, in the same way as in the above-described Embodiment 1, as shown in FIG. 47, the contact holes 21 for bit lines and the contact holes 21 for capacitor elements may be created at the same time so that the high concentration regions 15b are formed through the impurity diffusion from the plugs 22 filled in inside the contact holes. Here, the symbol Va represents the regions to which the impurities for adjusting the threshold voltage of the MIS-.FETQs for memory cell selection are introduced.

In the present Embodiment 3, it becomes possible to gain the following effects in addition to the effects gained in the above-described Embodiments 1 and 2.

(1) It becomes possible to lower the junction electric field intensity of the sources and drains by additionally forming the semiconductor regions 46 of low impurity concentration beneath the low concentration regions 15a for the sources and drains to which capacitor elements C for information storage are electrically connected. Thereby, it becomes possible to lower the leakage current.

(2) It becomes possible to compensate for the reduction of the threshold voltage, due to the decrease in the concentration of boron which has been implanted into the channels, by ion implantation of boron only into the low concentration regions 15a for the sources and drains to which bit lines BL are connected.

(3) By forming the cap insulating film 42a of a silicon nitride film, by forming the insulating films 20 and A4 thereon of a silicon oxide film and by carrying out the etching under the condition where the etching rate for silicon nitride is faster than that for silicon oxide at the time of formation of the contact holes 21 and 45, it becomes possible to prevent the contact holes 21 and 45 from reaching the gate electrodes 9 because of the slow etching rate of the cap insulating film 42a even in the case where over-etching takes place at the time of the formation of the contact holes 21 and 45.

(4) The contact holes 21 and 45 can be formed in a self-aligned manner with respect to the gate electrodes 9 due to the above described item (3). Accordingly, it becomes possible to attempt an increase of the element integration.

(5) By forming the cap insulating film 42a on the buribd gate electrodes 9 of a silicon nitride film so as to be used as an etching stopper at the time of formation of the contact holes 21 and 45, it becomes possible to reduce the over-etching amount of the insulating film (including the cap insulating film 42a, the gate insulating films 8a and 8b) which covers the side wall parts of the sources and drains at the time of opening of the contact holes 21 and 45.

(6) It becomes possible to prevent the distance between the plugs 47 and the edge parts of the gate electrodes 9 from becoming small because of the above described item (5).

(7) It becomes possible to avoid the problems caused by the small distance between the high concentration regions and the edge parts of the gate electrodes 9 in the case where high concentration regions are formed on the source and drain regions which are exposed at the bottom of the contact holes after the contact hole formation step (including ion injection in addition to the solid phase diffusion from the polysilicon plugs) because of the above described item (5).

(Embodiment 4)

The present Embodiment 4 relates to a case where the MIS.FETs which form the peripheral circuit of the DRM are made to have a buried gate electrode structure.

Figure 48:
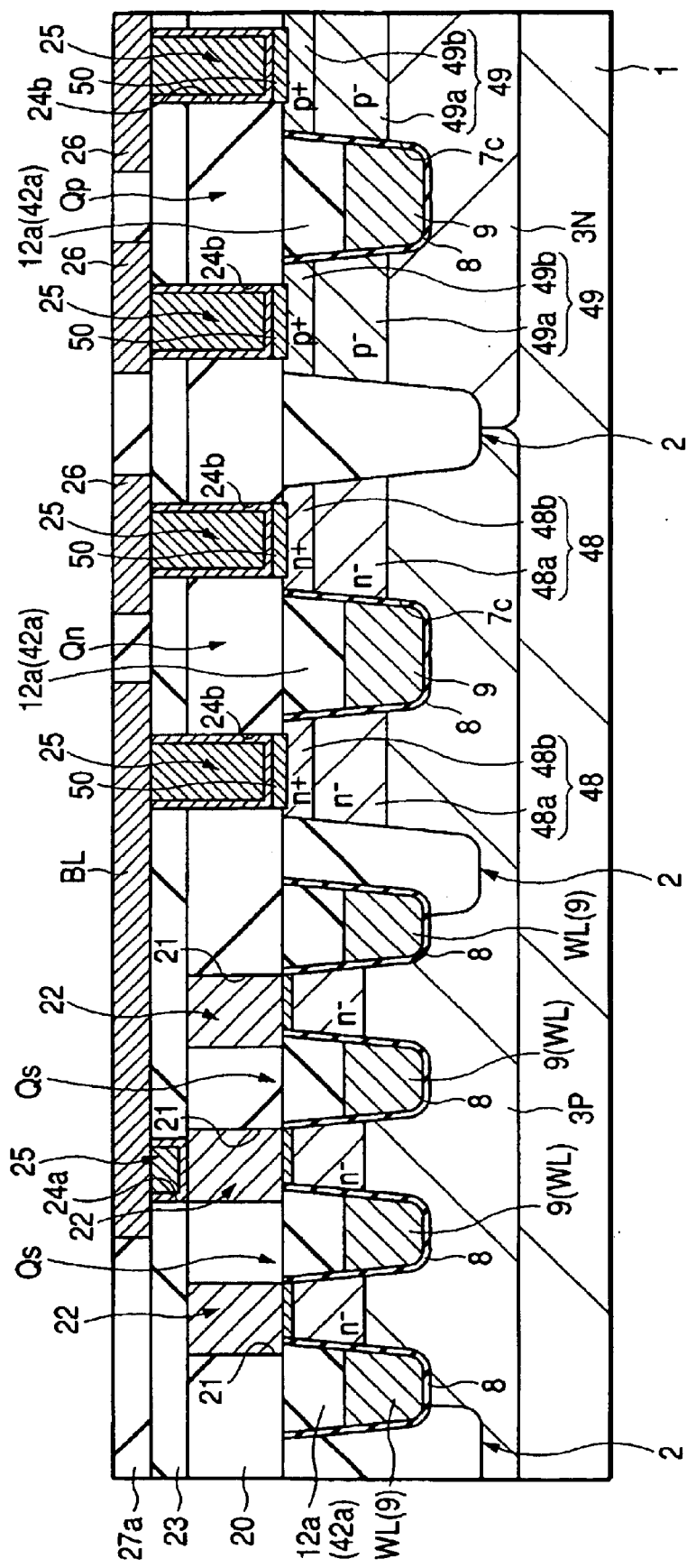
FIG. 48 is a cross-sectional view of the main part of a semiconductor integrated circuit device during processing according to still another embodiment of the present invention.

FIG. 48 shows a cross section of the main parts of the memory cell region and the peripheral circuit region of the DRAM. The structure of the MIS.FETQs for memory cell selection in the memory cell region is the same as in the above-described Embodiments 1 to 3, so that a respect of the description thereof will be omitted.

The nMISQn and pMISQp which form the peripheral circuit have gate electrodes 9 of a buried type, a gate insulating film 8 and semiconductor regions 48 and 49 for the sources and drains. The gate electrodes 9 of the nMISQn and pMISQp are buried in the trench 7c (the third trench for forming wires) which are formed in the semiconductor substrate 1 via the gate insulating film 8. Though the depth of the trench 7c is approximately the same as that of the trenches 7a and 7b, the plane dimensions of the trench 7c is larger than the plane dimensions of the trenches 7a and 7b of the memory cell region. In the present Embodiment 4, the materials or the formation steps, for example, of the gate electrodes 9 of the nMISQn and pMISQp are the same as those of the gate electrodes 9 in the memory cell region, and, thereby, the number of steps can be reduced. The gate width and the gate length of the nMISQn and the pMISQp are larger than the gate width and the gate length of the MIS.FETQs for memory cell selection. This is because, in some cases, the peripheral circuit requires other element characteristics (for example, higher driving performance) than in the memory cell region. Here, the gate electrodes 9 of the nMISQn and pMISQp may be formed of a material other than that of the gate electrodes 9 of the MIS.FETs for memory cell selection or, may be formed in another step. It becomes possible to gain the necessary characteristics for the MIS.FETs for the memory cells and for the peripheral circuit, respectively, by making up the gate electrodes 9 of the nMISQn and pMISQp of a material other than that of the gate electrodes 9 of the MIS.FETQs for memory cell selection. Here, in the case that the gate electrode formation step is the same as in the formation of the memory cells and the formation of the peripheral circuit, the buried depth (depth of the top surface from the semiconductor substrate surface) of the gate electrodes 9 of the nMISQn and pMISQp is the same as that for the gate electrodes 9 of the MIS.FETQs for memory cell selection. Accordingly, the thickness of the cap insulating film 12a (42a) above the gate electrodes 9 is approximately the same as that in the memory cell region.

The gate insulating film 8 of the nMISQn and pMISQp is formed of the same material and in the same steps as the gate insulating films 8a and 8b of the MIS.FETQs for memory cell selection. Accordingly, the gate insulating film 8 of the nMISQn and pMISQp becomes a laminated layer formed of a thermal oxide film and a CVD oxide film. Here, the gate insulating film 8 of the nMISQn and pMISQp may be formed of a material other than the gate insulating films 8a and 8b and may be formed in steps other than those of the gate insulating films 8a and 8b of the MIS.FETQs for memory cell selection. In this case, it becomes possible to gain the necessary characteristics for the MIS.FETs for the peripheral circuit by selecting the desired thickness or the dielectric constant, or the like, of the gate insulating film 8 of the MIS.FETs for the peripheral circuit.

The semiconductor regions 48 and 49 for the sources and drains of the nMISQn and pMISQp are formed, for example, in the steps other than those for the semiconductor regions (low concentration regions 15a and high concentration regions 15b) for the sources and drains of the MIS.FETQs for memory cell selection in the memory cell region. The semiconductor regions 48 for the sources and drains of the nMISQn have low concentration regions 48a and high concentration regions 48b. In addition, the semiconductor regions 49 for the sources and drains of the pMISQp have low concentration regions 49a and high concentration regions 49b. The low concentration regions 48a and the high concentration regions 48b both have, for example, phosphorous introduced therein so as to be set to be n-type and the high concentration regions 48b have therein a comparatively higher impurity concentration than the low concentration regions 48a. Those low concentration regions 48a, high concentration regions 48b or low concentration regions 49a and high concentration regions 49b can be formed using the same mask. For example, in the case of the nMISQn, after the formation of the gate electrodes 9 of the memory cells and in the peripheral circuit region, a mask which has aperture parts in the nMISQn region and covers the pMISQp and the MIS.FETQs for memory cell selection is formed so as to carry out an introduction of impurities through aperture parts of the above mask for forming low concentration regions 48a and high concentration regions 48b in the semiconductor regions 48 for the sources and drains of the nMISQn. At this time, the introduction of the impurities to the low concentration regions 48a is set to be carried out by a larger electric field intensity and a lower amount of implanted impurities than the introduction of the impurities into the high concentration regions 48b, and, thereby, the low concentration regions 48a and the high concentration regions 48b can be implanted in different manners so that the desired impurity concentration distributions can be obtained. In addition, in the case of pMISQp, in the same way, the low concentration regions 49a and the high concentration regions 49b can be formed through different implantations by controlling the electric field intensity and by controlling the amount of the impurity implantation using the same mask.

In the present Embodiment 4, the low concentration regions 48a and 49a, respectively, are formed so as to be distributed in deeper positions than the low concentration regions 15a of the MIS.FETQs for memory cell selection, while the high concentration regions 48b and 49b are formed so as to be distributed in deeper positions than the high concentration regions 15b of the MIS.FETQs for memory cell selection. Thereby, it becomes possible to increase the driving performance of the nMISQn and pMISQp which form the peripheral circuit. Here, the borders between the low concentration regions 48a and the high concentration regions 48b, as well as the borders between the low concentration regions 49a and the high concentration regions 49b are positioned so as to be shallower than the upper surface of the gate electrodes 9. In addition, the borders between the low concentration regions 48a and the p well 3P, as well as the borders between the low concentration regions 49a and the n well 3N, are positioned at a depth between the top and bottom of the gate electrodes 9. Here, a conductive film 50 made of, for example, titanium silicide is formed on the contact interface between the high concentration regions 48b and 49b and the plugs 25 so that it becomes possible to reduce the contact resistance between the plugs 25 and the high concentration regions 48b and 49b.

According to the present Embodiment 4, as described above, it becomes possible to gain the following effects, in addition to the effects gained from the above described Embodiments 1 to 3.

(1). By making the gate electrodes 9 of the MIS.FETQs for memory cell selection and the gate electrodes 9 of the nMISQn and pMISQp in the peripheral circuit be of a buried type, it becomes possible to make the level of those elements (level of the gate electrodes 9) be equal, and, thereby, it becomes possible to increase the facility of the wiring connection with respect to the nMISQn and pMISQp in the MIS.FETQs for memory cell selection and in the peripheral circuit (especially a direct part of the peripheral circuit, for example, a sense amplification circuit).

(2) Since the uniformity of the main surface of the semiconductor substrate 1 can be increased, it becomes possible to increase the reliability of the wiring formed on the semiconductor substrate 1.

(3) It becomes possible to implement a multilayered structure of the wiring layers in accordance with the above-described item (2).

(4) Because of the structure where the high concentration regions and low concentration regions for the sources and drains in the MIS.FETs of the peripheral circuit and the edge parts of the gate electrodes are arranged longitudinally along the direction of the thickness of the semiconductor substrate, it becomes possible to form the low concentration regions and the high concentration regions using the same mask by controlling the electric field intensity and the implantation amount of the impurity implantation.

Though, as described above, the invention created by the present inventors is concretely described based on the embodiments, the present invention is not limited to the above-described Embodiments 1 to 4, but, rather, it is, of course, possible to be modified in a variety of ways without deviating from the scope of the invention.

In the above-described Embodiments 1 to 4, for example, though a case is described where the high concentration regions and the low concentration regions are provided as the semiconductor regions for the sources and drains of the MIS.FETs for memory cell selection, the present invention is not limited to this, but, rather, may have a structure where, for example, only low concentration regions are provided.

In addition, in the above-described Embodiments 1 to 4, though the case is described where the gate insulating film of the MIS.FETs for memory cell selection and the MIS.FETs in the peripheral circuit is a laminated film of a thermal oxide film and a CVD film, the invention is not limited to this, but, rather, the gate insulating film may be formed of a single layer formed of an insulating film made of silicon nitride, or the like, formed through, for example, a CVD method.

Though, in the above description, the case where the invention is applied mainly to a DRAM as a field of application, which is part of the background technology of the invention, the invention is not limited to this, but, rather, can, for example, be applied in a semiconductor integrated circuit device which has a DRAM and a logic circuit on the same semiconductor substrate.

The effects gained by a representative aspect of the invention which is disclosed in the present application may be briefly described as follows:

(1) Since the effective channel length can be made longer because of the buried structure of the gate electrodes in the semiconductor substrate according to the present invention, the impurity concentration of the semiconductor substrate can be reduced. Thereby, it becomes possible to reduce the junction electric field intensity in the sources and Al drains.

(2) Since the capacity between the plugs to which the bit lines and the lower electrodes are connected and the word lines (gate electrodes) can be reduced because of the buried structure of the gate electrodes in the semiconductor substrate according to the present invention, it becomes possible to increase the transmission speed of signals.

(3) According to the present invention, it becomes possible to reduce the junction electric field intensity in the source and drain regions of the transistors for memory cell selection at the time of being turned off.

(4) According to the present invention the electric field due to the potential gap can be reduced by lowering the upper surface of the gate electrodes from the substrate surface to degree (for example, 40 nm or more) which makes it possible to ignore the effects of the band gap distortion, so that it becomes possible to totally eliminate the junction electric field intensity in the source and drain regions of the transistors for memory cell selection.

(5) According to the present invention, the junction electric field intensity in the source and drain regions of the transistors for memory cell selection can be eliminated, and, accordingly, the refreshing time can be made long. Therefore, the charging and discharging cycle at the time of refreshing operation can be made long, and, accordingly, it becomes possible to reduce the power consumption of the semiconductor integrated circuit device which has a DRAM.

(6) According to the present invention, the sub-threshold coefficient can be made small by rounding (for example, the radius of curvature is 10 nm or more) the bottom corner parts of the trenches for forming wires, and, therefore, it becomes possible to make the ON/OFF current ratio large.

(7) It becomes possible to increase the driving performance of the transistors for memory cell selection in accordance with the above (6).

(8) It becomes possible to increase the operational speed of the transistors for memory cell selection in accordance with the above (6).

(9) Since the sub-threshold coefficient can be made small in accordance with the above (6), it becomes possible to prevent the increase of the power consumption without increasing the leakage current at the time of being turned off.

(10) Since the coverage of the gate insulating film within the trenches for forming wires can be increased by forming, at least, part of the gate insulating film in the field effect transistors of a buried gate electrode structure through a deposition method according to the present invention, it becomes possible to increase the withstanding voltage of the gate insulating film.

(11) It becomes possible to increase the performance of the field effect transistors for memory cell selection in accordance with the above item (10).

(12) It becomes possible to increase the yield and the reliability of the field transistors for memory cell selection in accordance with the above item (10).

What is claimed is:

1. A process for a semiconductor integrated circuit device where a plurality of memory cells which have field effect transistors formed in a semiconductor substrate and capacitor elements connected to the source and drain regions of said field effect transistors are provided, comprising the steps of:
   (a) forming trenches of which the radius of curvature of the bottom corners is larger than 10 nm in a first semiconductor region of said semiconductor substrate;
   (b) forming a first gate insulating film through a deposition method inside of said trenches;
   (c) forming gate electrodes within said trenches and placing said gate electrodes on said first gate insulating film; and
   (d) forming a second semiconductor region and a third semiconductor region in said first semiconductor region such that said second and said third semiconductor regions have a depth shallower than that of said first semiconductor region and that of said trenches,
   wherein said second and said third semiconductor regions serve as source and drain regions of said field effect transistor such that a channel forming region thereof is effected at the bottom surface of said trench and two side surfaces of said trench between said second semiconductor region and said third semiconductor region.

2. A process for a semiconductor integrated circuit device according to claim 1 characterized by having the step of forming a second gate insulating film by oxidizing the inner walls of said trenches.

3. A process for a semiconductor integrated circuit device according to claim 1, wherein the step of forming said trenches contains the step of carrying out an etching process by switching to etching conditions of rounding the corner parts within the trenches during the etching process proceeding in the direction of the trench depth after carrying out an etching process under etching conditions of relatively strong anisotropy.

4. A process for a semiconductor integrated circuit device, including field effect transistors, comprising the steps of:
   (a) forming trenches in a first semiconductor region of a semiconductor substrate;
   (b) forming a gate insulating film inside of said trenches;
   (c) forming gate electrodes which are completely, or partially, buried within said trenches under the condition where said gate insulating film is interposed between said gate electrodes and said semiconductor substrate within said trenches;
   (d) forming semiconductor regions for the sources and drains in said semiconductor substrate; and
   (e) forming a second semiconductor region and a third semiconductor region in said first semiconductor region such that said second and said third semiconductor regions have a depth shallower than that of said first semiconductor region and that of said trenches,
   wherein said second and said third semiconductor regions serve as said source and said drain regions of a field effect transistor such that a channel forming region thereof is effected at the bottom surface of said trench and two side surfaces of said trench between said second semiconductor region and said third semiconductor region, and
   wherein said Step (a) contains the step of rounding the bottom corners within said trenches so that the sub-threshold coefficient of said field effect transistors does not exceed a predetermined value, and said Step (b) contains the step of forming said gate insulating film through a deposition method.

5. A process for a semiconductor integrated circuit device according to claim 4, wherein said Step (a) contains the step of carrying out an etching process by switching to etching conditions of rounding the corner parts within the trenches during the etching process proceeding in the direction of the trench depth after carrying out an etching process under etching conditions of relatively strong anisotropy.

6. A process for a semiconductor integrated circuit device according to claim 4, wherein said Step (b) contains the step of forming part of said gate insulating film by oxidizing the inner walls of said trenches.

7. A process for a semiconductor integrated circuit device according to claim 4, wherein the radius of curvature of the bottom corners within said trenches is 10 nm or more.

8. A process for a semiconductor integrated circuit device which has element isolation parts and wires formed so as to cross over said element isolation parts within a semiconductor substrate are provided, comprising the steps of:
   (a) forming a first trench in said semiconductor substrate;
   (b) forming element isolation parts by forming an insulating film in said first trench;
   (c) forming a mask which has apertures crossing over said element isolation parts;
   (d) forming a second trench in the element isolation parts which have been exposed through said apertures;
   (e) forming a third trench in the semiconductor substrate which has been exposed through said apertures and the second trench; and
   (f) forming said wires in said second and third trenches.

9. A process for a semiconductor integrated circuit device according to claim 8, wherein the inclination angle of the side walls of said first and third trenches, with respect to the main surface of said semiconductor substrate, is smaller than 90 degrees.

10. A process for a semiconductor integrated circuit device which has element isolation parts formed within a semiconductor substrate, a first wire formed so as to cross over said element isolation parts and field effect transistors having part of said first wire as gate electrodes and having source and drain regions on both sides of said gate electrodes are provided, comprising the steps of:
   (a) forming a first trench by etching said semiconductor substrate;
   (b) forming element isolation parts by forming an insulator film inside of said first trench;
   (c) forming a mask which has first apertures formed so as to cross over said element isolation parts;

(d) forming a second trench by etching the element isolation parts which have been exposed through said first apertures;

(e) forming a third trench by etching the semiconductor substrate which has been exposed through said first apertures and said second trench; and (f) forming a gate insulating film on the inside walls of said third trench and forming the first wire inside of said second and third trenches.

11. A process for a semiconductor integrated circuit device according to claim 10, wherein the inclination angle of the side walls of said first and third trenches, with respect to the main surface of said semiconductor substrate, is smaller than 90 degrees.

12. A process for a semiconductor integrated circuit device according to claim 10, wherein forward tapers are formed on the side surfaces of said first and third trenches.

13. A process for a semiconductor integrated circuit device according to claim 10, wherein said first trench is 100 nm, or more, deeper than said second trench.

14. A process for a semiconductor integrated circuit device according to claim 10, wherein said step of forming the third trench further contains the step of oxidizing the inner walls of the trench formed through etching of said semiconductor substrate and the step of removing the oxide film formed according to said oxidation.

15. A process for a semiconductor integrated circuit device according to claim 10, wherein said third trench is deeper than said second trench.

16. A process for a semiconductor integrated circuit device according to claim 10, wherein said first trench is deeper than said third trench.

17. A process for a semiconductor integrated circuit device is provided, comprising the steps of:

(a) forming a first trench in a semiconductor substrate;

(b) forming isolation parts by forming an insulating film for isolation in said first trench;

(c) forming a mask having aperture parts which expose both of said isolation parts and said semiconductor substrate on said semiconductor substrate;

(d) forming a second trench in the isolation parts which have been exposed from said aperture parts and, after that, forming a third trench in the semiconductor substrate which has been exposed from said aperture parts and said second trench;

(e) forming an insulating film on the surface of the semiconductor substrate within said second and third trenches; and (f) forming wires within said second and third trenches.

18. A process for a semiconductor integrated circuit device according to claim 17, wherein at the time of forming said second trench, at the stage after said Step (f), said insulating film for isolation remains at the bottom of said second trench so that no parasitic elements are formed below the wires formed inside of said second trench.

19. A process for a semiconductor integrated circuit device according to claim 17, wherein at the stage after said Step (f), the thickness of said insulating film for isolation which remains between the wires inside of said second trench and the semiconductor substrate is 100 nm or more.

20. A process for a semiconductor integrated circuit device according to claim 17, wherein at the time of forming said third trench, the depth of said third trench is deeper than said second trench.

21. A process for a semiconductor integrated circuit device according to claim 17, wherein the dimensions of the aperture sides of said first and third trenches are greater than the dimensions of the bottom sides.

22. A process for a semiconductor integrated circuit device according to claim 21, wherein forward tapers are formed on the side surfaces of said first and third trenches.

23. A process for a semiconductor integrated circuit device according to claim 17 characterized by having the oxidation step for oxidizing the inside of said second and third trenches after said Step (d) and before said Step (e) and the step of removing the oxide film which has been formed through said oxidation step.

24. A process for a semiconductor integrated circuit device according to claim 23, wherein said Step (e) contains the step of forming said insulating film through a deposition method.

25. A process for a semiconductor integrated circuit device according to claim 23, wherein the process for forming an insulating film in said Step (e) contains the step of forming a first gate insulating film by oxidizing the surface of said semiconductor substrate and the step of forming a second gate insulating film, through a deposition method, so as to cover the surface of said first gate insulating film.

26. A process for a semiconductor integrated circuit device according to claim 17, wherein said step of forming wires comprises the steps of:

filling in said second and third trenches with a first film for forming said wires;

removing said first film so that a part thereof remains inside of said second and third trenches; forming a second film which fills in the recesses of the surface of the first film which has remained inside of said second and third trenches; and removing said first film, after the formation of said second film, so that a part thereof remains inside of said second and third trenches.

27. A process for a semiconductor integrated circuit device according to claim 26 characterized by having the step of forming a first insulating film on the wires inside of said second and third trenches by removing the first insulating film so that a part thereof remains inside of said second and third trenches after depositing the first insulating film on said semiconductor substrate subsequent to the formation of said wires.

28. A process for a semiconductor integrated circuit device according to claim 27 characterized by having the step of depositing a second insulating film on said semiconductor substrate after forming said first insulating film inside of the second and third trenches, and forming holes which expose part of said semiconductor substrate in said second insulating film, wherein:

in said step of forming holes, said holes are formed by carrying out an etching process under conditions where the etching rate of said second insulating film is faster than that of said first insulating film.

29. A process for a semiconductor integrated circuit device according to claim 28, wherein after filling in said holes with a conductive film, semiconductor regions are formed in a semiconductor substrate through impurity diffusion into the semiconductor substrate from the conductive film.

30. A process for a semiconductor integrated circuit device according to claim 17, wherein said wires have a polycrystal silicon film, a silicide film or a metal film, or a laminated film of these.

31. A process for a semiconductor integrated circuit device according to claim 17, wherein the insulating film of said Step (e) forms a gate insulating film for field effect transistors while the wires of said Step (f) form gate electrodes for said field effect transistors.

32. A process for a semiconductor integrated circuit device according to claim 17 characterized by having the step of forming pairs of semiconductor regions for sources and drains of said field effect transistors in an active region surrounded by the isolation parts of said semiconductor substrate after said Step (f) and the step of forming capacitor elements for information storage which are connected to either one of the semiconductor regions of said pairs.

33. A process for a semiconductor integrated circuit device which has a plurality of memory cells having field effect transistors with buried gate electrodes formed in a semiconductor substrate and capacitor elements electrically connected to at least one of the source or drain regions of said field effect transistors are provided, comprising the steps of:
  (a) forming first semiconductor regions in said semiconductor substrate;
  (b) forming a first trench in said semiconductor substrate;
  (c) forming a gate insulating film, gate electrodes and a first insulating film inside said first trench;
  (d) forming a second insulating film on the semiconductor substrate and, further, over said first insulating film;
  (e) forming apertures, in said second insulating film, which overlap said first semiconductor regions in a plane manner through a method where the etching rate of said second insulating film is faster than the etching rate of the first insulating film;
  (f) forming a conductive film inside of said apertures; and
  (g) forming second semiconductor regions in said semiconductor substrate through an impurity diffusion from said conductive film such that said first and second semiconductor regions serve as said source and drain regions.

34. A process for a semiconductor integrated circuit device according to claim 33, wherein said first insulating film is formed of a silicon nitride film and said second insulating film is formed of a silicon oxide film.

35. A method of manufacturing a semiconductor integrated circuit, comprising steps of:
  (a) forming an element isolation region in a first semiconductor region of a semiconductor substrate such that said element isolation region defines a first region of said first semiconductor region so as to surround said first region;
  (b) forming a trench in said first semiconductor region and in said element isolation region such that said trench crosses said first region;
  (c) forming a gate insulating film of a field effect transistor on said first semiconductor region inside of said trench;
  (d) after said step (c), burying a gate electrode of said field effect transistor into said trench;
  (e) after said step (d), introducing an impurity in said first region in self-alignment with said element isolation region and said gate electrode so as to form a second semiconductor region and a third semiconductor region in said first semiconductor region such that said second and said third semiconductor regions have a depth shallower than that of said first semiconductor region and that of said trench,
  wherein said second and said third semiconductor regions serve as said source and said drain region of said field effect transistor such that a channel forming region thereof is to be formed at the bottom surface of said trench and two side surfaces of said such trench between said second semiconductor region and said third semiconductor region.

36. A method of manufacturing a semiconductor integrated circuit according to claim 35, wherein said step (b) includes substeps of:
  (b1) etching said element isolation region to form a first trench in said element isolation region; and
  (b2) after said substep (b1), etching said first semiconductor region to form a second trench in said first region.

37. A method of manufacturing a semiconductor integrated circuit according to claim 36, wherein a depth of said second semiconductor region is uniform within said source and drain region such that an entire circumference of the bottom of said second semiconductor region contacts the element isolation region or said trench.

38. A method of manufacturing a semiconductor integrated circuit according to claim 35, wherein a depth of said second semiconductor region is uniform within said source and drain region such that an entire circumference of the bottom of said second semiconductor region contacts the element isolation region or said trench.

39. A method of manufacturing a semiconductor integrated circuit according to claim 4, wherein a depth of said second semiconductor region is uniform within said source and drain region such that an entire circumference of the bottom of said second semiconductor region contacts the element isolation region or said trench.

40. A method of manufacturing a semiconductor integrated circuit according to claim 1, wherein a depth of said second semiconductor region is uniform within said source and drain region such that an entire circumference of the bottom of said second semiconductor region contacts the element isolation region or said trench.

* * * * *